United States Patent [19]

Hamamoto et al.

[11] Patent Number: 5,796,883
[45] Date of Patent: Aug. 18, 1998

[54] OPTICAL INTEGRATED CIRCUIT AND METHOD FOR FABRICATING THE SAME

[75] Inventors: Kiichi Hamamoto; Tatsuya Sasaki; Takeshi Takeuchi; Masako Hayashi; Keiro Komatsu; Ikuo Mito; Kenko Taguchi, all of Tokyo, Japan

[73] Assignee: NEC Corporation, Tokyo, Japan

[21] Appl. No.: 706,529

[22] Filed: Sep. 4, 1996

[30] Foreign Application Priority Data

Sep. 4, 1995 [JP] Japan .................................. 7-226127
Jan. 10, 1996 [JP] Japan .................................. 8-002339

[51] Int. Cl.$^6$ ........................................................ G02B 6/12
[52] U.S. Cl. .................................................. 385/14; 372/50
[58] Field of Search .............................. 385/12, 14, 27, 385/31, 39, 147, 8, 9; 372/41, 43, 50

[56] References Cited

U.S. PATENT DOCUMENTS

| | | | |
|---|---|---|---|
| 4,005,450 | 1/1977 | Yoshida et al. | 257/387 |
| 4,100,310 | 7/1978 | Ura et al. | 427/8 |
| 4,710,794 | 12/1987 | Koshino et al. | 257/501 |
| 4,769,612 | 9/1988 | Tamakoshi et al. | 327/554 |
| 4,981,612 | 1/1991 | Allen et al. | 252/583 |
| 5,229,321 | 7/1993 | Takami | 438/557 |
| 5,432,380 | 7/1995 | Jin et al. | 257/740 |

OTHER PUBLICATIONS

T. Sasaki et al., "Selective MOVPE Growth and Its Application to Semiconductor Photonic Integrated Circuits", pp. 1–11, Electronics & Communications in Japan, Part II, Electronics, vol. 76, No. 4, Apr. 1, 1993.

T. Sasaki et al., "Novel Structure Photonic Devices Using Selective MOVPE Growth", pp. 372–381, NEC Research and Development, vol. 33, No. 3, Jul. 1, 1992.

T.L. Koch et al., "InP-based Photonic Integrated Circuits", pp. 139–147, IEE Proceedings J. Optoelectronics, vol. 138, No. 2, Apr. 1991.

R. Matz et al., "Development of a Photonic Integrated Transceiver Chip for WDM Transmission", pp. 399–401, Integrated Photonics Research, Technical digest Series, No. 1, Jan. 1, 1994.

Williams et al., "WDM Transceiver OEICs for Local Access Networks", Electronics Letters, vol. 30, No. 18, Sep. 1994, pp. 1529–1530.

Matz et al., "Development of a Photonic Integrated Transceiver Chip for WDM Transmission", Post Deadline Paper PD1–1, Integrated Photonics Research 94, pp. PD1–1 to PD1–3.

Primary Examiner—Akm E. Ullah
Attorney, Agent, or Firm—Young & Thompson

[57] ABSTRACT

A semiconductor waveguide layer is provided in an optical semiconductor integrated circuit device comprising a passive region having at least a branch and an active region having at least a laser diode connected to the branch and at least a photo-diode connected to the branch. The active region is in contact with the passive region. The waveguide layer selectively extends over the passive region and the active region. The semiconductor waveguide layer in the active region has a wavelength composition larger than that in the passive region. The waveguide layer has a semiconductor crystal structure which is continuous not only over the active and passive regions but also at a boundary between the active and passive regions.

38 Claims, 26 Drawing Sheets

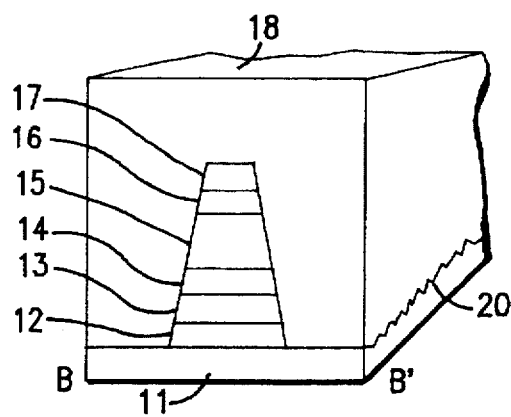
FIG. 17B
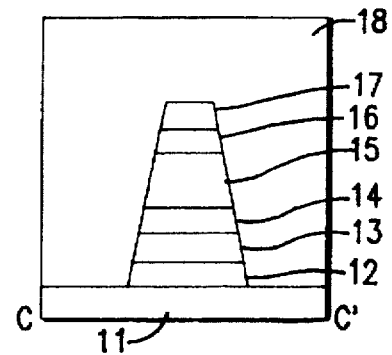
FIG. 17C
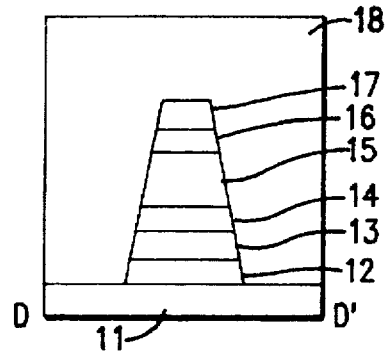
FIG. 17D
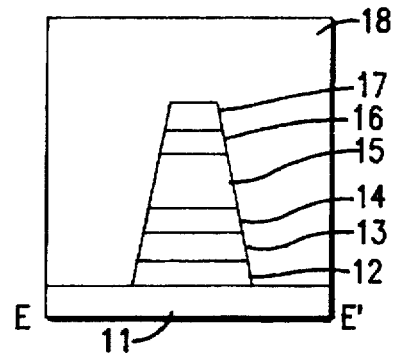
FIG. 17E
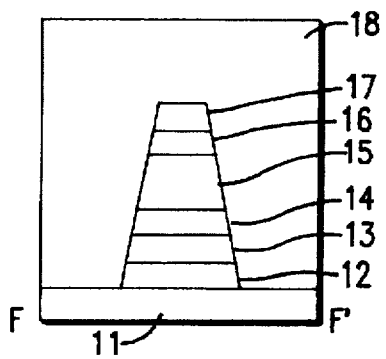
FIG. 17F
FIG. 18A
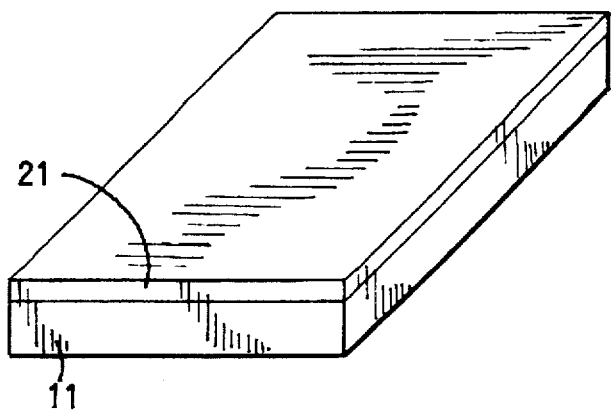

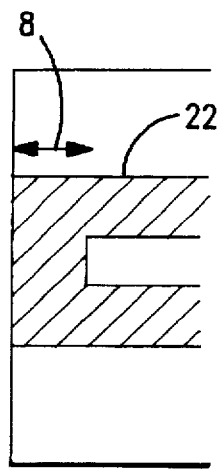
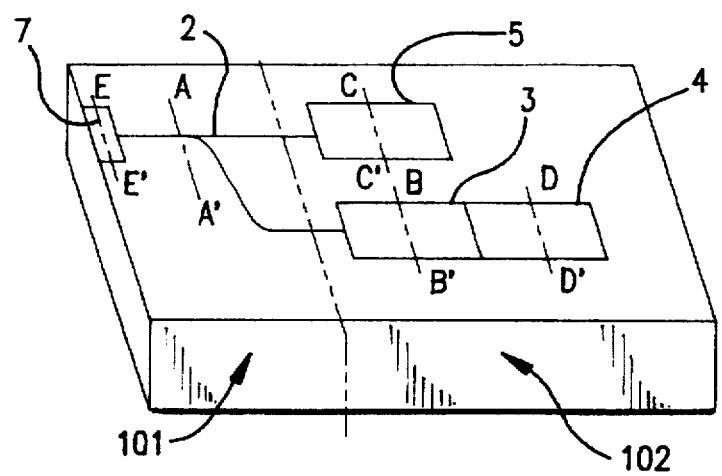
FIG. 21C  FIG. 22
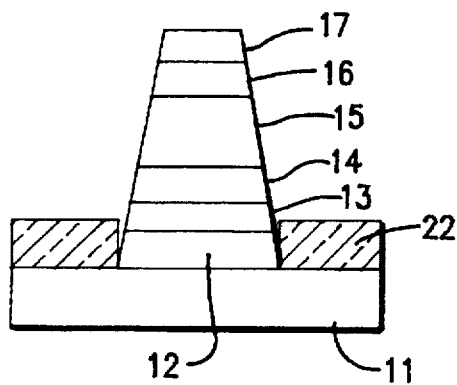
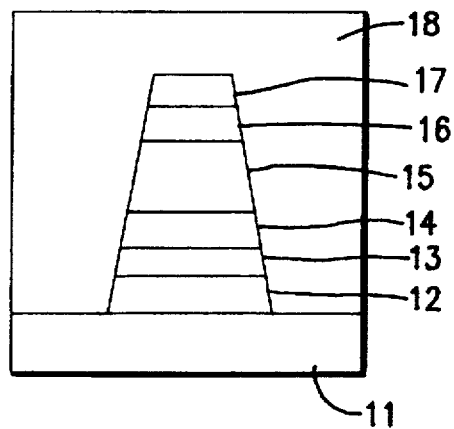
FIG. 21D  FIG. 21E
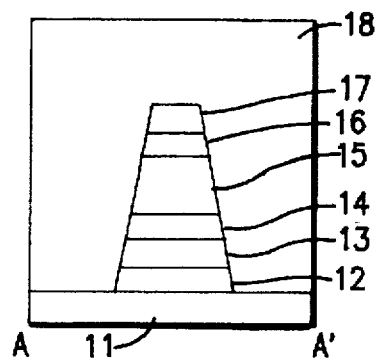
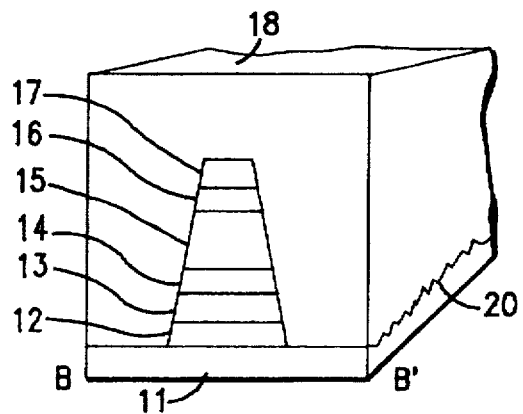
FIG. 23A  FIG. 23B

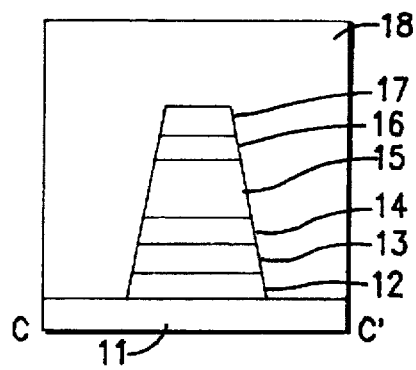
FIG. 23C
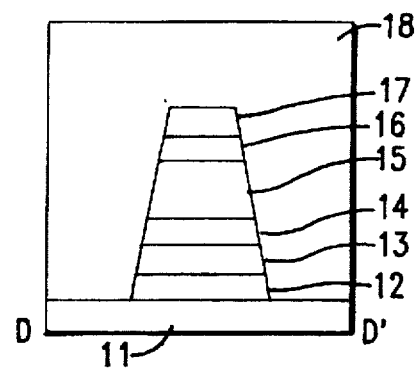
FIG. 23D
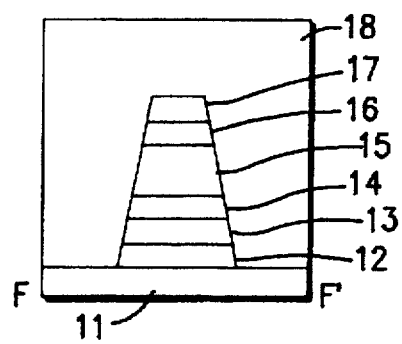
FIG. 23E
FIG. 24A
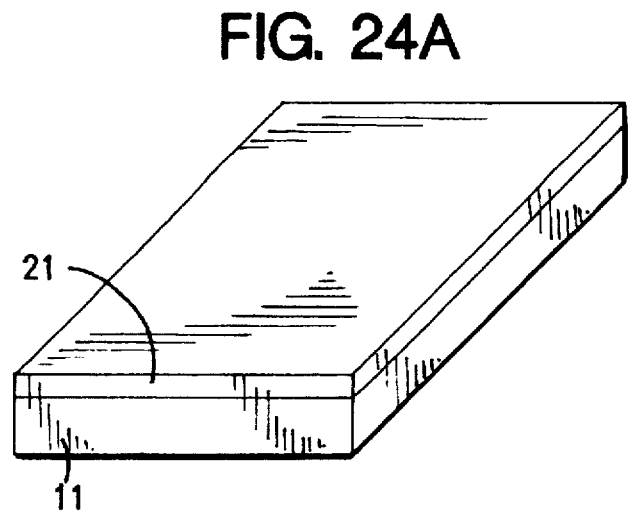
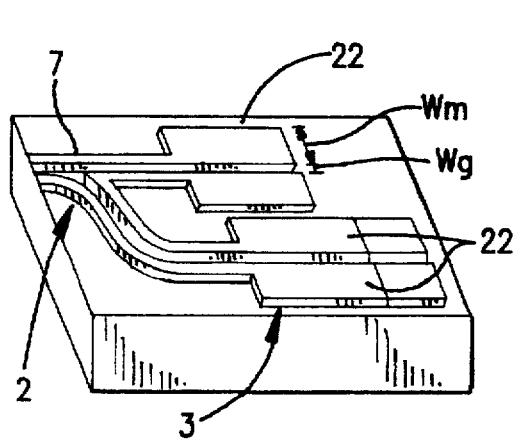
FIG. 24B
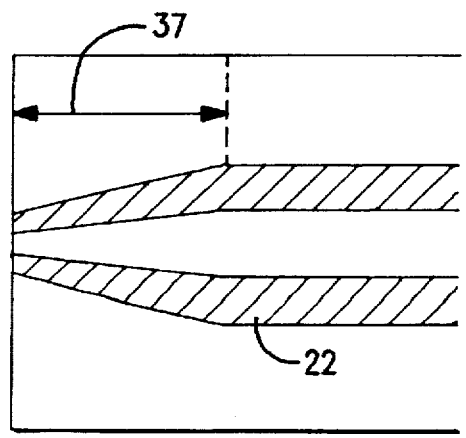
FIG. 24C 1.55 μm wavelength transmission signal
1.30 μm wavelength receiving signal

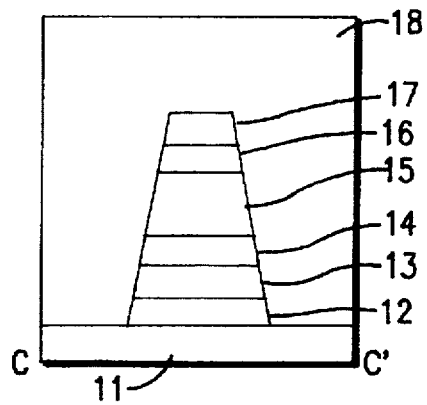
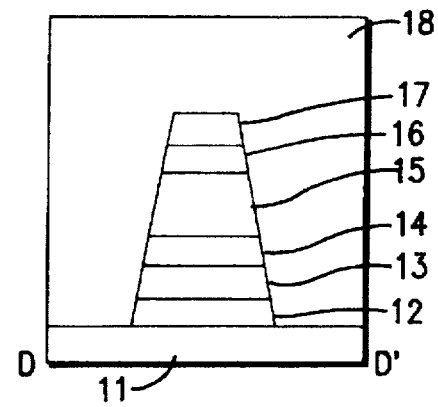
FIG. 29C    FIG. 29D
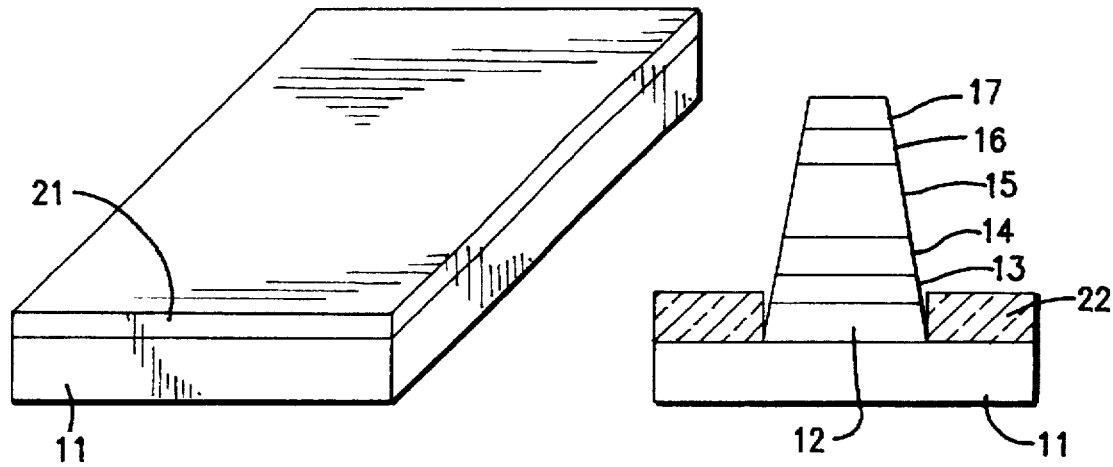
FIG. 30A    FIG. 30C
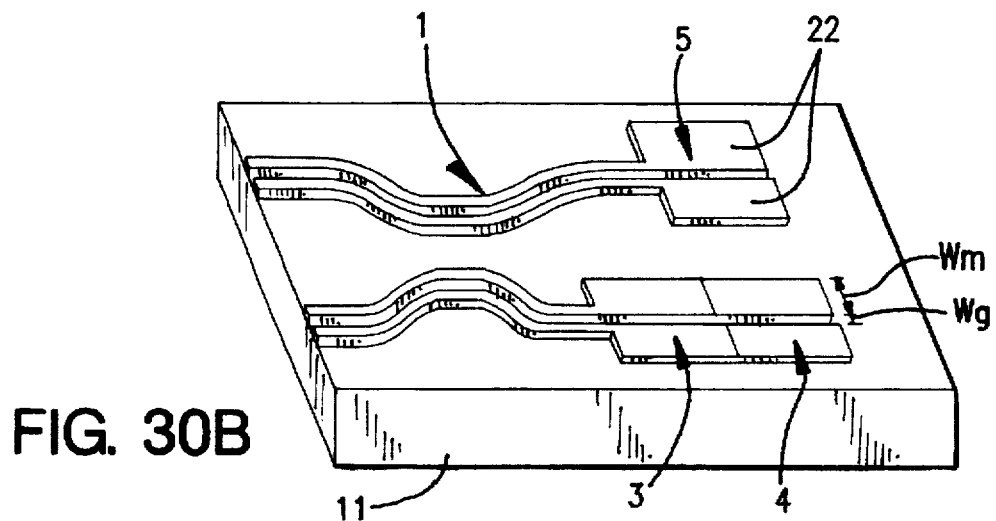
FIG. 30B 1.30 μm/1.55 μm wavelength multiplexing receiving signal
1.55 μm wavelength transmission signal

OPTICAL INTEGRATED CIRCUIT AND METHOD FOR FABRICATING THE SAME

BACKGROUND OF THE INVENTION

The present invention relative to a semiconductor optical device, and more particularly to an optical integrated circuit with an improved waveguide layer and a method for fabricating the same.

One of the conventional optical integrated circuit was reported by R. Matz et al. in Post Deadline Paper PD1-1, "Integrated Photonics Research 94". A structure of this device is illustrated in FIG. 1. This device utilizes a wavelength division multiplexing directional coupler but is not suitable for concurrent multiple media communications.

Another conventional optical integrated circuit was reported by Williams et al. in Electronics Letters vol. 30, pp. 1529 (1994). A structure of this device is illustrated in FIG. 2. This device utilizes a wavelength division multiplexing Mach-Zehnder coupler for concurrent multiple media communications but have a sufficiently large size for limiting the required scaling down of the device.

SUMMARY OF THE INVENTION

Accordingly, it is an object of the present invention to provide an improved optical integrated circuit device free from any substantive coupling loss.

It is a further object of the present invention to provide an improved optical integrated circuit device with a small size.

It is a further more object of the present invention to provide an improved optical integrated circuit device with a small size.

The above and other objects, features and advantages of the present invention will be apparent from the following descriptions.

The present invention provides a semiconductor waveguide layer provided in an optical semiconductor integrated circuit device comprising a passive region having at least a branch and an active region having at least a laser diode connected to the branch and at least a photo-diode connected to the branch. The active region is in contact with the passive region. The waveguide layer selectively extends over the passive region and the active region. The semiconductor waveguide layer in the active region has a wavelength composition larger than that in the passive region. The waveguide layer has a semiconductor crystal structure with is continuous not only over the active and passive regions but also at a boundary between the active and passive regions.

In order to obtain this continuous semiconductor crystal structure even across the boundary between the active and passive regions, the waveguide layer has been formed by a selective semiconductor crystal growth using a dielectric mask pattern being provided on the semiconductor substrate and extending over the active and passive regions. The dielectric mask pattern comprises at least a pair of stripe like dielectric films having a gap between them. Each of the stripe like dielectric films has a larger width in the active region than that in the passive region.

The present invention provides an optical semiconductor integrated circuit device comprising a semiconductor substrate having a passive region and an active region, and a ridged structure constituting at least a branch selectively extending over the passive region, at least a laser diode selectively extending over the active region and at least a photo diode selectively extending over the active region. The ridged structure includes a semiconductor waveguide layer sandwiched between optical confinement layers. The semiconductor waveguide layer in the active region has a wavelength composition larger than that in the passive region. The waveguide layer has a semiconductor crystal structure which is continuous not only over the active and passive regions but also at a boundary between the active and passive regions.

In order to obtain this continuous semiconductor crystal structure even across the boundary between the active and passive regions, the ridged structure has been formed by a selective semiconductor crystal growth using a dielectric mask pattern is provided on the semiconductor substrate and extends over the active and passive regions. The dielectric mask pattern comprises at least a pair of stripe like dielectric films having a gap between them. Each of the stripe like dielectric films has a larger width in the active region than that in the passive region.

The present invention provides a method of crystal growth for a semiconductor waveguide layer provided over a semiconductor substrate for an optical semiconductor integrated circuit device comprising a passive region having at least a branch and an active region having at least a laser diode connected to the branch and at least a photo-diode connected to the branch, and the active region being in contact with the passive region. The waveguide layer selectively extends over the passive region and the active region, and the semiconductor waveguide layer in the active region having a wavelength composition larger than that in the passive region. The method comprises the following steps. A dielectric mask pattern is provided on the semiconductor substrate. The dielectric mask pattern extends over the active and passive regions. The dielectric mask pattern comprises at least a pair of stripe like dielectric films having a gap between them. Each of the stripe like dielectric films have a larger width in the active region than that in the passive region. Thereafter, a selective semiconductor crystal growth is carried out by use of the dielectric mask pattern to grow the waveguide layer having a semiconductor crystal structure which is continuous not only over the active and passive regions but also at a boundary between the active and passive regions.

BRIEF DESCRIPTIONS OF THE DRAWINGS

Preferred embodiments of the present invention will be described in detail with reference to the accompanying drawings.

FIG. 17B is a fragmentary cross sectional elevation view illustrative of an internal layered structure of the 1.30 µm transmitter laser diode 3 in the optical integrated circuit device with an improved waveguide layer, along an B—B' line in FIG. 16 in the fourth embodiment according to the present invention.

FIG. 17C is a fragmentary cross sectional elevation view illustrative of an internal layered structure of the 1.30 µm receiver photo-diode 5 in the optical integrated circuit device with an improved waveguide layer, along an C—C' line in FIG. 16 in the fourth embodiment according to the present invention.

FIG. 17D is a fragmentary cross sectional elevation view illustrative of an internal layered structure of the 1.30 µm monitor photo-diode 4 in the optical integrated circuit device with an improved waveguide layer, along an D—D' line in FIG. 16 in the fourth embodiment according to the present invention.

Figure 16:
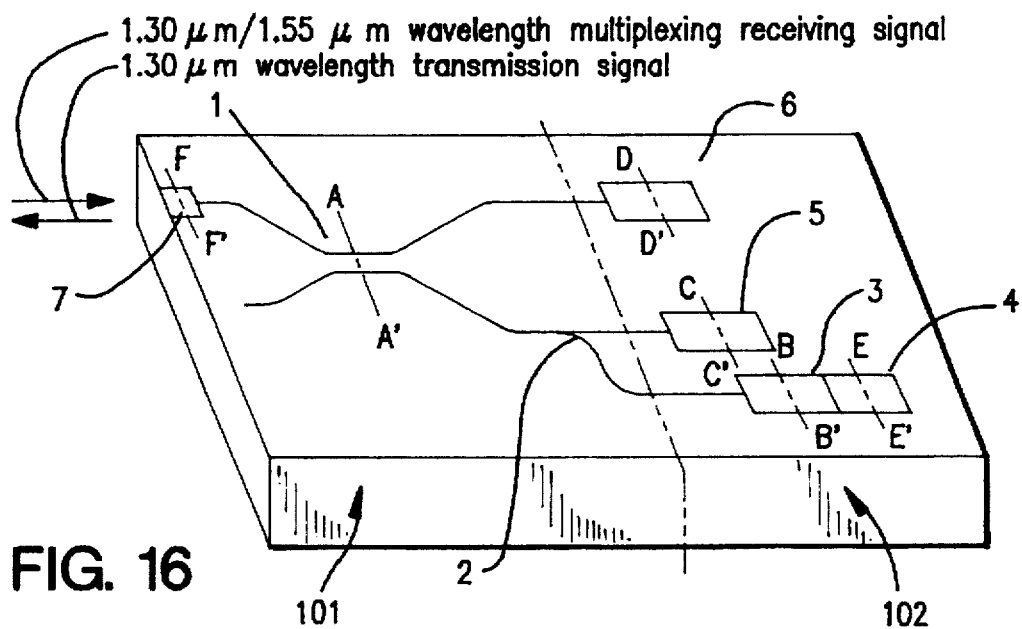
FIG. 16 is a perspective view illustrative of an optical integrated circuit device with an improved waveguide layer in the fourth embodiment according to the present invention.

FIG. 17E is a fragmentary cross sectional elevation view illustrative of an internal layered structure of the 1.55 µm receiver photo-diode 6 in the optical integrated circuit device with an improved waveguide layer, along an E—E' line in FIG. 16 in the fourth embodiment according to the present invention.

FIG. 17F is a fragmentary cross sectional elevation view illustrative of an internal layered structure of the spot size converter 7 in the optical integrated circuit device with an improved waveguide layer, along an F—F' line in FIG. 16 in the fourth embodiment according to the present invention.

FIGS. 18A through 18E are perspective views illustrative of sequential fabrication processes of the optical integrated circuit device with the improved waveguide layer in the fourth embodiment according to the present invention.

Figure 19:
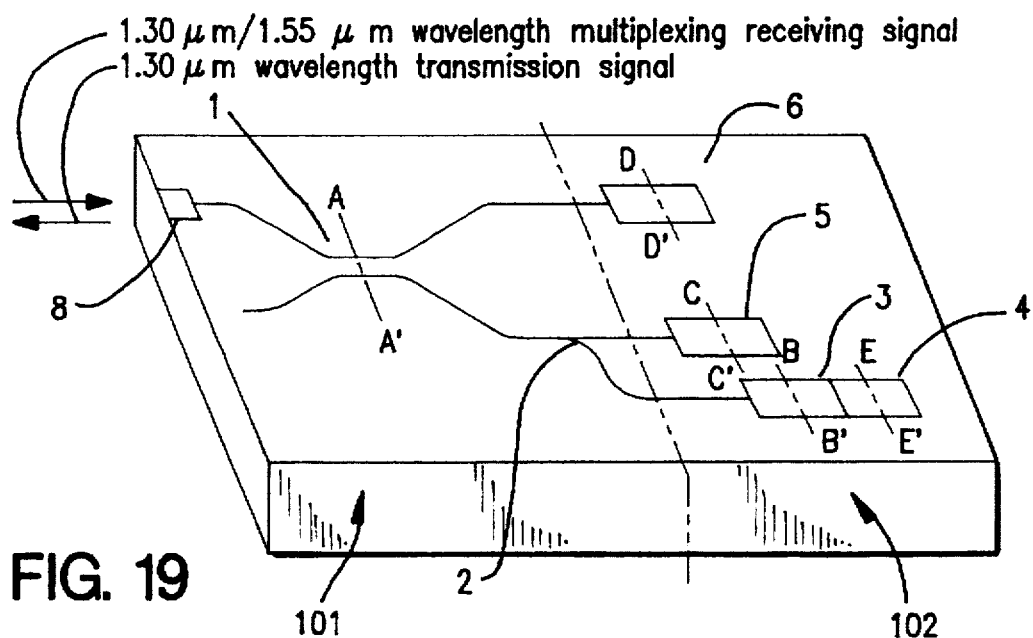

FIG. 19 is a perspective view illustrative of an optical integrated circuit device with an improved waveguide layer in the fifth embodiment according to the present invention.

Figure 20A:
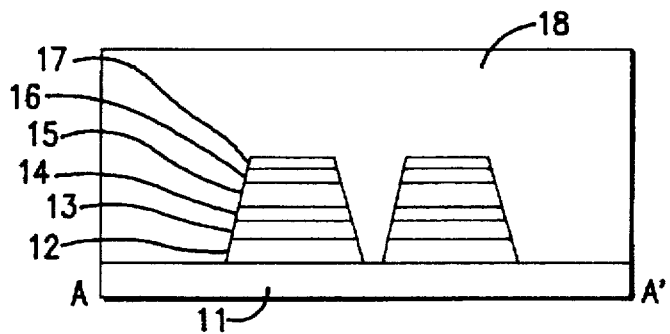

FIG. 20A is a fragmentary cross sectional elevation view illustrative of an internal layered structure of the wavelength division multiplexing directional coupler in the optical integrated circuit device with an improved waveguide layer, along an A—A' line in FIG. 19 in the fifth embodiment according to the present invention.

Figure 20B:
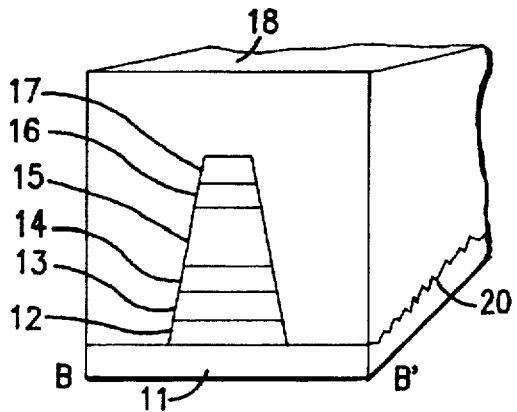

FIG. 20B is a fragmentary cross sectional elevation view illustrative of an internal layered structure of the 1.30 μm transmitter laser diode 3 in the optical integrated circuit device with an improved waveguide layer, along an B—B' line in FIG. 19 in the fifth embodiment according to the present invention.

Figure 20C:
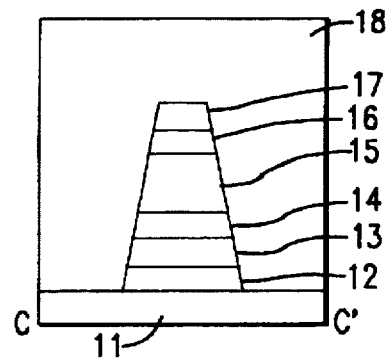

FIG. 20C is a fragmentary cross sectional elevation view illustrative of an internal layered structure of the 1.30 μm receiver photo-diode 5 in the optical integrated circuit device with an improved waveguide layer, along an C—C' line in FIG. 19 in the fifth embodiment according to the present invention.

Figure 20D:
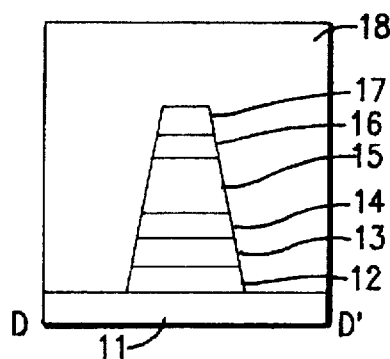

FIG. 20D is a fragmentary cross sectional elevation view illustrative of an internal layered structure of the 1.30 μm monitor photo-diode 4 in the optical integrated circuit device with an improved waveguide layer, along an D—D' line in FIG. 19 in the fifth embodiment according to the present invention.

Figure 20E:
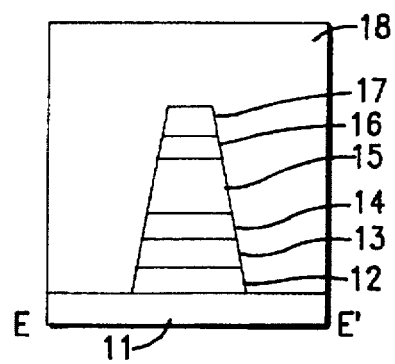

FIG. 20E is a fragmentary cross sectional elevation view illustrative of an internal layered structure of the 1.55 μm receiver photo-diode 6 in the optical integrated circuit device with an improved waveguide layer, along an E—E' line in FIG. 19 in the fifth embodiment according to the present invention.

Figure 20F:
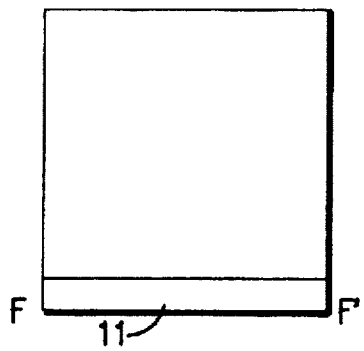

FIG. 20F is a fragmentary cross sectional elevation view illustrative of an internal layered structure of the window 8 in the optical integrated circuit device with an improved waveguide layer, along an F—F' line in FIG. 19 in the fifth embodiment according to the present invention.

FIGS. 21A through 21E are perspective views illustrative of sequential fabrication processes of the optical integrated circuit device with the improved waveguide layer in the fifth embodiment according to the present invention.

FIG. 22 is a perspective view illustrative of an optical integrated circuit device with an improved waveguide layer in the sixth embodiment according to the present invention.

FIG. 23A is a fragmentary cross sectional elevation view illustrative of an internal layered structure of the Y-branch in the optical integrated circuit device with an improved waveguide layer, along an A—A' line in FIG. 22 in the sixth embodiment according to the present invention.

FIG. 23B is a fragmentary cross sectional elevation view illustrative of an internal layered structure of the 1.30 μm transmitter laser diode 3 in the optical integrated circuit device with an improved waveguide layer, along an B—B' line in FIG. 22 in the sixth embodiment according to the present invention.

FIG. 23C is a fragmentary cross sectional elevation view illustrative of an internal layered structure of the 1.30 μm receiver photo-diode 5 in the optical integrated circuit device with an improved waveguide layer, along an C—C' line in FIG. 22 in the sixth embodiment according to the present invention.

FIG. 23D is a fragmentary cross sectional elevation view illustrative of an internal layered structure of the 1.30 μm monitor photo-diode 4 in the optical integrated circuit device with an improved waveguide layer, along an D—D' line in FIG. 22 in the sixth embodiment according to the present invention.

FIG. 23E is a fragmentary cross sectional elevation view illustrative of an internal layered structure of the spot size converter 7 in the optical integrated circuit device with an improved waveguide layer, along an E—E' line in FIG. 22 in the sixth embodiment according to the present invention.

FIGS. 24A through 24E are perspective views illustrative of sequential fabrication processes of the optical integrated circuit device with the improved waveguide layer in the sixth embodiment according to the present invention.

Figure 25:
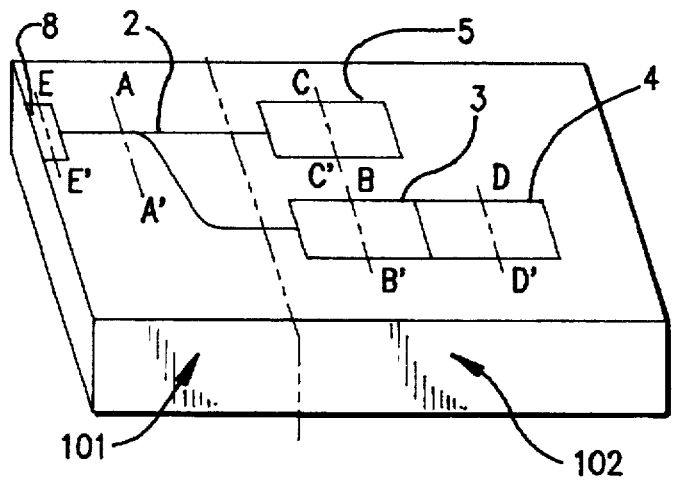

FIG. 25 is a perspective view illustrative of an optical integrated circuit device with an improved waveguide layer in the seventh embodiment according to the present invention.

Figure 26A:
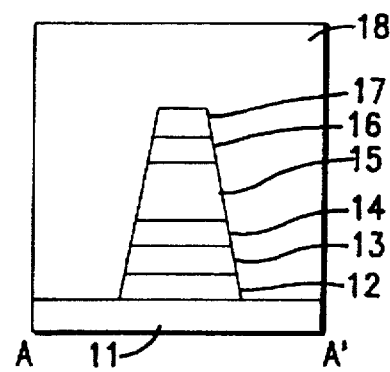

FIG. 26A is a fragmentary cross sectional elevation view illustrative of an internal layered structure of the Y-branch in the optical integrated circuit device with an improved waveguide layer, along an A—A' line in FIG. 25 in the seventh embodiment according to the present invention.

Figure 26B:
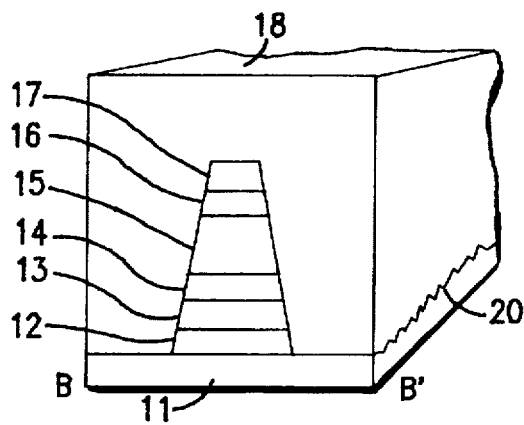

FIG. 26B is a fragmentary cross sectional elevation view illustrative of an internal layered structure of the 1.30 μm transmitter laser diode 3 in the optical integrated circuit device with an improved waveguide layer, along an B—B' line in FIG. 25 in the seventh embodiment according to the present invention.

Figure 26C:
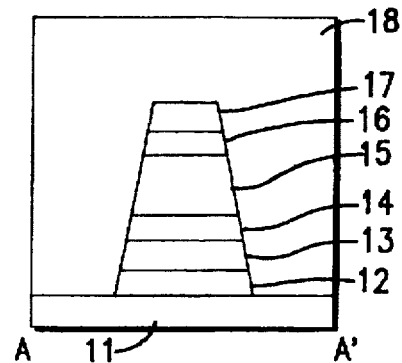

FIG. 26C is a fragmentary cross sectional elevation view illustrative of an internal layered structure of the 1.30 μm receiver photo-diode 5 in the optical integrated circuit device with an improved waveguide layer, along an C—C' line in FIG. 25 in the seventh embodiment according to the present invention.

Figures 26D, 26E:
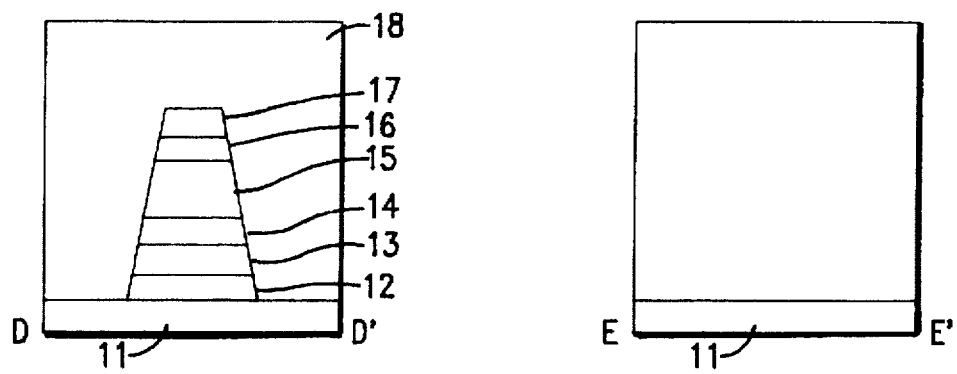

FIG. 26D is a fragmentary cross sectional elevation view illustrative of an internal layered structure of the 1.30 μm monitor photo-diode 4 in the optical integrated circuit device with an improved waveguide layer, along an D—D' line in FIG. 25 in the seventh embodiment according to the present invention.

FIG. 26E is a fragmentary cross sectional elevation view illustrative of an internal layered structure of the window 8 in the optical integrated circuit device with an improved waveguide layer, along an E—E' line in FIG. 25 in the seventh embodiment according to the present invention.

FIGS. 27A through 27E are perspective views illustrative of sequential fabrication processes of the optical integrated circuit device with the improved waveguide layer in the seventh embodiment according to the present invention.

Figure 28:
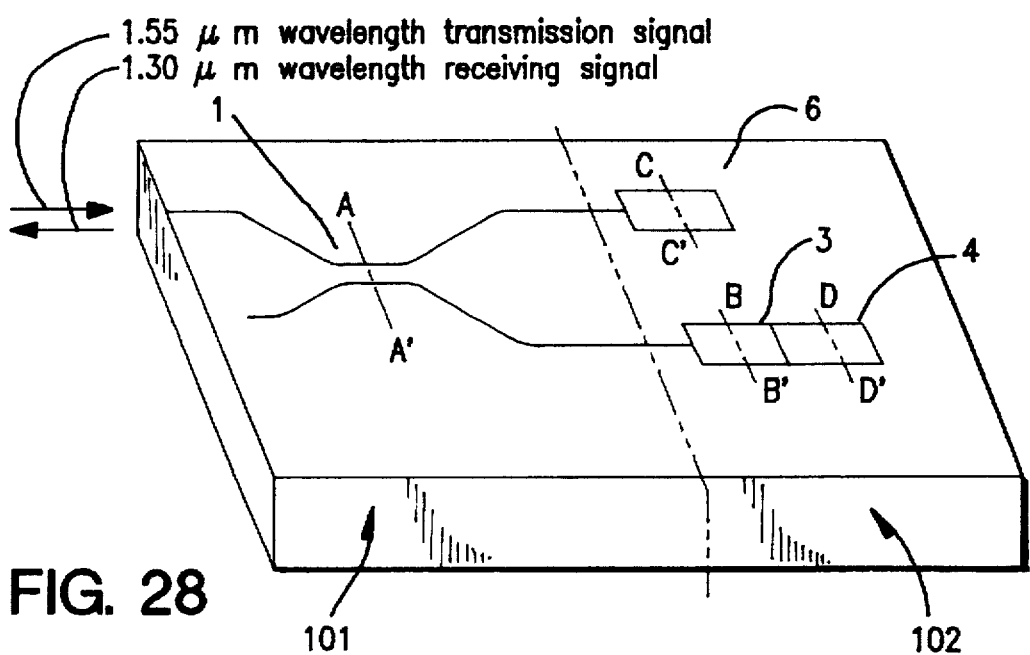

FIG. 28 is a perspective view illustrative of an optical integrated circuit device with an improved waveguide layer in the eighth embodiment according to the present invention.

Figure 29B:
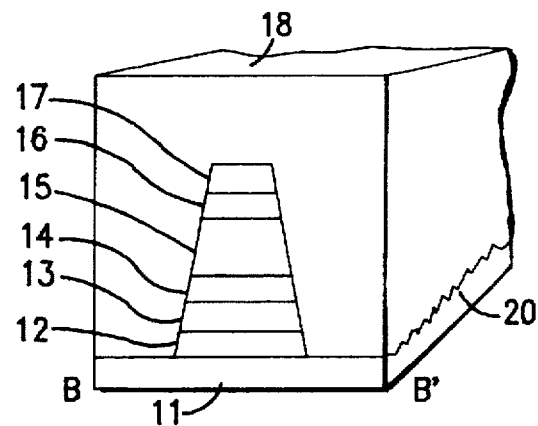
Figure 29A:
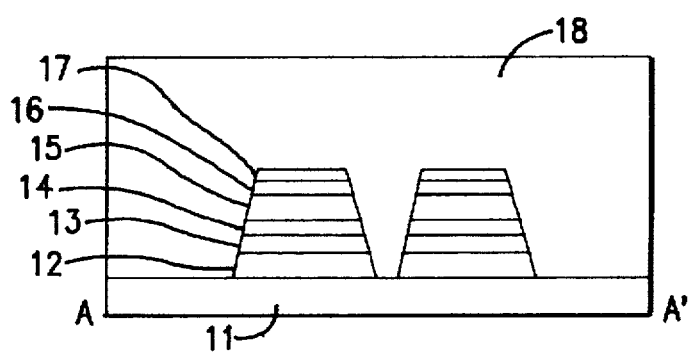

FIG. 29A is a fragmentary cross sectional elevation view illustrative of an internal layered structure of the wavelength division multiplexing directional coupler in the optical integrated circuit device with an improved waveguide layer, along an A—A' line in FIG. 28 in the eighth embodiment according to the present invention.

FIG. 29B is a fragmentary cross sectional elevation view illustrative of an internal layered structure of the 1.30 μm transmitter laser diode 3 in the optical integrated circuit device with an improved waveguide layer, along an B—B' line in FIG. 28 in the eighth embodiment according to the present invention.

FIG. 29C is a fragmentary cross sectional elevation view illustrative of an internal layered structure of the 1.30 μm receiver photo-diode 5 in the optical integrated circuit device with an improved waveguide layer, along an C—C' line in FIG. 28 in the eighth embodiment according to the present invention.

FIG. 29D is a fragmentary cross sectional elevation view illustrative of an internal layered structure of the 1.30 μm monitor photo-diode 4 in the optical integrated circuit device with an improved waveguide layer, along an D—D' line in FIG. 28 in the eighth embodiment according to the present invention.

FIGS. 30A through 30D are perspective views illustrative of sequential fabrication processes of the optical integrated circuit device with the improved waveguide layer in the eighth embodiment according to the present invention.

Figure 31:
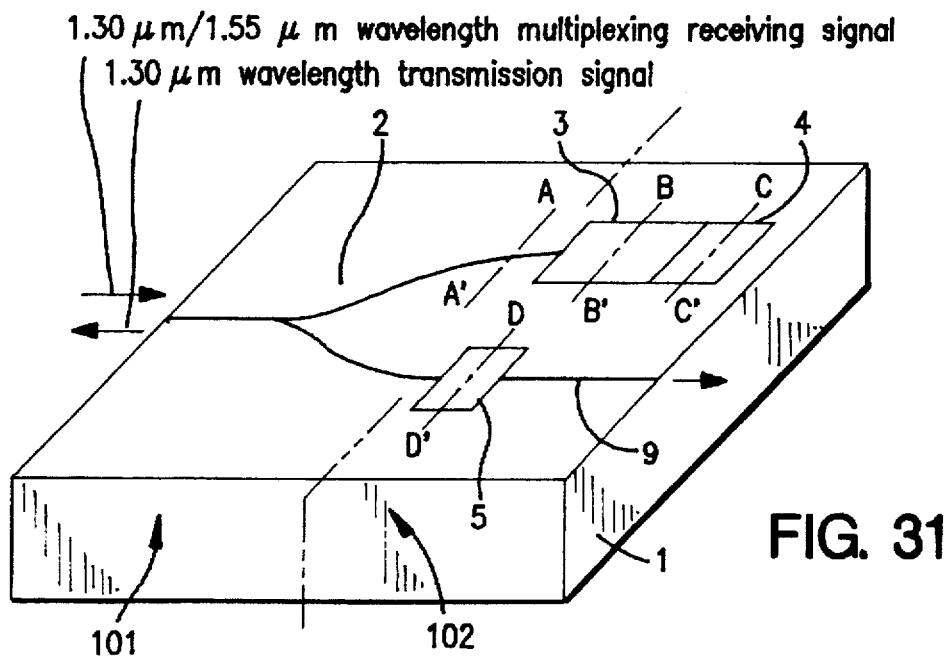

FIG. 31 is a perspective view illustrative of an optical integrated circuit device with an improved waveguide layer in the ninth embodiment according to the present invention.

Figure 32A:
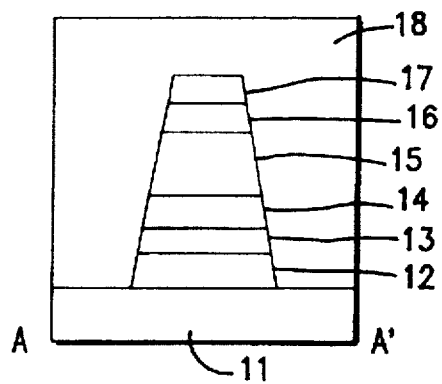

FIG. 32A is a fragmentary cross sectional elevation view illustrative of an internal layered structure of the Y-branch in the optical integrated circuit device with an improved waveguide layer, along an A—A' line in FIG. 31 in the ninth embodiment according to the present invention.

Figure 32B:
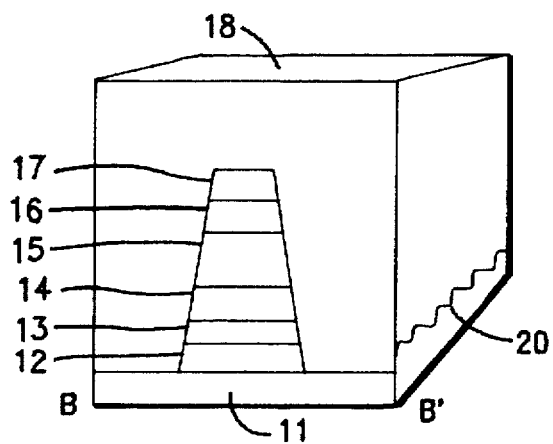

FIG. 32B is a fragmentary cross sectional elevation view illustrative of an internal layered structure of the 1.30 μm transmitter laser diode 3 in the optical integrated circuit device with an improved waveguide layer, along an B—B' line in FIG. 31 in the ninth embodiment according to the present invention.

Figure 32C:
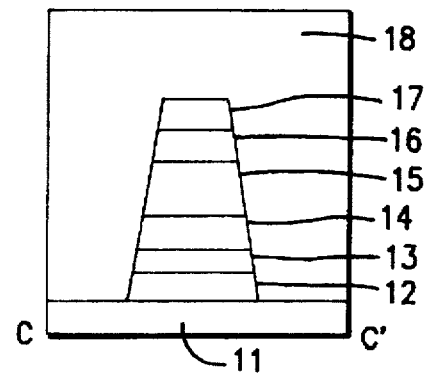

FIG. 32C is a fragmentary cross sectional elevation view illustrative of an internal layered structure of the 1.30 μm receiver photo-diode 5 in the optical integrated circuit device with an improved waveguide layer, along an C—C' line in FIG. 31 in the ninth embodiment according to the present invention.

Figure 32D:
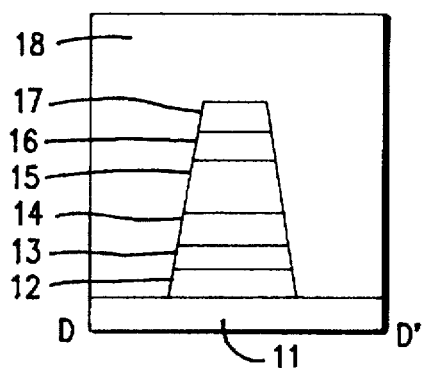

FIG. 32D is a fragmentary cross sectional elevation view illustrative of an internal layered structure of the 1.30 μm monitor photo-diode 4 in the optical integrated circuit device with an improved waveguide layer, along an D—D' line in FIG. 31 in the ninth embodiment according to the present invention.

FIGS. 33A through 33D are perspective views illustrative of sequential fabrication processes of the optical integrated circuit device with the improved waveguide layer in the ninth embodiment according to the present invention.

Figure 34:
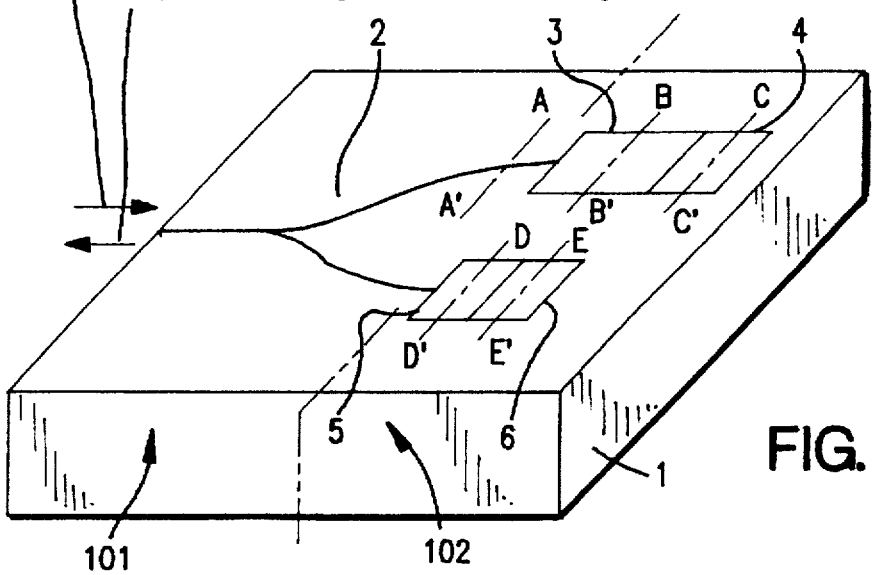

FIG. 34 is a perspective view illustrative of an optical integrated circuit device with an improved waveguide layer in the tenth embodiment according to the present invention.

Figure 35A:
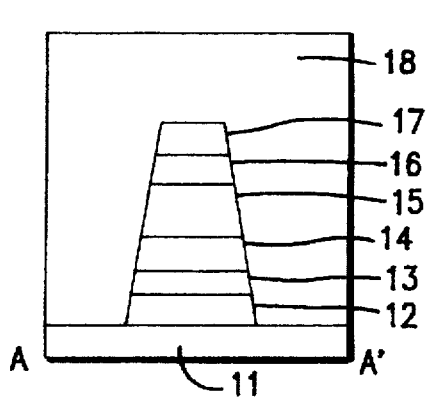

FIG. 35A is a fragmentary cross sectional elevation view illustrative of an internal layered structure of the Y-branch in the optical integrated circuit device with an improved waveguide layer, along an A—A' line in FIG. 34 in the tenth embodiment according to the present invention.

Figure 35B:
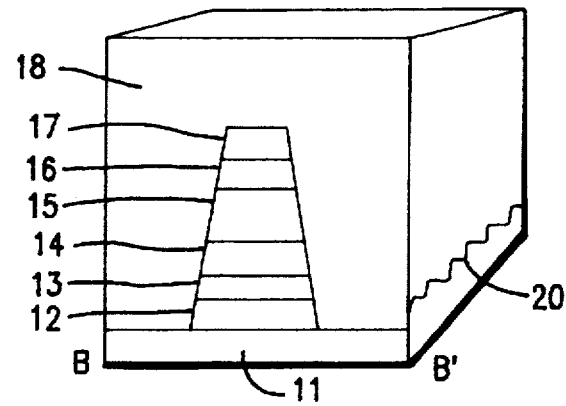

FIG. 35B is a fragmentary cross sectional elevation view illustrative of an internal layered structure of the 1.30 μm transmitter laser diode 3 in the optical integrated circuit device with an improved waveguide layer, along an B—B' line in FIG. 34 in the tenth embodiment according to the present invention.

Figure 35C:
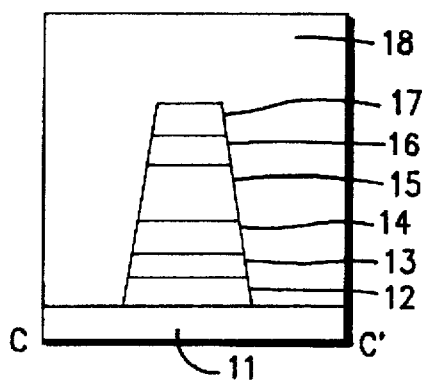

FIG. 35C is a fragmentary cross sectional elevation view illustrative of an internal layered structure of the 1.30 μm monitor photo-diode 4 in the optical integrated circuit device with an improved waveguide layer, along an C—C' line in FIG. 34 in the tenth embodiment according to the present invention.

Figure 35D:
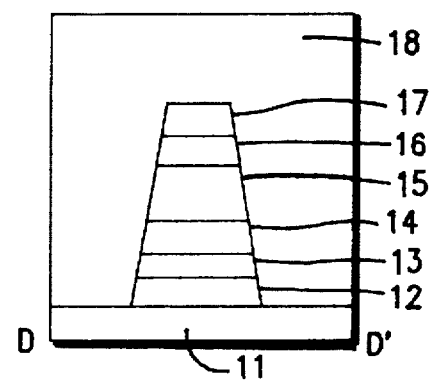

FIG. 35D is a fragmentary cross sectional elevation view illustrative of an internal layered structure of the 1.30 μm receiver photo-diode 5 in the optical integrated circuit device with an improved waveguide layer, along an D—D' line in FIG. 34 in the tenth embodiment according to the present invention.

Figure 35E:
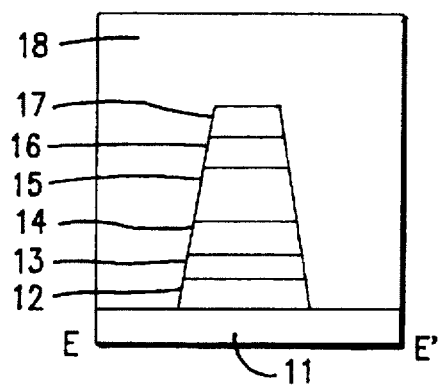

FIG. 35E is a fragmentary cross sectional elevation view illustrative of an internal layered structure of the 1.55 μm receiver photo-diode 6 in the optical integrated circuit device with an improved waveguide layer, along an E—E' line in FIG. 34 in the tenth embodiment according to the present invention.

Figure 36A:
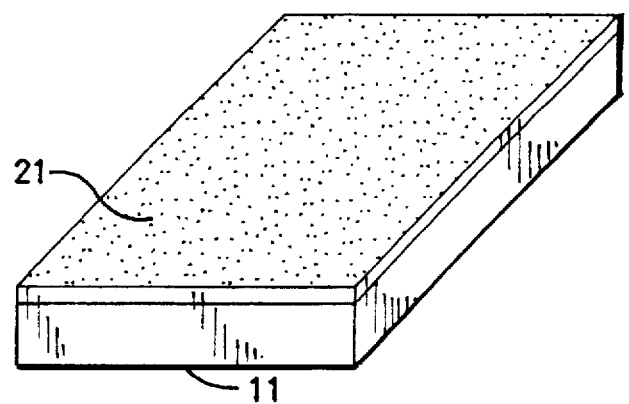
Figure 36B:
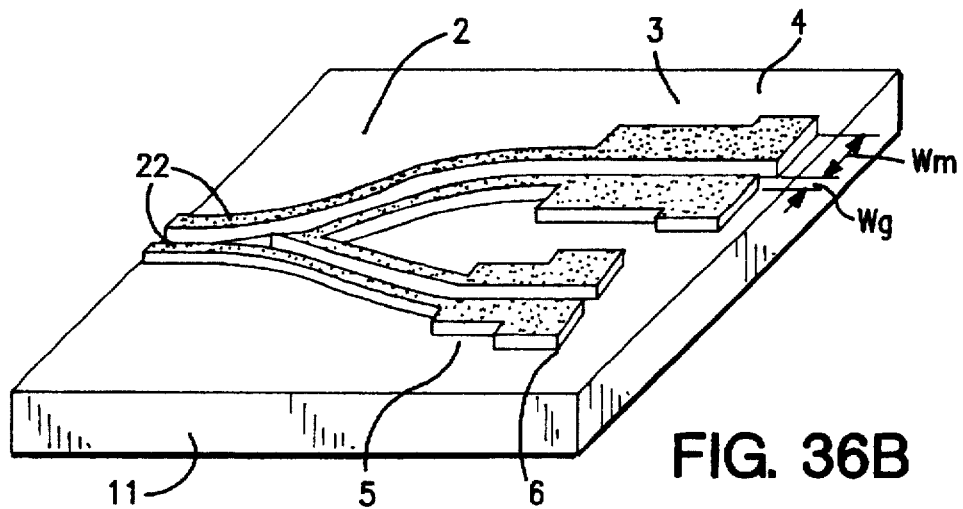

FIGS. 36A through 36B are perspective views illustrative of sequential fabrication processes of the optical integrated circuit device with the improved waveguide layer in the tenth embodiment according to the present invention.

Figure 37:
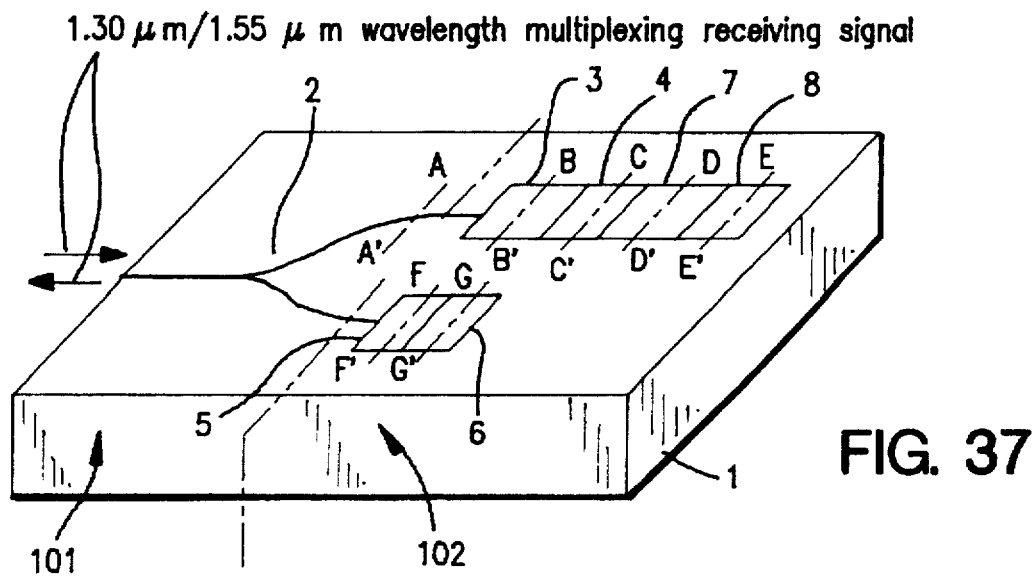

FIG. 37 is a perspective view illustrative of an optical integrated circuit device with an improved waveguide layer in the eleventh embodiment according to the present invention.

Figure 38A:
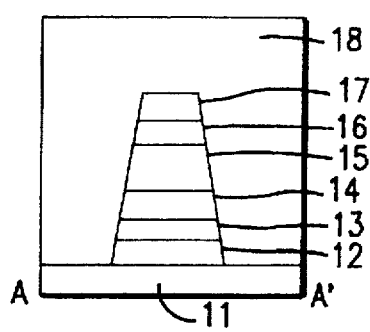

FIG. 38A is a fragmentary cross sectional elevation view illustrative of an internal layered structure of the Y-branch in the optical integrated circuit device with an improved waveguide layer, along an A—A' line in FIG. 37 in the eleventh embodiment according to the present invention.

Figure 38B:
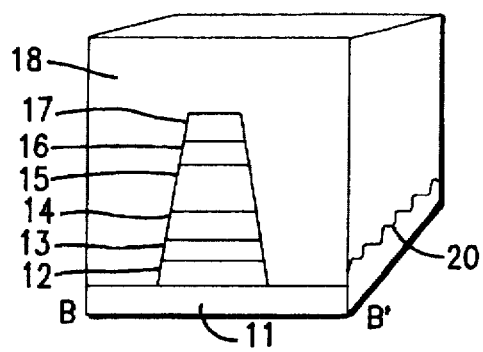

FIG. 38B is a fragmentary cross sectional elevation view illustrative of an internal layered structure of the 1.30 μm transmitter laser diode 3 in the optical integrated circuit device with an improved waveguide layer, along an B—B' line in FIG. 37 in the eleventh embodiment according to the present invention.

Figure 38C:
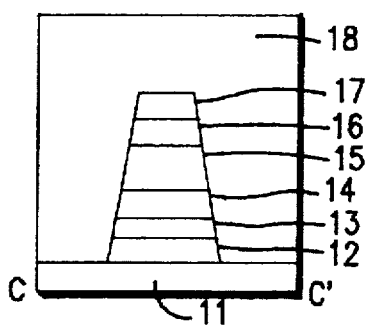

FIG. 38C is a fragmentary cross sectional elevation view illustrative of an internal layered structure of the 1.30 μm monitor photo-diode 4 in the optical integrated circuit device with an improved waveguide layer, along an C—C' line in FIG. 37 in the eleventh embodiment according to the present invention.

Figure 38D:
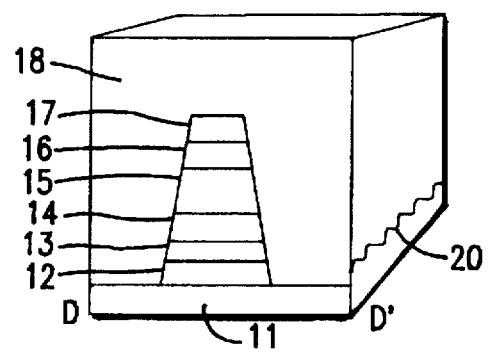

FIG. 38D is a fragmentary cross sectional elevation view illustrative of an internal layered structure of the 1.55 μm transmitter laser diode 7 in the optical integrated circuit device with an improved waveguide layer, along an D—D' line in FIG. 37 in the eleventh embodiment according to the present invention.

Figure 38E:
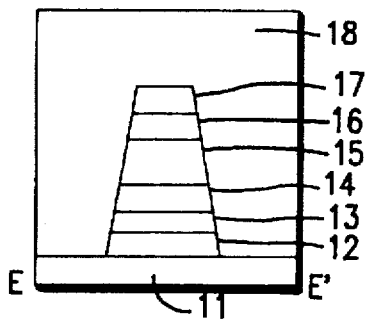

FIG. 38E is a fragmentary cross sectional elevation view illustrative of an internal layered structure of the 1.55 μm monitor photo-diode 8 in the optical integrated circuit device with an improved waveguide layer, along an E—E' line in FIG. 37 in the eleventh embodiment according to the present invention.

Figure 38F:
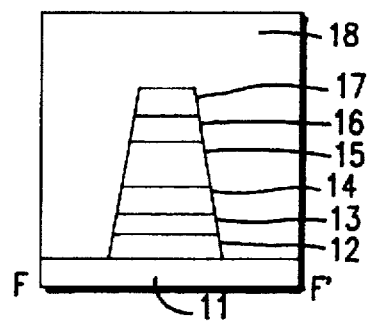

FIG. 38F is a fragmentary cross sectional elevation view illustrative of an internal layered structure of the 1.30 μm receiver photo-diode 5 in the optical integrated circuit device with an improved waveguide layer, along an F—F' in FIG. 37 in the eleventh embodiment according to the present invention.

Figure 38G:
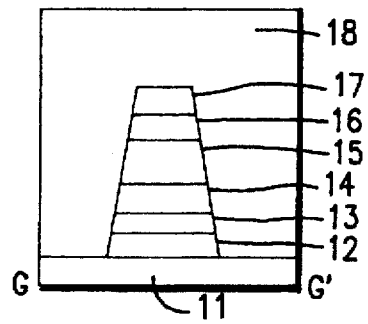

FIG. 38G is a fragmentary cross sectional elevation view illustrative of an internal layered structure of the 1.55 μm receiver photo-diode 6 in the optical integrated circuit device with an improved waveguide layer, along an G—G' line in FIG. 37 in the eleventh embodiment according to the present invention.

Figure 39A:
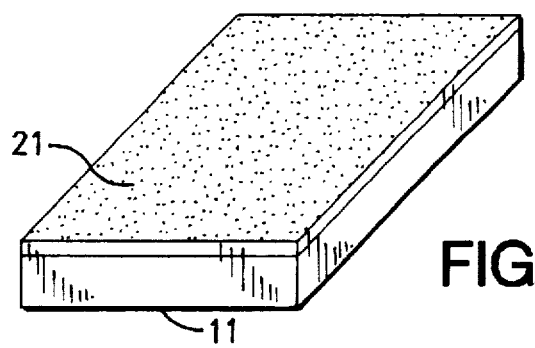
Figure 39B:
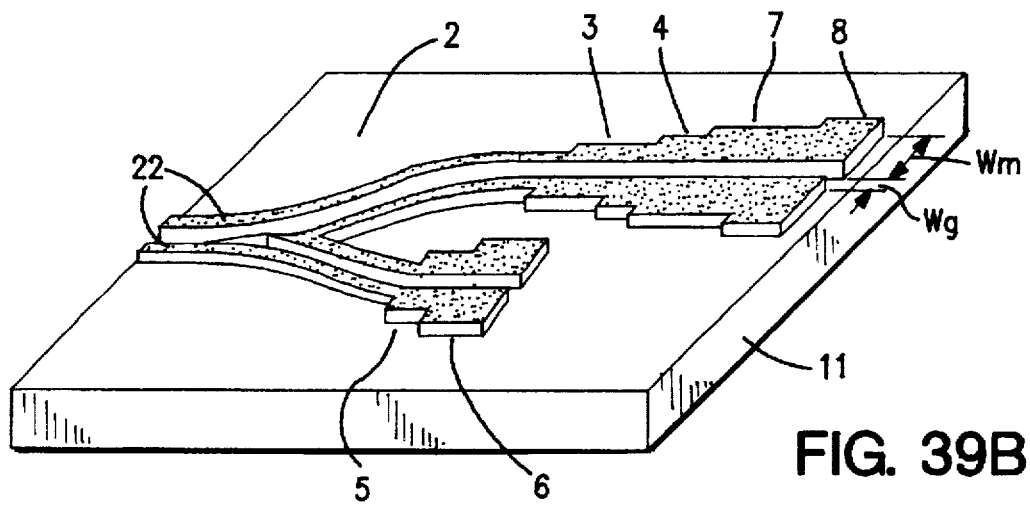

FIGS. 39A and 39B are perspective views illustrative of sequential fabrication processes of the optical integrated circuit device with the improved waveguide layer in the eleventh embodiment according to the present invention.

Figure 40:
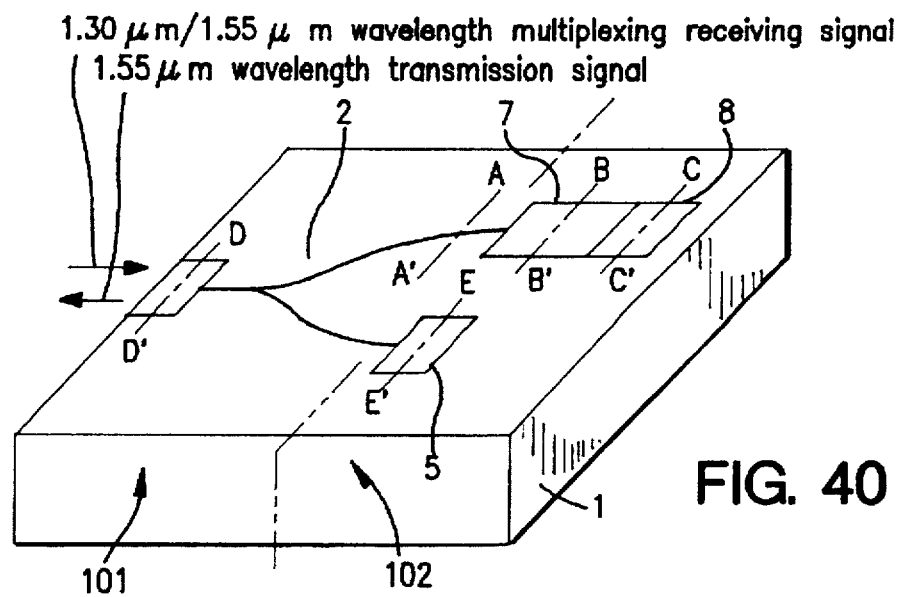

FIG. 40 is a perspective view illustrative of an optical integrated circuit device with an improved waveguide layer in the twelfth embodiment according to the present invention.

Figure 41A:
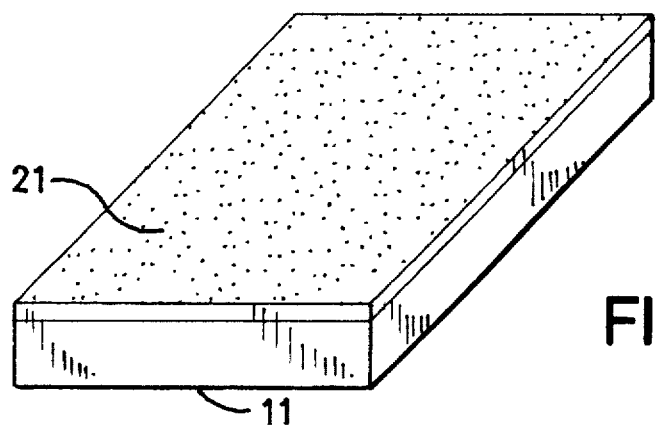
Figure 41B:
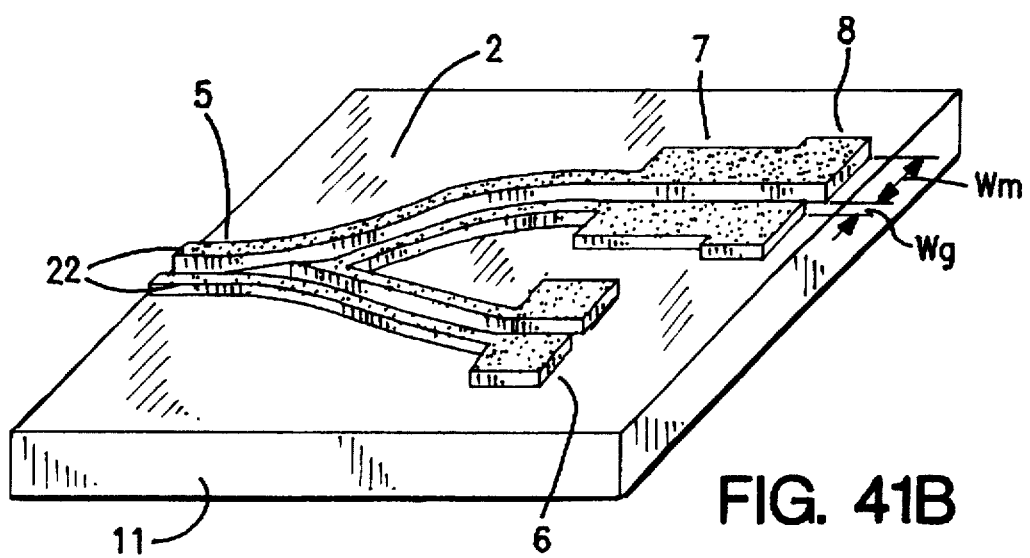

FIGS. 41A and 41B are perspective views illustrative of sequential fabrication processes of the optical integrated circuit device with the improved waveguide layer in the twelfth embodiment according to the present invention.

DISCLOSURE OF THE INVENTION

The present invention provides a semiconductor waveguide layer provided in an optical semiconductor integrated circuit device comprising a passive region having at least a branch and an active region having at least a laser diode connected to the branch and at least a photo-diode connected to the branch. The active region is in contact with the passive region. The waveguide layer selectively extends over the passive region and the active region. The semiconductor waveguide layer in the active region has a wavelength composition larger than that in the passive region. The waveguide layer has a semiconductor crystal structure which is continuous not only over the active and passive regions but also at a boundary between the active and passive regions.

In order to obtain this continuous semiconductor crystal structure even across the boundary between the active and passive regions, the waveguide layer has been formed by a selective semiconductor crystal growth using a dielectric mask pattern being provided on the semiconductor substrate and extending over the active and passive regions. The dielectric mask pattern comprises at least a pair of stripe like dielectric films having a gap between them. Each of the stripe like dielectric films has a larger width in the active region than that in the passive region.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

In the above case, it is possible that the width of the stripe like dielectric films remains constant over the passive region.

Alternatively, it is also possible that the width of the stripe like dielectric films varies on at least a part of the passive region.

Further, in the above case, it is possible that the width of the stripe like dielectric films remains constant over the active region.

Alternatively, it is also possible that the width of the stripe like dielectric films varies on at least a part of the active region to decrease toward the branch. In this case, it is preferable that the decrease in the width of the stripe like dielectric films is a step like decrease toward the branch.

Figure 1:
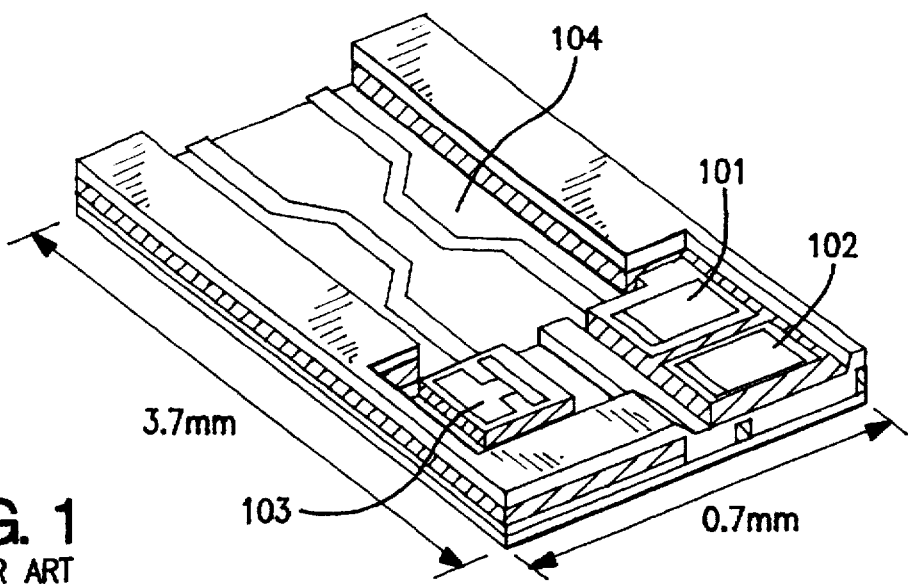
FIG. 1 is a perspective view illustrative of a conventional optical integrated circuit device.
Figure 2:
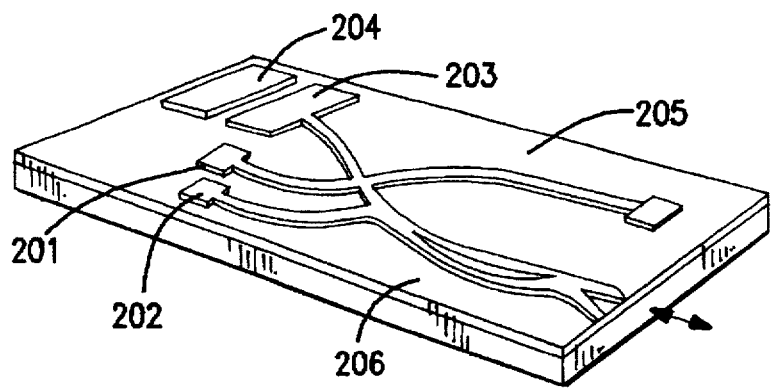
FIG. 2 is a perspective view illustrative of another conventional optical integrated circuit device.
Figure 3:
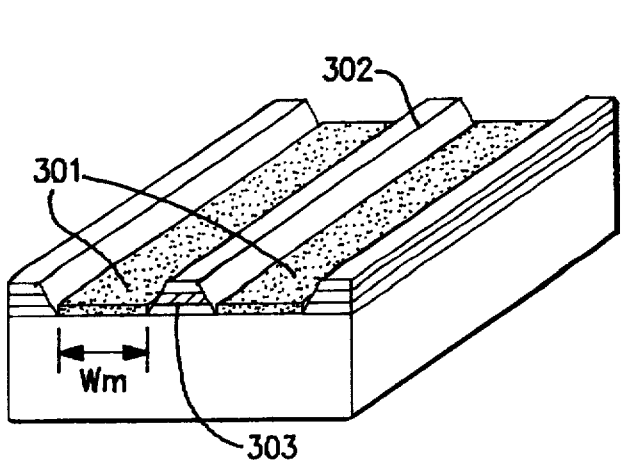
FIG. 3 is a perspective view illustrative of a metal organic chemical vapor deposition process.
Figure 4:
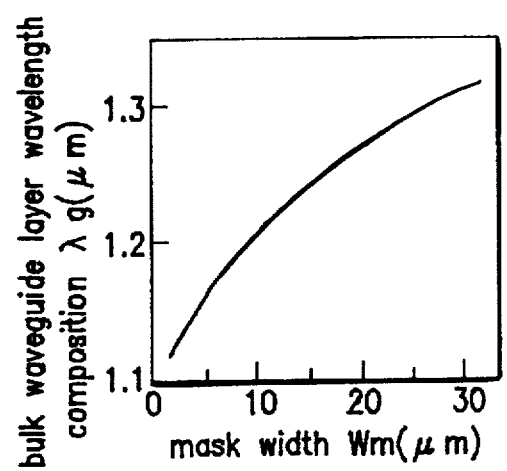
FIG. 4 is a diagram illustrative of a wavelength composition of a bulk waveguide layer versus a mask width.
Figure 5:
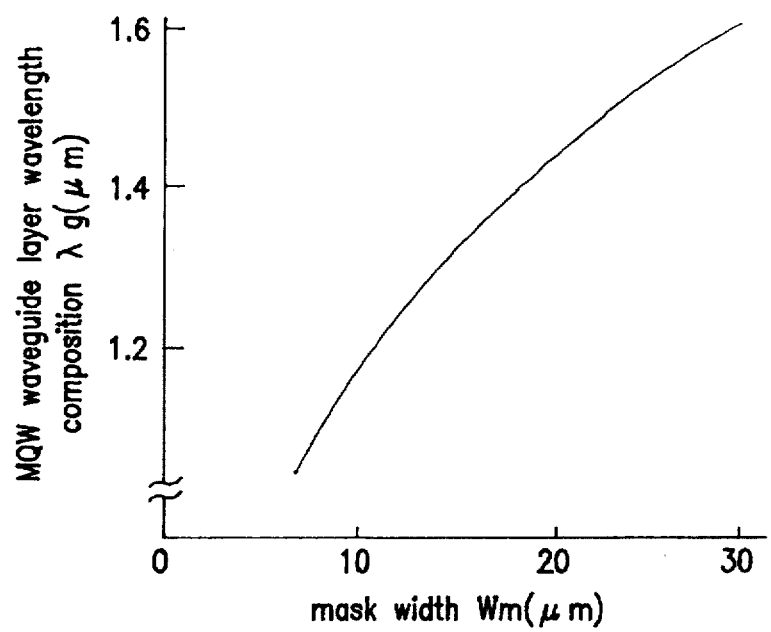
FIG. 5 is a diagram illustrative of a wavelength composition of a multiple quantum well waveguide layer versus a mask width.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is a still further possible that the gap of the stripe like dielectric films remain constant over the passive and active regions.

It is yet a further possible that the gap of the stripe like dielectric films varies on at least a part of the passive and active regions.

It is further more possible that the branch comprises a Y-branch.

It is moreover possible to further provide a wavelength division multiplexing coupler in the passive region and the wavelength division multiplexing coupler is connected through the branch to the laser diode and the photo diode.

It is still more possible to further provide a monitor photo diode in the active region. The monitor photo diode is provided adjacent to a rear side of the laser diode having a front side connected to the branch.

It is yet more possible to further provide a spot size converter at an opposite end portion of the branch to a boundary between the active and passive regions. The spot size converter allows a highly efficient coupling of the optical integrated circuit device to an optical fiber.

It is also possible to further provide a window region provided at an opposite end portion of the branch to a boundary between the active and passive regions. The window region can cut off almost all of the reflective light.

It is also possible that a plurality of photo-diodes for the same wavelength band are provided to be connected in parallel to the branch.

Alternatively, it is possible that a plurality of photo-diodes for different wavelength bands are provided to be connected in parallel to the branch. This allows different wavelength band optical signal communications for a plurality of media communications.

Further, alternatively, it is possible that a plurality of photo-diodes adjusted for different wavelength bands are provided to be connected in series to the branch, provided that the photo-diode positioned closer to the branch than others is adjusted for a larger wavelength band than those of the other photo-diodes. This allows different wavelength band optical signal communications for a plurality of media communications.

It is also possible that a plurality of laser-diodes for the same wavelength band are provided to be connected in parallel to the branch.

Alternatively, it is possible that a plurality of laser-diodes for different wavelength bands are provided to be connected in parallel to the branch. This allows different wavelength band optical signal communications for a plurality of media communications.

Further, alternatively, it is possible that a plurality of laser-diodes adjusted for different wavelength bands are provided to be connected in series to the branch, provided the laser-diode positioned closer to the branch than others is adjusted for a larger wavelength band than those of the other laser-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible to further provide a photo-diode provided at an opposite end portion of the branch to a boundary between the active and passive regions.

It is also possible that the waveguide layer includes a multiple quantum well structure.

The present invention provides an optical semiconductor integrated circuit device comprising a semiconductor substrate having a passive region and an active region, and a ridged structure constituting at least a branch selectively extending over the passive region, at least a laser diode selectively extending over the active region and at least a photo diode selectively extending over the active region. The ridged structure includes a semiconductor waveguide layer sandwiched between optical confinement layers. The semiconductor waveguide layer in the active region has a wavelength composition larger than that in the passive region. The waveguide layer has a semiconductor crystal structure which is continuous not only over the active and passive regions but also at a boundary between the active and passive regions.

In order to obtain this continuous semiconductor crystal structure even across the boundary between the active and passive regions, the ridged structure has been formed by a selective semiconductor crystal growth using a dielectric mask pattern is provided on the semiconductor substrate and extends over the active and passive regions. The dielectric mask pattern comprises at least a pair of stripe like dielectric films having a gap between them. Each of the stripe like dielectric films has a larger width in the active region than that in the passive region.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

Further, the above optical integrated circuit device may be free of any wavelength division multiplexing couplers such as Mach-Zehnder wavelength division multiplexing couplers and directional wavelength division multiplexing couplers. This structure allows a substantial scaling down of the optical integrated circuit device. This allows a further reduction in manufacturing cost for the products of the optical integrated circuit devices.

It is possible that the width of the stripe like dielectric films remains constant over the passive region.

Alternatively, it is also possible that the width of the stripe like dielectric films varies on at least a part of the passive region.

Further, alternatively, it is also possible that the width of the stripe like dielectric films remains constant over the active region.

Further more, alternatively, it is also possible that the width of the stripe like dielectric films varies on at least a part of the active region to decrease toward the branch. In this case, it is preferable that the decrease in the width of the stripe like dielectric films is a step like decrease toward the branch.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is also possible that the gap of the stripe like dielectric films remain constant over the passive and active regions.

Alternatively, it is also possible that the gap of the stripe like dielectric films varies on at least a part of the passive and active regions.

Further, alternatively, it is also possible that the branch comprises a Y-branch.

It is also possible to further provide a wavelength division multiplexing coupler in the passive region and the wavelength division multiplexing coupler is connected through the branch to the laser diode and the photo diode.

Alternatively, it is also possible to further provide a monitor photo diode in the active region. The monitor photo diode is provided adjacent to a rear side of the laser diode having a front side connected to the branch.

Further, alternatively, it is also possible to further provide a spot size converter provided at an opposite end portion of the branch to a boundary between the active and passive regions. The spot size converter allows a highly efficient coupling of the optical integrated circuit device to an optical fiber.

Further more, alternatively, it is also possible to further provide a window region at an opposite end portion of the branch to a boundary between the active and passive regions. The window region can cut off almost all of the reflective light.

It is also possible that a plurality of photo-diodes for the same wavelength band are provided to be connected in parallel to the branch.

Alternatively, it is also possible that a plurality of photo-diodes for different wavelength bands are provided to be connected in parallel to the branch. This allows different wavelength band optical signal communications for a plurality of media communications.

Further, alternatively, it is also possible that a plurality of photo-diodes adjusted for different wavelength bands are provided to be connected in series to the branch, provided the photo-diode positioned closer to the branch than others is adjusted for a larger wavelength band than those of the other photo-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible that a plurality of laser-diodes for the same wavelength band are provided to be connected in parallel to the branch.

Alternatively, it is also possible that a plurality of laser-diodes for different wavelength bands are provided to be connected in parallel to the branch. This allows different wavelength band optical signal communications for a plurality of media communications.

Further, alternatively, it is also possible that a plurality of laser-diodes adjusted for different wavelength bands are provided to be connected in series to the branch, provided that the laser-diode positioned closer to the branch than others is adjusted for a larger wavelength band than those of the other laser-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible to further provide a photo-diode at an opposite end portion of the branch to a boundary between the active and passive regions.

It is also possible that the ridged structure is a strip loaded structure.

It is also possible that the ridged structure is a buried structure buried with a burying semiconductor layer.

The buried structure of the ridged portion of the optical integrated circuit can make the optical integrated circuit device free from the problem with polarization due to a considerable difference in optical confinement force between in TE mode and in TM mode.

It is preferable that the ridged structure comprises an n-doped InGaAsP layer, an n-doped InP spacer layer formed on the n-doped InGaAsP layer, a bottom separate confinement hetero-structure layer formed on the n-doped InP spacer layer, a multiple quantum well waveguide layer formed on the bottom separate confinement hetero-structure layer, a top separate confinement hetero-structure layer formed on the multiple quantum well waveguide layer, and an InP cladding layer formed on the top separate confinement hetero-structure layer.

The present invention provides a semiconductor waveguide layer provided in an optical semiconductor integrated circuit device comprising a passive region having at least a wavelength division multiplexing coupler and an active region having at least a laser diode connected to the wavelength division multiplexing coupler and at least a photo-diode connected to the wavelength division multiplexing coupler, and the active region being in contact with the passive region. The waveguide layer selectively extends over the passive region and the active region. The semiconductor waveguide layer in the active region has a wavelength composition larger than that in the passive region. The waveguide layer as a semiconductor crystal structure which is continuous not only over the active and passive regions but also at a boundary between the active and passive regions.

In order to obtain this continuous semiconductor crystal structure even across the boundary between the active and passive regions, the waveguide layer has been formed by a selective semiconductor crystal growth using a dielectric mask pattern being provided on the semiconductor substrate and extending over the active and passive regions. The dielectric mask pattern comprises at least a pair of stripe like dielectric films having a gap between them. Each of the stripe like dielectric films has a larger width in the active region than that in the passive region.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

It is also possible that the width of the stripe like dielectric films remains constant over the passive region.

Alternatively, it is also possible that the width of the stripe like dielectric films varies on at least a part of the passive region.

Further, alternatively, it is also possible that the width of the stripe like dielectric films remains constant over the active region.

Further more, alternatively, it is also possible that the width of the stripe like dielectric films varies on at least a part of the active region to decrease toward the wavelength division multiplexing coupler. In this case, it is preferable that the decrease in the width of the stripe like dielectric films is a step like decrease toward the wavelength division multiplexing coupler.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is also possible that the gap of the stripe like dielectric films remain constant over the passive and active regions.

Alternatively, it is also possible that the gap of the stripe like dielectric films varies on at least a part of the passive and active regions.

It is also possible to further provide a branch in the passive region and the wavelength division multiplexing coupler is connected through the branch to the laser diode and the photo diode. In this case, it is optional that the branch comprises a Y-branch.

It is also possible to further provide a monitor photo diode in the active region, and the monitor photo diode is provided adjacent to a rear side of the laser diode having a front side connected to the wavelength division multiplexing coupler.

Alternatively, it is also possible to further provide a spot size converter at an opposite end portion of the wavelength division multiplexing coupler to a boundary between the active and passive regions. The spot size converter allows a highly efficient coupling of the optical integrated circuit device to an optical fiber.

Further, alternatively, it is also possible to further provide a window region at an opposite end portion of the wavelength division multiplexing coupler to a boundary between the active and passive regions. The window region can cut off almost all of the reflective light.

It is also possible that a plurality of photo-diodes for the same wavelength band are provided to be connected in parallel to the wavelength division multiplexing coupler.

It is also possible that a plurality of photo-diodes for different wavelength bands are provided to be connected in parallel to the wavelength division multiplexing coupler. This allows different wavelength band optical signal communications for a plurality of media communications.

Alternatively, it is also possible that a plurality of photo-diodes adjusted for different wavelength bands are provided to be connected in series to the wavelength division multiplexing coupler, provided the photo-diode positioned closer to the wavelength division multiplexing coupler than others is adjusted for a larger wavelength band than those of the other photo-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible that a plurality of laser-diodes for the same wavelength band are provided to be connected in parallel to the wavelength division multiplexing coupler.

Alternatively, it is also possible that a plurality of laser-diodes for different wavelength bands are provided to be connected in parallel to the wavelength division multiplexing coupler. This allows different wavelength band optical signal communications for a plurality of media communications.

Further, alternatively, it is also possible that a plurality of laser-diodes adjusted for different wavelength bands are provided to be connected in series to the wavelength division multiplexing coupler, provided the laser-diode positioned closer to the wavelength division multiplexing coupler than others is adjusted for a larger wavelength band than those of the other laser-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible to further provide a photo-diode at an opposite end portion of the wavelength division multiplexing coupler to a boundary between the active and passive regions.

It is also possible that the waveguide layer includes a multiple quantum well structure.

The present invention provides an optical semiconductor integrated circuit device comprising a semiconductor substrate having a passive region and an active region, and a ridged structure constituting at least a wavelength division multiplexing coupler selectively extending over the passive region, at least a laser diode selectively extending over the active region and at least a photo diode selectively extending over the active region. The ridged structure includes a semiconductor waveguide layer sandwiched between optical confinement layers. The semiconductor waveguide layer in the active region has a wavelength composition larger than that in the passive region. The waveguide layer has a semiconductor crystal structure which is continuous not only over the active and passive regions but also at a boundary between the active and passive regions.

In order to obtain this continuous semiconductor crystal structure even across the boundary between the active and passive regions, the ridged structure has been formed by a selective semiconductor crystal growth using a dielectric mask pattern being provided on the semiconductor substrate and extending over the active and passive regions. The dielectric mask pattern comprises at least a pair of stripe like dielectric films having a gap between them. Each of the stripe like dielectric films has a larger width in the active region than that in the passive region.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

It is possible that the width of the stripe like dielectric films remains constant over the passive region.

Alternatively, it is also possible that the width of the stripe like dielectric films varies on at least a part of the passive region.

Further, alternatively, it is also possible that the width of the stripe like dielectric films remains constant over the active region.

Further more, alternatively, it is also possible that the width of the stripe like dielectric films varies on at least a part of the active region to decrease toward the wavelength division multiplexing coupler. In this case, it is preferable that the decrease in the width of the stripe like dielectric films is a step like decrease toward the wavelength division multiplexing coupler.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer of a multiple quantum well waveguide layer. This means that it is possible to control the wavelength composition of the waveguide layer by controlling the dielectric mask width.

It is also possible that the gap of the stripe like dielectric films remain constant over the passive and active regions.

Alternatively, it is also possible that the gap of the stripe like dielectric films varies on at least a part of the passive and active regions.

It is also possible to further provide a branch in the passive region and the wavelength division multiplexing coupler is connected through the branch to the laser diode and the photo diode.

It is also possible that the branch comprises a Y-branch.

It is also possible to further provide a monitor photo diode in the active region. The monitor photo diode is provided adjacent to a rear side of the laser diode having a front side connected to the wavelength division multiplexing coupler.

It is also possible that a plurality of photo-diodes for the same wavelength band are provided to be connected in parallel to the branch.

Alternatively, it is also possible that a plurality of photo-diodes for different wavelength bands are provided to be connected in parallel to the branch. This allows different wavelength band optical signal communications for a plurality of media communications.

Further, alternatively, it is also possible that a plurality of photo-diodes adjusted for different wavelength bands are provided to be connected in series to the branch, provided the photo-diode positioned closer to the branch than others in adjusted for a larger wavelength band than those of the other photo-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible that a plurality of laser-diodes for the same wavelength band are provided to be connected in parallel to the branch.

Alternatively, it is also possible that a plurality of laser-diodes for different wavelength bands are provided to be connected in parallel to the branch. This allows different wavelength band optical signal communications for a plurality of media communications.

Further, alternatively, it is also possible that a plurality of laser-diodes adjusted for different wavelength bands are provided to be connected in series to the branch, provided the laser-diode positioned closer to the branch than others is adjusted for a larger wavelength band than those of the other laser-diodes. This allows different wavelength band optical signal communications for a plurality of media communications. A light having a wavelength longer than a wavelength composition of the waveguide layer can travel through the waveguide layer because the light senses transparency of the medium of the waveguide layer.

It is also possible to further provide a photo-diode at an opposite end portion of the branch to a boundary between the active and passive regions.

It is also possible that the ridged structure is a strip loaded structure.

Alternatively, it is also possible that the ridged structure is a buried structure buried with a burying semiconductor layer.

The buried structure of the ridged portion of the optical integrated circuit can make the optical integrated circuit device free from the problem with polarization due to a considerable difference in optical confinement force between in TE mode and in TM mode.

It is also possible that the ridged structure comprises, an n-doped InGaAsP layer, an n-doped InP spacer layer formed on the n-doped InGaAsP layer, a bottom separate confinement hetero-structure layer formed on the n-doped InP spacer layer, a multiple quantum well waveguide layer formed on the bottom separate confinement hetero-structure layer, a top separate confinement hetero-structure layer formed on the multiple quantum well waveguide layer, and an InP cladding layer formed on the top separate confinement hetero-structure layer.

The present invention provides a method of crystal growth for a semiconductor waveguide layer provided over a semiconductor substrate for an optical semiconductor integrated circuit device comprising a passive region having at least a branch and an active region having at least a laser diode connected to the branch and at least a photo-diode connected to the branch, and the active region being in contact with the passive region. The waveguide layer selectively extends over the passive region and the active region, and the semiconductor waveguide layer in the active region having a wavelength composition larger than that in the passive region. The method comprises the following steps. A dielectric mask pattern is provided on the semiconductor substrate. The dielectric mask pattern extends over the active and passive regions. The dielectric mask pattern comprises at least a pair of stripe like dielectric films having a gap between them. Each of the stripe like dielectric films have a larger width in the active region than that in the passive region. Thereafter, a selective semiconductor crystal growth is carried out by use of the dielectric mask pattern to grow the waveguide layer having a semiconductor crystal structure which is continuous not only over the active and passive regions but also at a boundary between the active and passive regions.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

It is possible that the width of the stripe like dielectric films remains constant over the passive region.

Alternatively, it is possible that the width of the stripe like dielectric films varies on at least a part of the passive region.

Further, alternatively, it is possible that the width of the stripe like dielectric films remains constant over the active region.

Further more, alternatively, it is possible that the width of the stripe like dielectric films varies on at least a part of the active region to decrease toward the branch. In this case, it is preferable that the decrease in the width of the stripe like dielectric films is a step like decrease toward the branch.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is possible that the gap of the stripe like dielectric films remain constant over the passive and active regions.

Alternatively, it is possible that the gap of the stripe like dielectric films varies on at least a part of the passive and active regions.

It is also possible that the selective semiconductor crystal growth is carried out by an organic metal chemical vapor deposition method.

The present invention provides a method of forming an optical semiconductor integrated circuit device over a semiconductor substrate having a passive region and an active region. The method comprises the following steps. A dielectric mask pattern is provided on the semiconductor substrate. The dielectric mask pattern extends over the active and passive regions. The dielectric mask pattern comprises at least a pair of stripe like dielectric films having a gap between them. Each of the stripe like dielectric films has a larger width in the active region than that in the passive region. A selective semiconductor crystal growth is carried out by use of the dielectric mask pattern to grow a ridged structure constituting at least a branch selectively extending over the passive region, at least a laser diode selectively extending over the active region and at least a photo diode selectively extending over the active region, the ridged structure including a semiconductor waveguide layer sandwiched between optical confinement layers, the semiconductor waveguide layer in the active region having a wavelength composition larger than that in the passive region. The waveguide layer has a semiconductor crystal structure which is continuous not only over the active and passive regions but also at a boundary between the active and passive regions.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

It is possible that the width of the stripe like dielectric films remains constant over the passive region.

Alternatively, it is also possible that the width of the stripe like dielectric films varies on at least a part of the passive region.

Further, alternatively, it is also possible that the width of the stripe like dielectric films remains constant over the active region.

Further more, alternatively, it the width of the stripe like dielectric films varies on at least a part of the active region to decrease toward the branch. In this case, it is preferable that the decrease in the width of the stripe like dielectric films is a step like decrease toward the branch.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is also possible that the gap of the stripe like dielectric films remain constant over the passive and active regions.

Alternatively, it is also possible that the gap of the stripe like dielectric films varies on at least a part of the passive and active regions.

It is also possible that the selective semiconductor crystal growth is carried out by an organic metal chemical vapor deposition method.

The present invention provides a method of crystal growth for a semiconductor waveguide layer provided over a semiconductor substrate for an optical semiconductor integrated circuit device comprising a passive region having at least a wavelength division multiplexing coupler and an active region having at least a laser diode connected to the wavelength division multiplexing coupler and at least a photo-diode connected to the wavelength division multiplexing coupler. The active region is in contact with the passive region. The waveguide layer selectively extends over the passive region and the active region, and the semiconductor waveguide layer in the active region having a wavelength composition larger than that in the passive region. The method comprises the following steps. A dielectric mask pattern is provided on the semiconductor substrate. The dielectric mask pattern extends over the active and passive regions. The dielectric mask pattern comprises at least a pair of stripe like dielectric films having a gap between them. Each of the stripe like dielectric films has a larger width in the active region than that in the passive region. Thereafter, a selective semiconductor crystal growth is carried out by use of the dielectric mask pattern to grow the waveguide layer having a semiconductor crystal structure which is continuous not only over the active and passive regions but also at a boundary between the active and passive regions.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

It is possible that the width of the stripe like dielectric films remains constant over the passive region.

Alternatively, it is possible that the width of the stripe like dielectric films varies on at least a part of the passive region.

Further, alternative, it is possible that the width of the stripe like dielectric films remains constant over the active region.

Further more, alternatively, it is possible that the width of the stripe like dielectric films varies on at least a part of the active region to decrease toward the wavelength division multiplexing coupler. In this case, it is preferable that the decrease in the width of the stripe like dielectric films is a step like decrease toward the wavelength division multiplexing coupler.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is also possible that the gap of the strip like dielectric films remain constant over the passive and active regions.

Alternatively, it is possible that the gap of the stripe like dielectric films varies on at least a part of the passive and active regions.

It is also possible that the selective semiconductor crystal growth is carried out by an organic metal chemical vapor deposition method.

The present invention provides a method of forming an optical semiconductor integrated circuit device over a semiconductor substrate having a passive region and an active region. The method comprises the following steps. A dielectric mask pattern is provided on the semiconductor substrate. The dielectric mask pattern comprises at least a pair of stripe like dielectric films having a gap between them. Each of the stripe like dielectric films has a larger width in the active region than that in the passive region. Thereafter, a selective semiconductor crystal growth is carried out by use of the dielectric mask pattern to grow a ridged structure constituting at least a wavelength division multiplexing coupler selectively extending over the passive region, at least a laser diode selectively extending over the active region and at least a photo diode selectively extending over the active region, the ridged structure including a semiconductor waveguide layer sandwiched between optical confinement layers. The semiconductor waveguide layer in the active region has a wavelength composition larger than that in the passive region. The waveguide layer has a semiconductor crystal structure which is continuous not only over the active and passive regions but also at a boundary between the active and passive regions.

It is essential for the present invention that the semiconductor crystal structure of the waveguide layer is continuous not only over the active and passive regions but also at a boundary between the active and passive regions. This waveguide layer free of any discontinuity in semiconductor crystal structure allows the optical integrated circuit device to possess extremely superior properties free of any coupling loss. The coupling loss may be caused by a certain discontinuity in semiconductor crystal structure of the waveguide layer. The discontinuity in semiconductor crystal structure of the waveguide layer may further cause a step like discontinuity in peripheral portions of the selectively formed waveguide layer. Such step like discontinuity in peripheral portions of the selectively formed waveguide layer causes a scattering, resulting in a certain coupling loss. Contrary to the above present invention, if the waveguide layer is separately formed in the active and passive regions, then it is unavoidable that the discontinuity in semiconductor crystal structure of the waveguide layer and further the step like discontinuity in peripheral portions thereof are formed at the boundary between the active and passive regions. By contrast, if the waveguide layer extending over the active and passive regions is simultaneously formed by the same crystal growth process in accordance with the present invention, then the semiconductor crystal structure of the waveguide layer is continuous not only over the active and passive regions but also at a boundary between the active and passive regions. The waveguide layer grown in accordance with the present invention is free of the discontinuity in semiconductor crystal structure and of the step like discontinuity in peripheral portions, for which reason the optical integrated circuit having the above improved waveguide layer is free from the problem with the coupling loss and can obtain excellent performances thereof.

The above simultaneous crystal growth of the waveguide layer over the active and passive regions by the single crystal growth process results in a simple fabrication process. This may result in increase in yield of the products of the optical integrated circuit devices as well as in reduction in manufacturing cost thereof.

It is possible that the width of the stripe like dielectric films remains constant over the passive region.

Alternatively, it is possible that the width of the stripe like dielectric films varies on at least a part of the passive region.

Further, alternatively, it is possible that the width of the stripe like dielectric films remains constant over the active region.

Further more, alternatively, it is possible that the width of the stripe like dielectric films varies on at least a part of the active region to decrease toward the wavelength division multiplexing coupler. In this case, it is preferable that the decrease in the width of the stripe like dielectric films is a step like decrease toward the wavelength division multiplexing coupler.

As illustrated in FIGS. 3, 4 and 5, the wavelength composition of the waveguide layer depends upon the width of the dielectric mask by which the waveguide layer has been grown. As the dielectric mask width is increased, then the wavelength composition is simply increased, regardless of whether the waveguide layer comprises a bulk waveguide layer or a multiple quantum well waveguide layer. This means that it is possible to control the wavelength composition of the waveguide layer by controlling the dielectric mask width.

It is also possible that the gap of the stripe like dielectric films remain constant over the passive and active regions.

Alternatively, it is also possible that the gap of the stripe like dielectric films varies on at least a part of the passive and active regions.

it is also possible that the selective semiconductor crystal growth is carried out by an organic metal chemical vapor deposition method.

FIRST EMBODIMENT

A first embodiment according to the present invention will be described, wherein an optical integrated circuit device with an improved waveguide layer is provided.

Figure 6:
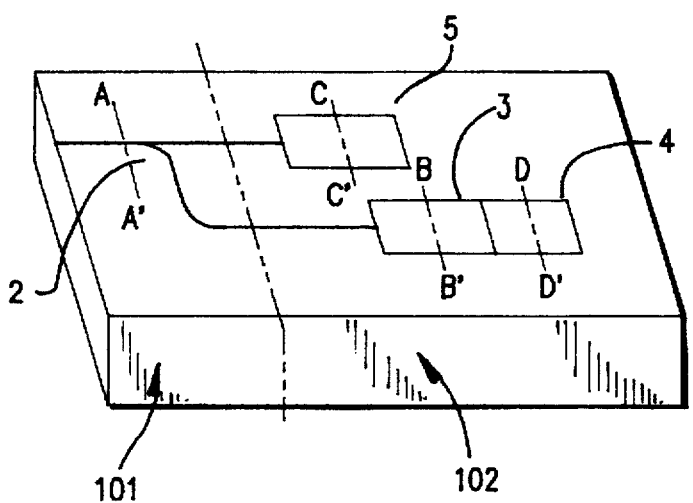
FIG. 6 is a perspective view illustrative of an optical integrated circuit device with an improved waveguide layer in the first embodiment according to the present invention.

FIG. 6 is a perspective view illustrative of an optical integrated circuit device with an improved waveguide layer in the first embodiment according to the present invention. The optical integrated circuit device comprises a passive region 101 and an active region 102. In the passive region 101, a Y-branch is provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 are integrated. The 1.30 μm transmitter laser diode 3 and the 1.30 μm receiver photo-diode 5 are coupled in parallel to the Y-branch 2. The 1.30 μm monitor photo-diode 4 is positioned adjacent to a rear side of the 1.30 μm transmitter laser diode 3 for monitoring the 1.30 μm transmitter laser diode 3. This optical integrated circuit device is adopted for transmitting and receiving 1.30 μm wavelength band signals, namely adopted for bi-directional communications of the 1.30 μm wavelength band signals.

Figures 7A, 7B:
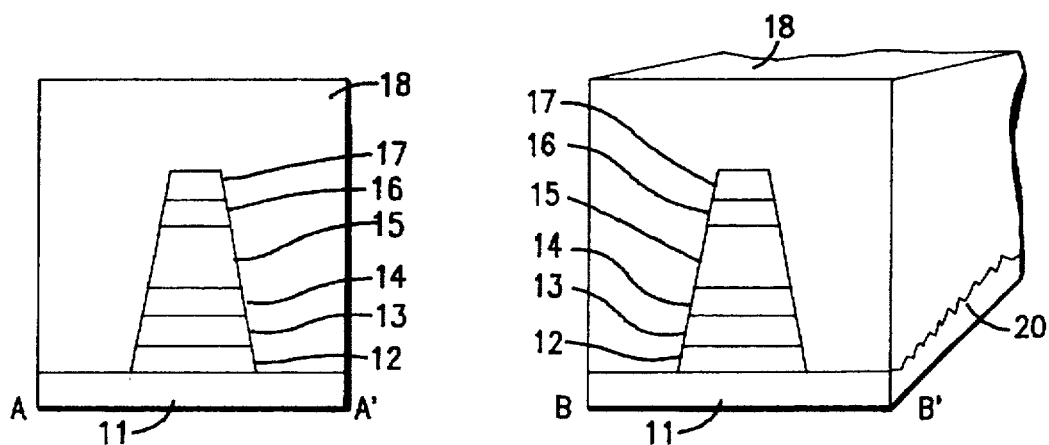
FIG. 7A is a fragmentary cross sectional elevation view illustrative of an internal layered structure of the Y-branch in the optical integrated circuit device with an improved waveguide layer, along an A—A' line in FIG. 6 in the first embodiment according to the present invention.
FIG. 7B is a fragmentary cross sectional elevation view illustrative of an internal layered structure of the 1.30 µm transmitter laser diode 3 in the optical integrated circuit device with an improved waveguide layer, along an B—B' line in FIG. 6 in the first embodiment according to the present invention.

FIG. 7A is a fragmentary cross sectional elevation view illustrative of an internal layered structure of the Y-branch in the optical integrated circuit device with an improved waveguide layer, along an A-A' line in FIG. 6 in the first embodiment according to the present invention.

The Y-branch has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 transparent and propagation to 1.30 μm wavelength band light is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 7B is a fragmentary cross sectional elevation view illustrative of an internal layered structure of the 1.30 μm transmitter laser diode 3 in the optical integrated circuit device with an improved waveguide layer, along an B-B' line in FIG. 6 in the first embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 7C:
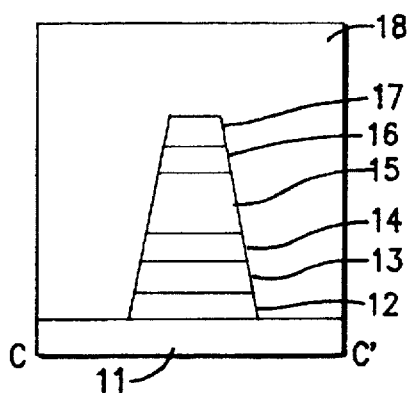
FIG. 7C is a fragmentary cross sectional elevation view illustrative of an internal layered structure of the 1.30 µm receiver photo-diode 5 in the optical integrated circuit device with an improved waveguide layer, along an C—C' line in FIG. 6 in the first embodiment according to the present invention.

FIG. 7C is a fragmentary cross sectional elevation view illustrative of an internal layered structure of the 1.30 μm receiver photo-diode 5 in the optical integrated circuit device with an improved waveguide layer, along an C-C' line in FIG. 6 in the first embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 7D:
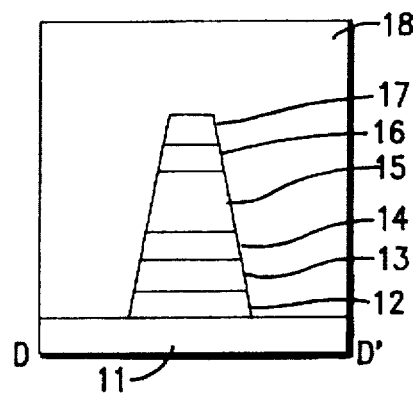
FIG. 7D is a fragmentary cross sectional elevation view illustrative of an internal layered structure of the 1.30 µm monitor photo-diode 4 in the optical integrated circuit device with an improved waveguide layer, along an D—D' line in FIG. 6 in the first embodiment according to the present invention.

FIG. 7D is a fragmentary cross sectional elevation view illustrative of an internal layered structure of the 1.30 μm monitor photo-diode 4 in the optical integrated circuit device with an improved waveguide layer, along an D-D' line in FIG. 6 in the first embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 15.

Fabrication processes of the above optical integrated circuit device will be described as follows.

FIGS. 8A through 8D are perspective views illustrative of sequential fabrication processes of the optical integrated circuit device with the improved waveguide layer in the first embodiment according to the present invention.

Figures 8A, 8B:
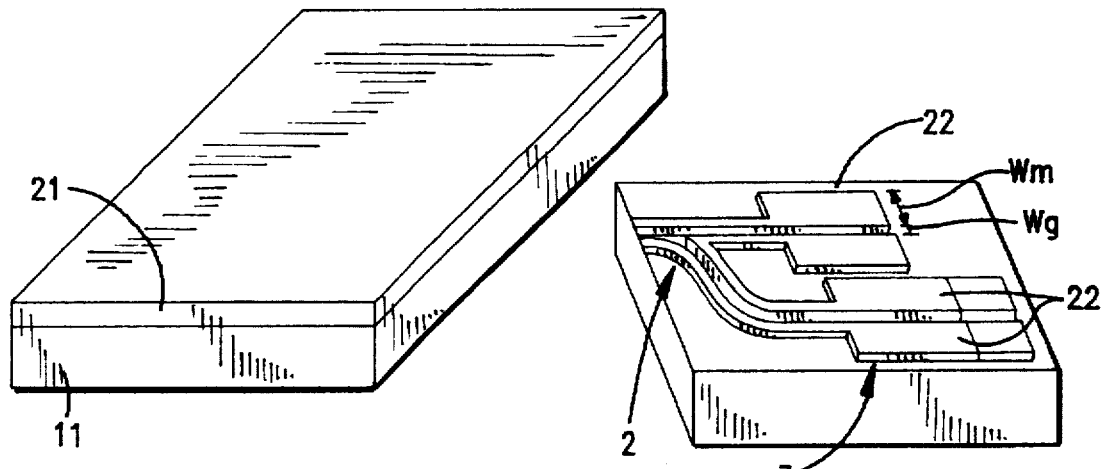
FIGS. 8A through 8D are perspective views illustrative of sequential fabrication processes of the optical integrated circuit device with the improved waveguide layer in the first embodiment according to the present invention.

With reference to FIG. 8A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

With reference to FIG. 8B, by use of the normal photo-lithography, the $SiO_2$ film 21 is selectively removed to form a pair of stripe $SiO_2$ masks 22. For the Y-branch 2 in the passive region 101, the width Wm of the mask is 6 μm. For the 1.30 μm transmitter laser diode 3, the 1.30 μm monitor photo-diode 4 and the 1.30 μm receiver photo-diode 5 in the active region 102, the width Wm of the mask is 12 μm. The gap of the masks 22 remains constant at 1.5 μm over the passive and active regions 101 and 102. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm.

Figure 8C:
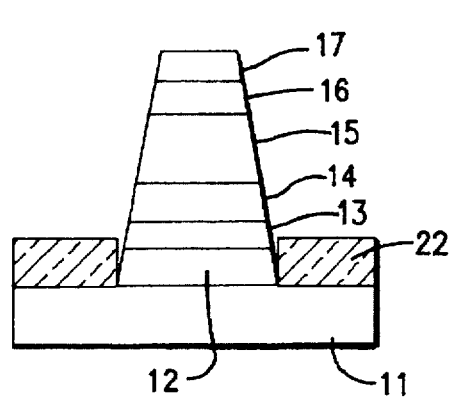

With reference to FIG. 8C, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm. In the regions of the wide mask width Wm of 12 μm, then-InGaAsP layer 12 has a wavelength composition of 1.15 μm and a thickness of 1000 angstroms. The n-InP spacer layer 13 has a thickness of 1000 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the Y-branch 2, the multiple quantum well waveguide layer 15 has a wavelength composition of 1.25 μm. Of the 1.30 μm transmitter laser diode 3, the 1.30 μm monitor photo-diode 4, the 1.30 μm receiver photo-diode 5, the multiple quantum well waveguide layer 15 has a wavelength composition of 1.30 μm.

Figure 8D:
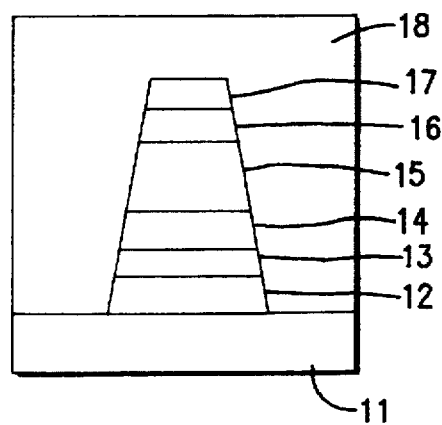

With reference to FIG. 8D, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 for evaporation of contact metal and subsequent polishing of the reverse side to evaporate the contact metal whereby the device is completed.

The above optical integrated circuit device has been adopted for the bi-directional communications and suitable for minimization of the scale thereof, the reasons of which are as follows.

As described above, the 1.30 μm transmitter laser diode 3 and the 1.30 μm receiver photo-diode 5 are coupled in parallel to the Y-branch 2 for half duplex bi-directional communications. Since no wavelength division multiplexing coupler is provided, the scaling down of the device is facilitated. This results in a considerable reduction in manufacturing cost of the device.

Further, the above ridged structure is grown by the single crystal growth using a single pair of the dielectric masks 22. This allows the individual semiconductor layers, particularly, the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

As modifications of the active elements, it is possible to change the wavelength bands of the laser diode and the photo diodes. For example, a combination of the 1.55 μm transmitter laser diode and the 1.30 μm receiver photo-diode is available. Further, other combination of the 1.30 μm transmitter laser diode and the 1.55 μm receiver photo-diode is also available. Moreover, the other combination of the 1.55 μm transmitter laser diode and the 1.55 μm receiver photo-diode is also available.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

Figure 9:
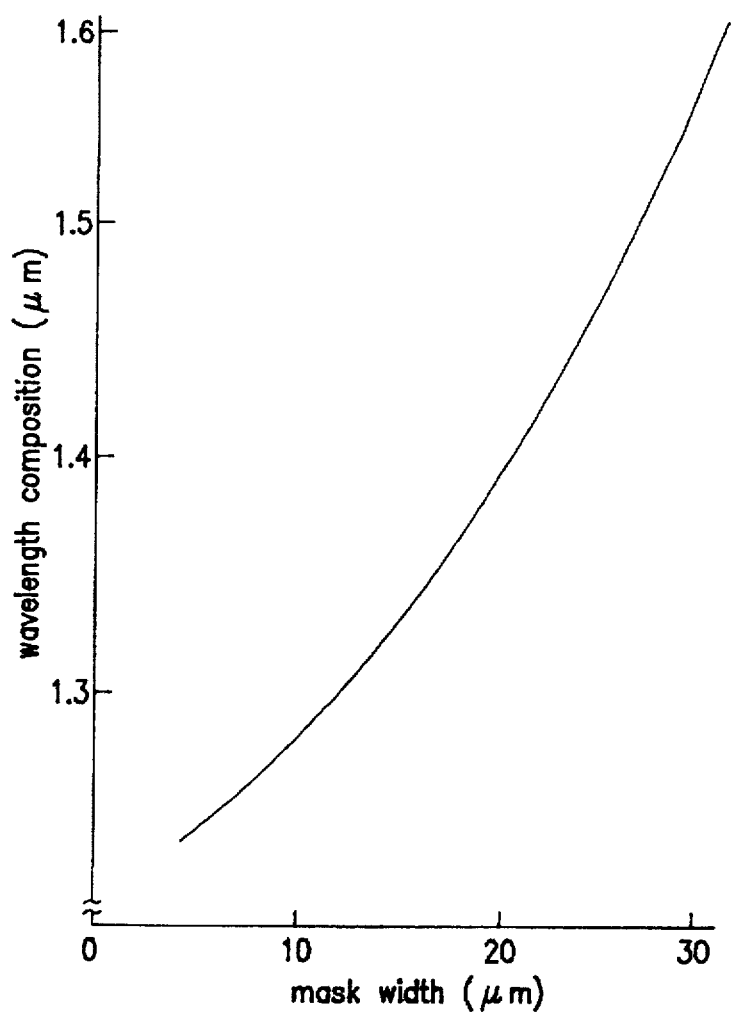
FIG. 9 is a diagram illustrative of wavelength composition of the semiconductor layer versus the dielectric mask width used for the metal organic chemical vapor deposition.

FIG. 9 is a diagram illustrative of wavelength composition of the semiconductor layer versus the dielectric mask width used for the metal organic chemical vapor deposition. As will be appreciated from FIG. 9, it is easy to control the wavelength composition of the waveguide layer by controlling the width of the dielectric masks.

SECOND EMBODIMENT

A second embodiment according to the present invention will be described, wherein an optical integrated circuit device with an improved waveguide layer is provided.

Figure 10:
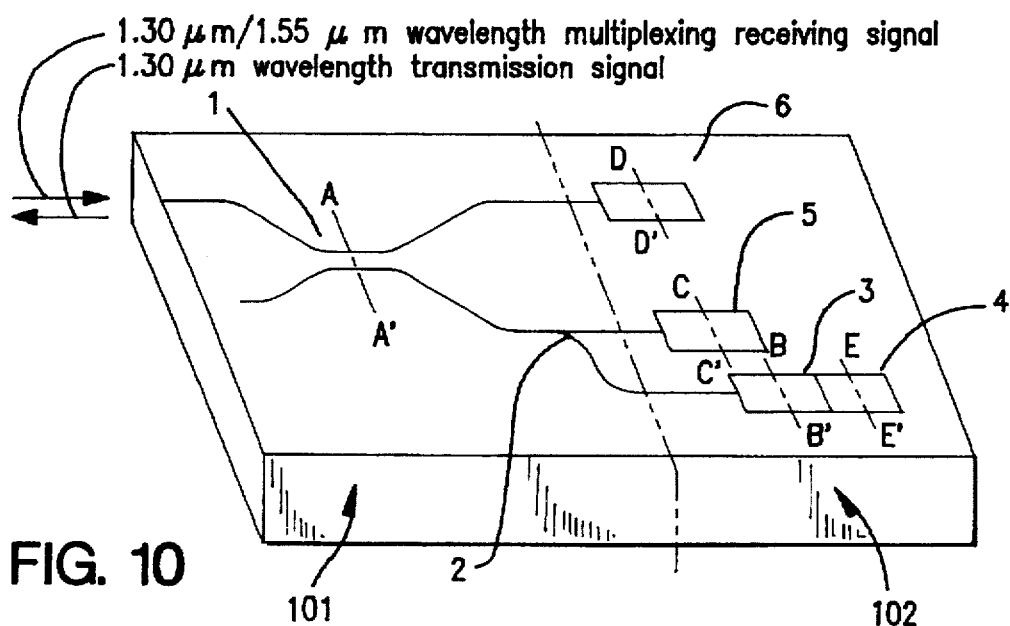
FIG. 10 is a perspective view illustrative of an optical integrated circuit device with an improved waveguide layer in the second embodiment according to the present invention.

FIG. 10 is a perspective view illustrative of an optical integrated circuit device with an improved waveguide layer in the second embodiment according to the present invention. The optical integrated circuit device comprises a passive region 101 and an active region 102. In the passive region 101, a wavelength division multiplexing directional coupler 1 and a Y-branch 2 coupled to said wavelength division multiplexing directional coupler 1 are provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 in addition a 1.55 μm receiver photo-diode 6 are integrated. The 1.30 μm transmitter laser diode 3 and the 1.30 μm receiver photo-diode 5 are coupled in parallel to the Y-branch 2. The 1.55 μm receiver photo-diode 6 and the Y-branch 2 are coupled in parallel to the wavelength division multiplexing directional coupler 1. The 1.30 μm monitor photo-diode 4 is positioned adjacent to a rear side of the 1.30 μm transmitter laser diode 3 for monitoring the 1.30 μm transmitter laser diode 3. This optical integrated circuit device is adopted for transmitting 1.30 μm wavelength band signals and receiving 1.30 μm and 1.55 μm multiple wavelength band signals.

Figure 11A:
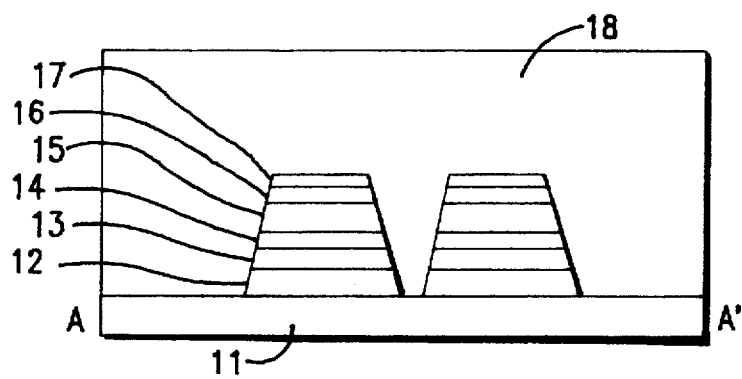
FIG. 11A is a fragmentary cross sectional elevation view illustrative of an internal layered structure of the wavelength division multiplexing directional coupler in the optical integrated circuit device with an improved waveguide layer, along an A—A' line in FIG. 10 in the second embodiment according to the present invention.

FIG. 11A is a fragmentary cross sectional elevation view illustrative of an internal layered structure of the wavelength division multiplexing directional coupler in the optical integrated circuit device with an improved waveguide layer, along an A–A' line in FIG. 10 in the second embodiment according to the present invention.

The wavelength division multiplexing directional coupler has separate two ridged structures of laminations of semiconductor layers. The ridged structures are formed on an n-InP substrate 11. The ridged structures are buried in an InP burying layer 18 formed over the n-InP substrate 11. Each of the ridged structures comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

Figure 11B:
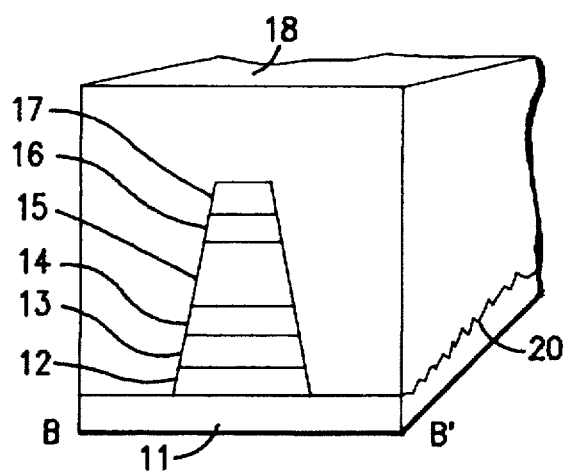
FIG. 11B is a fragmentary cross sectional elevation view illustrative of an internal layered structure of the 1.30 µm transmitter laser diode 3 in the optical integrated circuit device with an improved waveguide layer, along an B—B' line in FIG. 10 in the second embodiment according to the present invention.

FIG. 11B is a fragmentary cross sectional elevation view illustrative of an internal layered structure of the 1.30 μm transmitter laser diode 3 in the optical integrated circuit device with an improved waveguide layer, along an B–B' line in FIG. 10 in the second embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 11C:
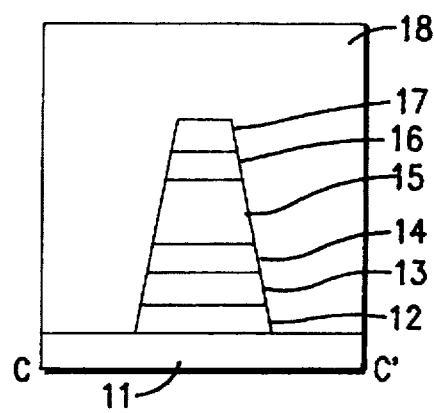
FIG. 11C is a fragmentary cross sectional elevation view illustrative of an internal layered structure of the 1.30 µm receiver photo-diode 5 in the optical integrated circuit device with an improved waveguide layer, along an C—C' line in FIG. 10 in the second embodiment according to the present invention.

FIG. 11C is a fragmentary cross sectional elevation view illustrative of an internal layered structure of the 1.30 μm receiver photo-diode 5 in the optical integrated circuit device with an improved waveguide layer, along an C–C' line in FIG. 10 in the second embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 11D:
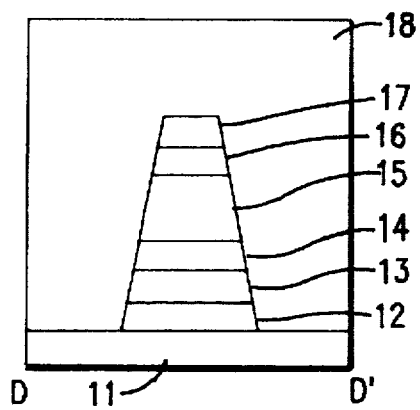
FIG. 11D is a fragmentary cross sectional elevation view illustrative of an internal layered structure of the 1.30 µm monitor photo-diode 4 in the optical integrated circuit device with an improved waveguide layer, along an D—D' line in FIG. 10 in the second embodiment according to the present invention.

FIG. 11D is a fragmentary cross sectional elevation view illustrative of an internal layered structure of the 1.30 μm monitor photo-diode 4 in the optical integrated circuit device with an improved waveguide layer, along an D–D' line in FIG. 10 in the second embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 11E:
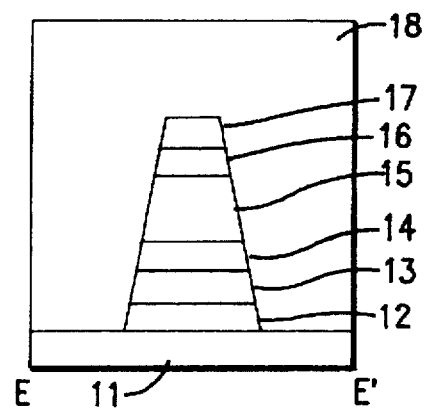
FIG. 11E is a fragmentary cross sectional elevation view illustrative of an internal layered structure of the 1.55 µm receiver photo-diode 6 in the optical integrated circuit device with an improved waveguide layer, along an E—E' line in FIG. 10 in the second embodiment according to the present invention.

FIG. 11E is a fragmentary cross sectional elevation view illustrative of an internal layered structure of the 1.55 μm receiver photo-diode 6 in the optical integrated circuit device with an improved waveguide layer, along an E–E' line in FIG. 10 in the second embodiment according to the present invention.

The 1.55 μm receiver photo-diode 6 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 12A through 12D are perspective views illustrative of sequential fabrication processes of the optical integrated circuit device with the improved waveguide layer in the second embodiment according to the present invention.

Figure 12A:
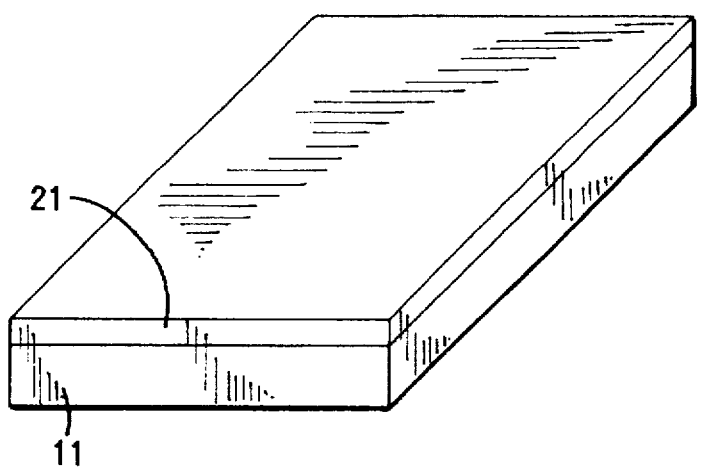
FIGS. 12A through 12D are perspective views illustrative of sequential fabrication processes of the optical integrated circuit device with the improved waveguide layer in the second embodiment according to the present invention.

With reference to FIG. 12A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

Figure 12B:
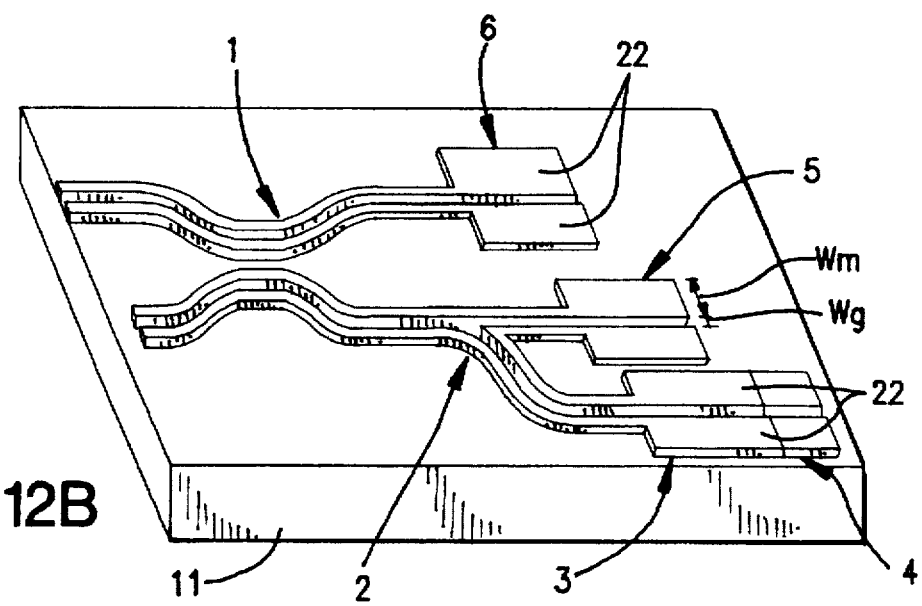

With reference to FIG. 12B, by use of the normal photolithography, the $SiO_2$ film 21 is selectively removed to form a pair of strip $SiO_2$ masks 22. For the wavelength division multiplexing coupler 1 and the Y-branch 2 in the passive region 101, the width Wm of the mask is 6 μm. For the 1.30 μm transmitter laser diode 3, the 1.30 μm monitor photo-diode 4 and the 1.30 μm receiver photo-diode 5 in the active region 102, the width Wm of the mask is 12 μm. For the 1.55 μm receiver photo-diode 6 in the active region 102, the width Wm of the mask is 30 μm. The gap of the masks 22 remains constant at 1.5 μm over the passive and active regions 101 and 102. For the wavelength division multiplexing coupler 1, the length of the masks 22 is 1000 μm. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm. For the 1.55 μm receiver photo-diode 6, the length of the masks 22 is 50 μm.

Figure 12C:
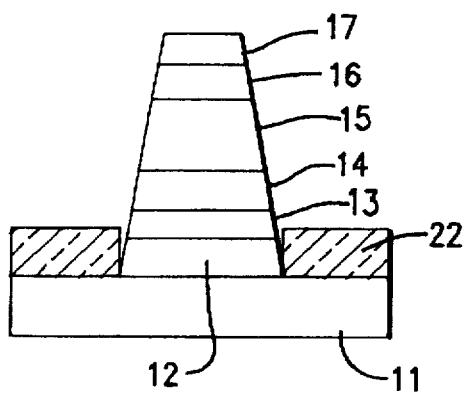

With reference to FIG. 12C, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the wavelength division multiplexing coupler 1, the multiple quantum well waveguide layer 15 has a wavelength composition of 1.25 μm. Of the Y-branch 2, the multiple quantum well waveguide layer 15 has a wavelength composition of 1.25 μm. Of the 1.30 μm transmitter laser diode 3, the 1.30 μm monitor photo-diode 4, the 1.30 μm receiver photo-diode 5, the multiple quantum well waveguide layer 15 has a wavelength composition of 1.30 μm. Of the 1.55 μm receiver photo-diode 6, the multiple quantum well waveguide layer 15 has a wavelength composition of 1.60 μm.

Figure 12D:
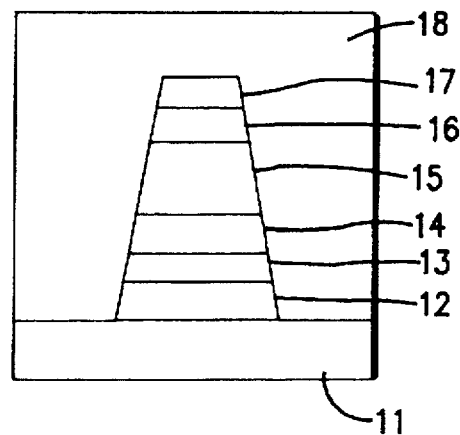

With reference to FIG. 12D, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 and the 1.55 μm receiver photo-diode 6 for evaporation of contact metal and subsequent polishing of the reverse side to evaporate the contact metal whereby the device is completed.

The above optical integrated circuit device has been adopted for the multiple media communications and the bi-directional communications and further suitable for minimization of the scale thereof, the reasons of which are as follows.

As described above, the 1.30 μm receiver photo-diode 5, the 1.55 μm receiver photo-diode 6 and the wavelength division multiplexing coupler 1 are integrated. Even if character information of 1.30 μm wavelength band signals and image information of 1.55 μm wavelength band signals are transmitted on a single channel or the multiplexed 1.30 μm and 1.55 μm wavelength band signals are transmitted, the wavelength division multiplexing coupler 1 divides the multiplexed 1.30 μm and 1.55 μm wavelength band signals into individual 1.30 μm and 1.55 μm wavelength band signals so that the 1.30 μm receiver photo-diode 5 and the 1.55 μm receiver photo-diode 6 receive the divided 1.30 μm and 1.55 μm wavelength band signals respectively without interference between them. Since the above wavelength division multiplexing coupler 1 is a directional coupler, the length thereof is about one third of the Mach-Zehnder type wavelength division multiplexing coupler. This allows a scaling down of the optical integrated circuit device.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent from the polarization. The optical confinement force is uniform between in the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

THIRD EMBODIMENT

A third embodiment according to the present invention will be described, wherein an optical integrated circuit device with an improved waveguide layer is provided.

Figure 13:
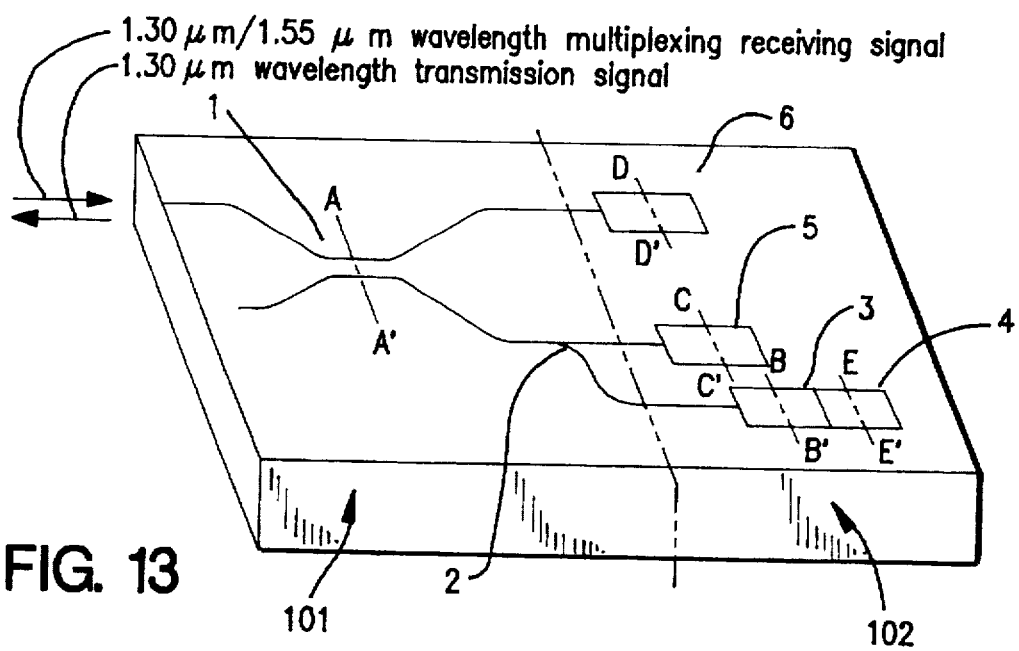
FIG. 13 is a perspective view illustrative of an optical integrated circuit device with an improved waveguide layer in the third embodiment according to the present invention.

FIG. 13 is a perspective view illustrative of an optical integrated circuit device with an improved waveguide layer in the third embodiment according to the present invention. The optical integrated circuit device comprises a passive region 101 and an active region 102. In the passive region 101, a wavelength division multiplexing directional coupler 1 and a Y-branch 2 coupled to said wavelength division multiplexing directional coupler 1 are provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 in addition a 1.55 μm receiver photo-diode 6 are integrated. The 1.30 μm transmitter laser diode 3 and the 1.30 μm receiver photo-diode 5 are coupled in parallel to the Y-branch 2. The 1.55 μm receiver photo-diode 6 and the Y-branch 2 are coupled in parallel to the wavelength division multiplexing directional coupler 1. The 1.30 μm monitor photo-diode 4 is positioned adjacent to a rear side of the 1.30 μm transmitter laser diode 3 for monitoring the 1.30 μm transmitter laser diode 3. This optical integrated circuit device is adopted for transmitting 1.30 μm wavelength band signals and receiving 1.30 μm and 1.55 μm multiple wavelength band signals.

Figure 14A:
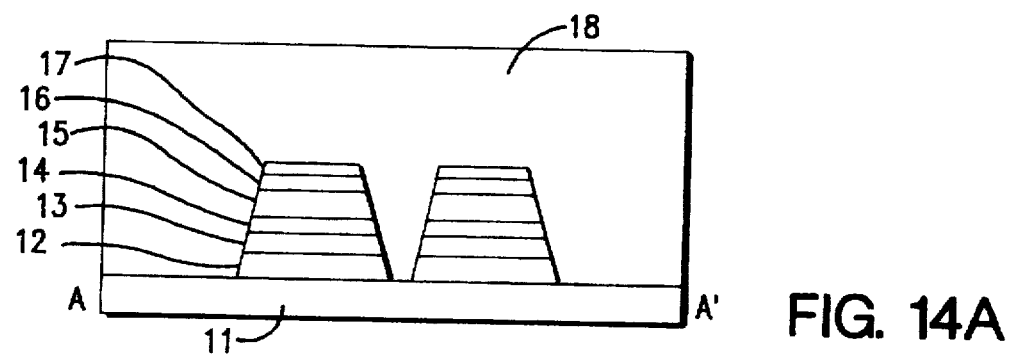
FIG. 14A is a fragmentary cross sectional elevation view illustrative of an internal layered structure of the wavelength division multiplexing directional coupler in the optical integrated circuit device with an improved waveguide layer, along an A—A' line in FIG. 13 in the third embodiment according to the present invention.

FIG. 14A is a fragmentary cross sectional elevation view illustrative of an internal layered structure of the wavelength division multiplexing directional coupler in the optical integrated circuit device with an improved waveguide layer, along an A–A' line in FIG. 13 in the third embodiment according to the present invention.

The wavelength division multiplexing directional coupler has separate two ridged structures of laminations of semiconductor layers. The ridged structures are formed on an n-InP substrate 11. The ridged structures are buried in an InP burying layer 18 formed over the n-InP substrate 11. Each of the ridged structures comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A stop separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

Figures 14B, 14C:
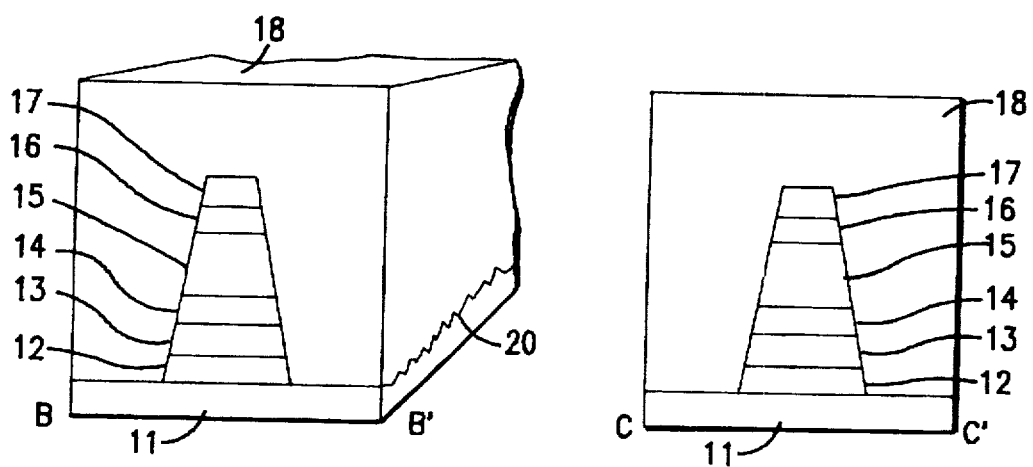
FIG. 14B is a fragmentary cross sectional elevation view illustrative of an internal layered structure of the 1.30 µm transmitter laser diode 3 in the optical integrated circuit device with an improved waveguide layer, along an B—B' line in FIG. 13 in the third embodiment according to the present invention.
FIG. 14C is a fragmentary cross sectional elevation view illustrative of an internal layered structure of the 1.30 µm receiver photo-diode 5 in the optical integrated circuit device with an improved waveguide layer, along an C—C' line in FIG. 13 in the third embodiment according to the present invention.

FIG. 14B is a fragmentary cross sectional elevation view illustrative of an internal layered structure of the 1.30 μm transmitter laser diode 3 in the optical integrated circuit device with an improved waveguide layer, along an B–B' line in FIG. 13 in the third embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 14C is a fragmentary cross sectional elevation view illustrative of an internal layered structure of the 1.30 μm receiver photo-diode 5 in the optical integrated circuit device with an improved waveguide layer, along an C–C' line in FIG. 13 in the third embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 14D:
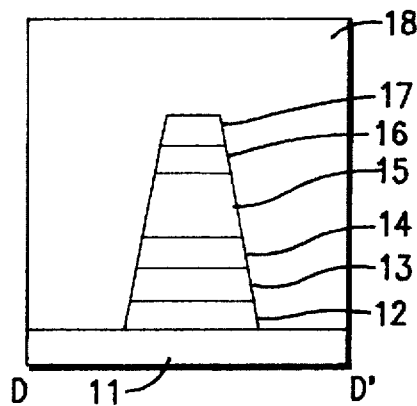
FIG. 14D is a fragmentary cross sectional elevation view illustrative of an internal layered structure of the 1.30 µm monitor photo-diode 4 in the optical integrated circuit device with an improved waveguide layer, along an D—D' line in FIG. 13 in the third embodiment according to the present invention.

FIG. 14D is a fragmentary cross sectional elevation view illustrative of an internal layered structure of the 1.30 μm monitor photo-diode 4 in the optical integrated circuit device with an improved waveguide layer, along an D–D' line in FIG. 13 in the third embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Figure 14E:
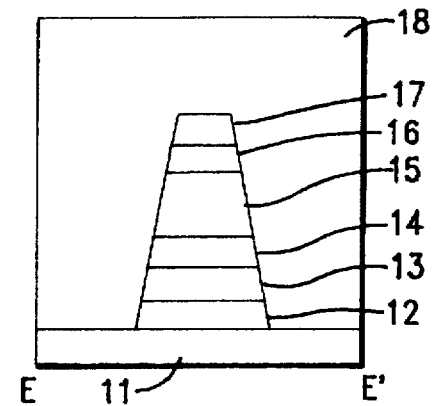
FIG. 14E is a fragmentary cross sectional elevation view illustrative of an internal layered structure of the 1.55 µm receiver photo-diode 6 in the optical integrated circuit device with an improved waveguide layer, along an E—E' line in FIG. 13 in the third embodiment according to the present invention.

FIG. 14E is a fragmentary cross sectional elevation view illustrative of an internal layered structure of the 1.55 μm receiver photo-diode 6 in the optical integrated circuit device with an improved waveguide layer, along an E–E' line in FIG. 13 in the third embodiment according to the present invention.

The 1.55 μm receiver photo-diode 6 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 15A through 15D are perspective views illustrative of sequential fabrication processes of the optical integrated circuit device with the improved waveguide layer in the third embodiment according to the present invention.

Figure 15A:
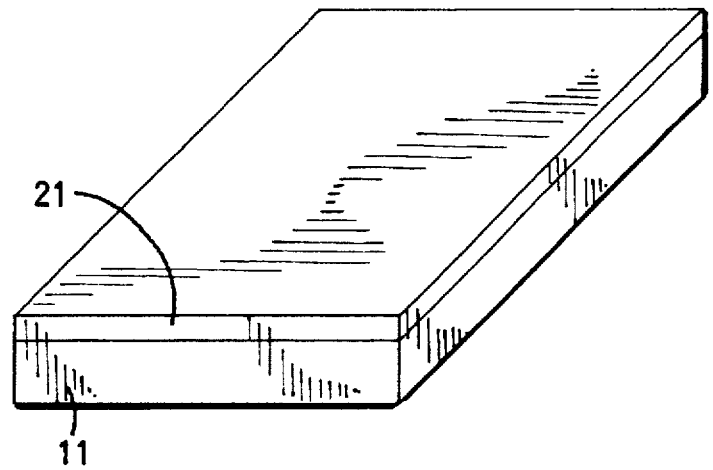
FIGS. 15A through 15D are perspective views illustrative of sequential fabrication processes of the optical integrated circuit device with the improved waveguide layer in the third embodiment according to the present invention.

With reference to FIG. 15A, a grating 20 is selectively formed on a predetermined region within the active region of the n-InP substrate 11 by an interference exposure or an electron beam exposure. An SiO$_2$ film 21 as a dielectric film having a thickness of 1000 angstroms is deposited on an entire surface of the n-InP substrate 11 by a thermal chemical vapor deposition method.

Figure 15B:
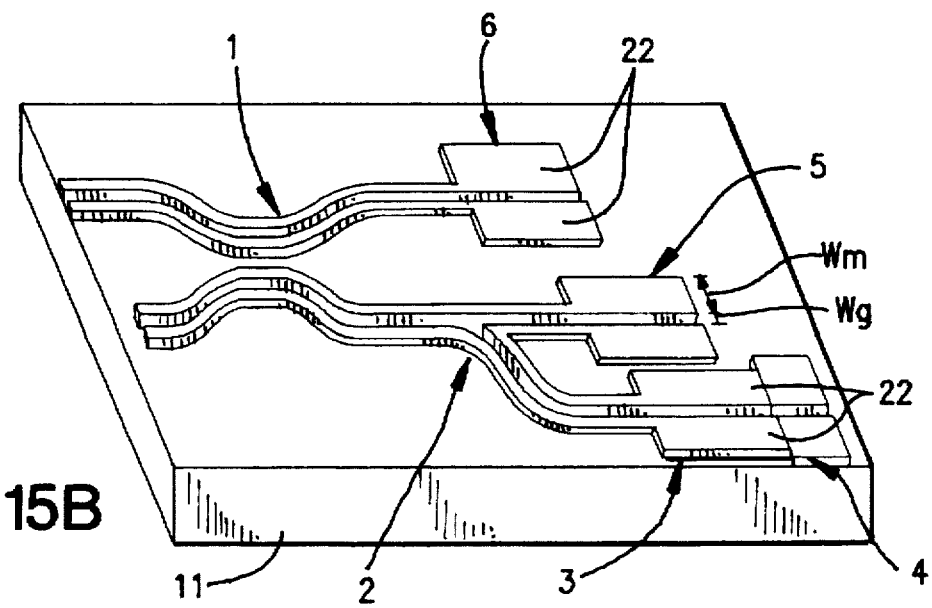

With reference to FIG. 15B, by use of the normal photolithography, the SiO$_2$ film 21 is selectively removed to form a pair of stripe SiO$_2$ masks 22. For the wavelength division multiplexing coupler 1 and the Y-branch 2 in the passive region 10, the width Wm of the mask is 6 μm. For the 1.30 μm transmitter laser diode 3, the width Wm of the mask is 12 μm. For the 1.30 μm monitor photo-diode 4 and the 1.30 μm receiver photo-diode 5 in the active region 102, the width Wm of the mask is 16 μm. For the 1.55 μm receiver photo-diode 6 in the active region 102, the width Wm of the mask is 30 μm. The gap of the masks 22 remains constant at 1.5 μm over the passive and active regions 101 and 102. For the wavelength division multiplexing coupler 1, the length of the masks 22 is 1000 μm. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm. For the 1.55 μm receiver photo-diode 6, the length of the masks 22 is 50 μm.

Figure 15C:
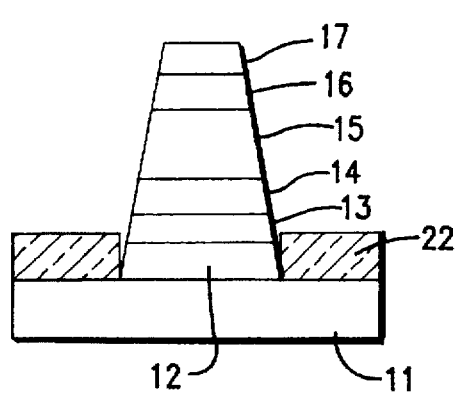

With reference to FIG. 15C, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the wavelength division multiplexing coupler 1, the multiple quantum well waveguide layer 15 has a wavelength composition of 1.25 μm. Of the Y-branch 2, the multiple quantum well waveguide layer 15 has a wavelength composition of 1.25 μm. Of the 1.30 μm transmitter laser diode 3, the multiple quantum well waveguide layer 15 has a wavelength composition of 1.30 μm. Of the 1.30 μm monitor photo-diode 4 and the 1.30 μm receiver photo-diode 5, the multiple quantum well waveguide layer 15 has a wavelength composition of 1.35 μm. Of the 1.55 μm receiver photo-diode 6, the multiple quantum well waveguide layer 15 has a wavelength composition of 1.60 μm.

Figure 15D:
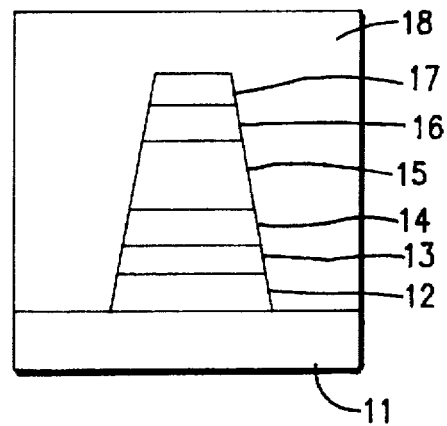

With reference to FIG. 15D, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 and the 1.55 μm receiver photo-diode 6 for evaporation of contact metal and subsequent polishing of the reverse side to evaporate the contact metal whereby the device is completed.

The above optical integrated circuit device has been adopted for the multiple media communications and the bi-directional communications and further suitable for minimization of the scale thereof in addition the sensitivity for receiving the light is also improved, the reasons of which are as follows.

As described above, of the 1.30 μm monitor photo-diode 4 and the 1.30 μm receiver photo-diode 5, the multiple quantum well waveguide layer 15 has a wavelength composition of 1.35 μm which is longer by 0.05 μm than the receiving optical signals of 1.30 μm wavelength band. This wavelength composition of 1.35 μm improves the absorption of the optical signals of 1.30 μm wavelength band rather than the wavelength composition of 1.30 μm. The efficiency of receipt of the optical signals of 1.30 μm wavelength band is improved. The monitoring ability is also improved.

In addition, the 1.30 μm receiver photo-diode 5, the 1.55 μm receiver photo-diode 6 and the wavelength division multiplexing coupler 1 are integrated. Even if character information of 1.30 μm wavelength band signals and image information of 1.55 μm wavelength band signals are transmitted on a single channel or the multiplexed 1.30 μm and 1.55 μm wavelength band signals are transmitted, the wavelength division multiplexing coupler 1 divides the multiplexed 1.30 μm and 1.55 μm wavelength band signals into individual 1.30 μm and 1.55 μm wavelength band signals so that the 1.30 μm receiver photo-diode 5 and the 1.55 μm receiver photo-diode 6 receive the divided 1.30 μm and 1.55 μm wavelength band signals respectively without interference between them. Since the above wavelength division multiplexing coupler 1 is a directional coupler, the length thereof is about one third of the Mach-Zehnder type wavelength division multiplexing coupler. This allows a scaling down of the optical integrated circuit device.

Further more, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent from the polarization. The optical confinement force is uniform between in the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

FOURTH EMBODIMENT

A fourth embodiment according to the present invention will be described, wherein an optical integrated circuit device with an improved waveguide layer is provided.

FIG. 16 is a perspective view illustrative of an optical integrated circuit device with an improved waveguide layer in the fourth embodiment according to the present invention. The optical integrated circuit device comprises a passive region 101 and an active region 102. In the passive region 101, a wavelength division multiplexing directional coupler 1 and a Y-branch 2 coupled to said wavelength division multiplexing directional coupler 1 are provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 in addition a 1.55 μm receiver photo-diode 6 are integrated.

The 1.30 μm transmitter laser diode 3 and the 1.30 μm receiver photo-diode 5 are coupled in parallel to the Y-branch 2. The 1.55 μm receiver photo-diode 6 and the Y-branch 2 are coupled in parallel to the wavelength division multiplexing directional coupler 1. The 1.30 μm monitor photo-diode 4 is positioned adjacent to a rear side of the 1.30 μm transmitter laser diode 3 for monitoring the 1.30 μm transmitter laser diode 3. A spot size converter 7 is further provided at a facet coupled to an optical fiber not illustrated. The spot size converter 7 facilitates coupling between the wavelength division multiplexing directional coupler 1 and the optical fiber. This optical integrated circuit device is adopted for transmitting 1.30 μm wavelength band signals and receiving 1.30 μm and 1.55 μm multiple wavelength band signals.

Figure 17A:
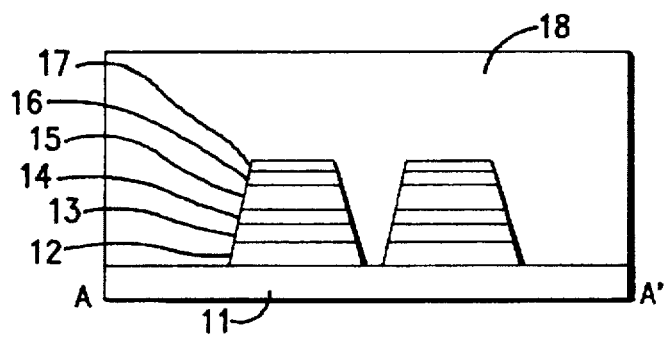
FIG. 17A is a fragmentary cross sectional elevation view illustrative of an internal layered structure of the wavelength division multiplexing directional coupler in the optical integrated circuit device with an improved waveguide layer, along an A—A' line in FIG. 16 in the fourth embodiment according to the present invention.

FIG. 17A is a fragmentary cross sectional elevation view illustrative of an internal layered structure of the wavelength division multiplexing directional coupler in the optical integrated circuit device with an improved waveguide layer, along an A–a' line in FIG. 16 in the fourth embodiment according to the present invention.

The wavelength division multiplexing directional coupler has separate two ridged structures of laminations of semiconductor layers. The ridged structures are formed on an n-InP substrate 11. The ridged structures are buried in an InP burying layer 18 formed over the n-InP substrate 11. Each of the ridged structures comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 17B is a fragmentary cross sectional elevation view illustrative of an internal layered structure of the 1.30 μm transmitter laser diode 3 in the optical integrated circuit device with an improved waveguide layer, along an B–B' line in FIG. 16 in the fourth embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on then-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 17C is a fragmentary cross sectional elevation view illustrative of an internal layered structure of the 1.30 μm receiver photo-diode 5 in the optical integrated circuit device with an improved waveguide layer, along an C–C' line in FIG. 16 in the fourth embodiment according to the present invention.

The 1.30 μm receiver photo-diode 5 has the ridged structure of laminations of semiconductor layers. The ridged structure is formed of an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 17D is a fragmentary cross sectional elevation view illustrative of an internal layered structure of the 1.30 μm monitor photo-diode 4 in the optical integrated circuit device with an improved waveguide layer, along an D–D' line in FIG. 16 in the fourth embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 17E is a fragmentary cross sectional elevation view illustrative of an internal layered structure of the 1.55 μm receiver photo-diode 6 in the optical integrated circuit device with an improved waveguide layer, along an E–E' line in FIG. 16 in the fourth embodiment according to the present invention.

The 1.55 μm receiver photo-diode 6 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 17F is a fragmentary cross sectional elevation view illustrative of an internal layered structure of the spot size converter 7 in the optical integrated circuit device with an improved waveguide layer, along an F–F' line in FIG. 16 in the fourth embodiment according to the present invention.

The spot size converter 7 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 18A through 18E are perspective views illustrative of sequential fabrication processes of the optical integrated circuit device with the improved waveguide layer in the fourth embodiment according to the present invention.

With reference to FIG. 18A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

Figure 18B:
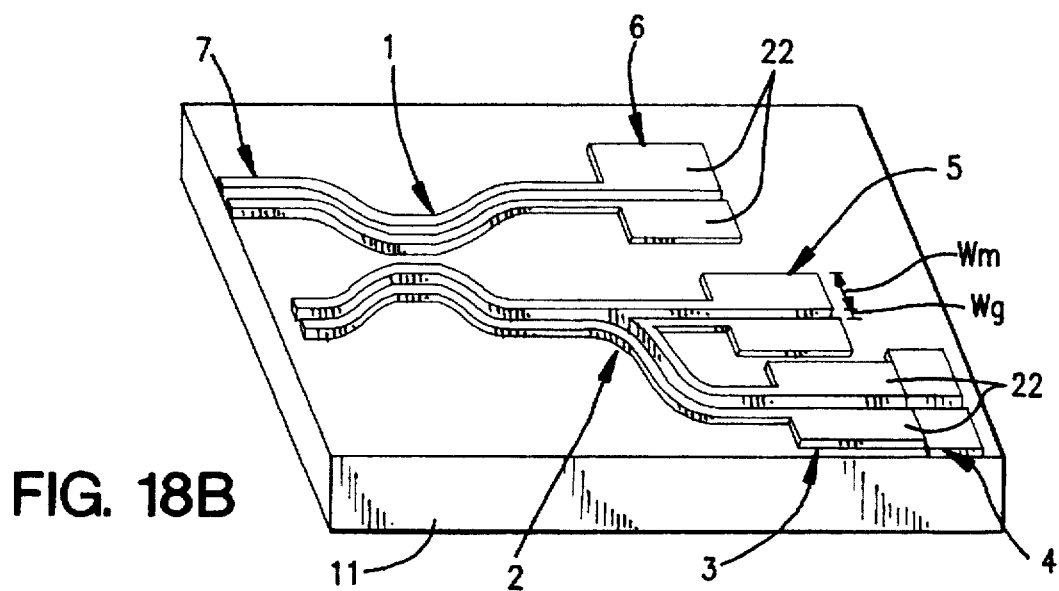

With reference to FIG. 18B, by use of the normal photolithography, the $SiO_2$ film 21 is selectively removed to form a pair of stripe $SiO_2$ masks 22. For the wavelength division multiplexing coupler 1 and the Y-branch 2 in the passive region 101, the width Wm of the mask is 6 μm. For the 1.30 μm transmitter laser diode 3, the 1.30 μm monitor photo-diode 4 and the 1.30 μm receiver photo-diode 5 in the active region 102, the width Wm of the mask is 12 μm. For the 1.55 μm receiver photo-diode 6 in the active region 102, the width Wm of the mask is 30 μm. The gap of the masks 22 remains constant at 1.5 μm over the passive and active regions 101 and 102. For the wavelength division multiplexing coupler 1, the length of the masks 22 is 1000 μm. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm. For the 1.55 μm receiver photo-diode 6, the length of the masks 22 is 50 μm.

Figure 18C:
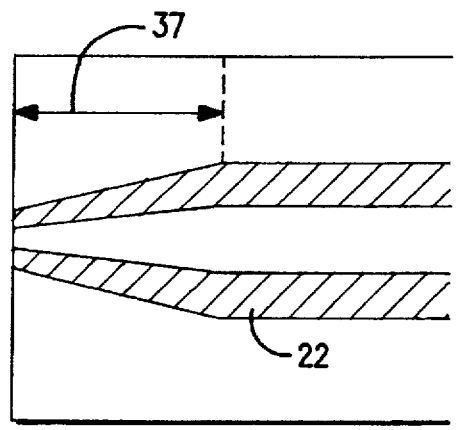

With reference to FIG. 18C, the above masks 22 has a tapered structure in a spot size converter region 37. The width of the masks 22 is reduced from 6 μm to 2 μm toward the facet or the edge of the substrate and the gap between them is also reduced from 1.5 μm to 0.5 μm toward the facet or the edge of the substrate. For the spot size converter region 37, the length of the masks 22 is 500 μm.

Figures 18D, 18E:
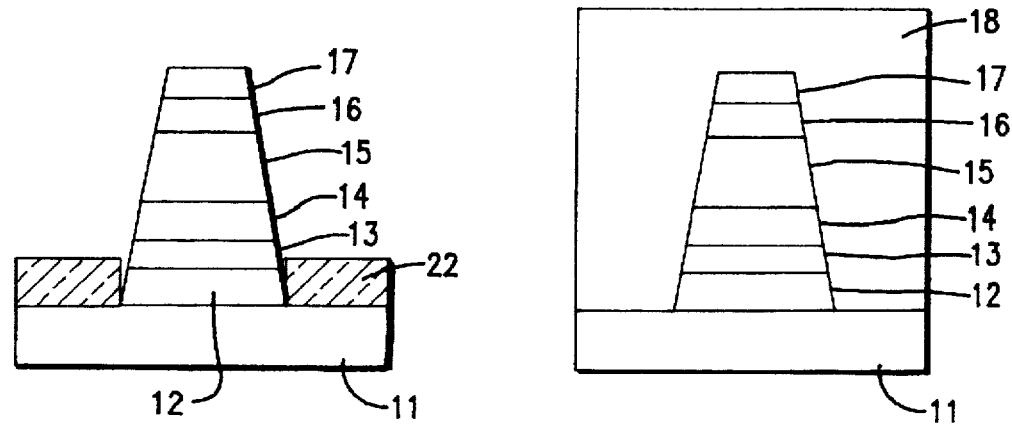

With reference to FIG. 18D, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the wavelength division multiplexing coupler 1, the multiple quantum well waveguide layer 15 has a wavelength composition of 1.25 μm. Of the Y-branch 2, the multiple quantum well waveguide layer 15 has a wavelength composition of 1.25 μm. Of the 1.30 μm transmitter laser diode 3, the 1.30 μm monitor photo-diode 4, the 1.30 μm receiver photo-diode 5, the multiple quantum well waveguide layer 15 has a wavelength composition of 1.30 μm. Of the 1.55 μm receiver photo-diode 6, the multiple quantum well waveguide layer 15 has a wavelength composition of 1.60 μm. Of the spot size converter 7, the well layers have thicknesses reduced toward the facet from 33 angstroms to 20 angstroms and also the barrier layers have thicknesses reduced toward the facet from 15 angstroms to 9 angstroms.

With reference to FIG. 18E, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 and the 1.55 μm receiver photo-diode 6 for evaporation of contact metal and subsequent polishing of the reverse side to evaporate the contact metal whereby the device is completed.

The above optical integrated circuit device has been adopted for coupling to the optical fiber as well as for the multiple media communications and the bi-directional communications and further suitable for minimization of the scale thereof, the reasons of which are as follows.

As described above, the spot size converter 7 improves the coupling efficiency between the optical integrated circuit and the optical fiber. Further, the 1.30 μm receiver photo-diode 5, the 1.55 μm receiver photo-diode 6 and the wavelength division multiplexing coupler 1 are integrated. Even if character information of 1.30 μm wavelength band signals and image information of 1.55 μm wavelength band signals are transmitted on a single channel or the multiplexed 1.30 μm and 1.55 μm wavelength band signals are transmitted, the wavelength division multiplexing coupler 1 divides the multiplexed 1.30 μm and 1.55 μm wavelength band signals into individual 1.30 μm and 1.55 μm wavelength band signals so that the 1.30 μm receiver photo-diode 5 and the 1.55 μm receiver photo-diode 6 receive the divided 1.30 μm and 1.55 μm wavelength band signals respectively without interference between them. Since the above wavelength division multiplexing coupler 1 is a directional coupler, the length thereof is about one third of the Mach-Zehnder type wavelength division multiplexing coupler. This allows a scaling down of the optical integrated circuit device.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent from the polarization. The optical confinement force is uniform between in the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

FIFTH EMBODIMENT

A fifth embodiment according to the present invention will be described, wherein an optical integrated circuit device with an improved waveguide layer is provided.

FIG. 19 is a perspective view illustrative of an optical integrated circuit device with an improved waveguide layer in the fifth embodiment according to the present invention. The optical integrated circuit device comprises a passive region 101 and an active region 102. In the passive region 101, a wavelength division multiplexing directional coupler 1 and a Y-branch 2 coupled to said wavelength division multiplexing directional coupler 1 are provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 in addition a 1.55 μm receiver photo-diode 6 are integrated. The 1.30 μm transmitter laser diode 3 and the 1.30 μm receiver photo-diode 5 are coupled in parallel to the Y-branch 2. The 1.55 μm receiver photo-diode 6 and the Y-branch 2 are coupled in parallel to the wavelength division multiplexing directional coupler 1. The 1.30 μm monitor photo-diode 4 is positioned adjacent to a rear side of the 1.30 μm transmitter laser diode 3 for monitoring the 1.30 μm transmitter laser diode 3. A window 8 is further provided at a facet coupled to an optical fiber not illustrated. The window 8 reduces a reflectivity at the facet into almost zero. This optical integrated circuit device is adopted for transmitting 1.30 μm wavelength band signals and receiving 1.30 μm and 1.55 μm multiple wavelength band signals.

FIG. 20A is a fragmentary cross sectional elevation view illustrative of an internal layered structure of the wavelength division multiplexing directional coupler in the optical integrated circuit device with an improved waveguide layer, along an A-A' line in FIG. 19 in the fifth embodiment according to the present invention.

The wavelength division multiplexing directional coupler has separate two ridged structures of laminations of semiconductor layers. The ridged structures are formed on an n-InP substrate 11. The ridged structures are buried in an InP burying layer 18 formed over the n-InP substrate 11. Each of the ridged structures comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 20B is a fragmentary cross sectional elevation view illustrative of an internal layered structure of the 1.30 μm transmitter laser diode 3 in the optical integrated circuit device with an improved waveguide layer, along an B-B' line in FIG. 19 in the fifth embodiment according to the present invention.

The 1.30 μm transmitter laser diode 3 has the ridged structure of laminations of semiconductor layers. The ridged structure is formed on an n-InP substrate 11. The ridged structure buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 20C is a fragmentary cross sectional elevation view illustrative of an internal layered structure of the 1.30 μm receiver photo-diode 5 in the optical integrated circuit device with an improved waveguide layer, along an C-C' line in FIG. 19 in the fifth embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 Lμm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 20D is a fragmentary cross sectional elevation view illustrative of an internal layered structure of the 1.30 μm monitor photo-diode 4 in the optical integrated circuit device with an improved waveguide layer, along an D-D' line in FIG. 19 in the fifth embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 20E is a fragmentary cross sectional elevation view illustrative of an internal layered structure of the 1.55 μm receiver photo-diode 6 in the optical integrated circuit device with an improved waveguide layer, along an E–E' line in FIG. 19 in the fifth embodiment according to the present invention.

The 1.55 μm receiver photo-diode 6 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 20F is a fragmentary cross sectional elevation view illustrative of an internal layered structure of the window 8 in the optical integrated circuit device with an improved waveguide layer, along an F–F line in FIG. 19 in the fifth embodiment according to the present invention.

The window 8 is formed on an n-InP substrate 11. Namely, the above ridged structure does not extend over this window region 8.

Fabrication processes of the above optical integrated circuit device will be described as follows.

FIGS. 21A through 21E are perspective views illustrative of sequential fabrication processes of the optical integrated circuit device with the improved waveguide layer in the fifth embodiment according to the present invention.

Figure 21A:
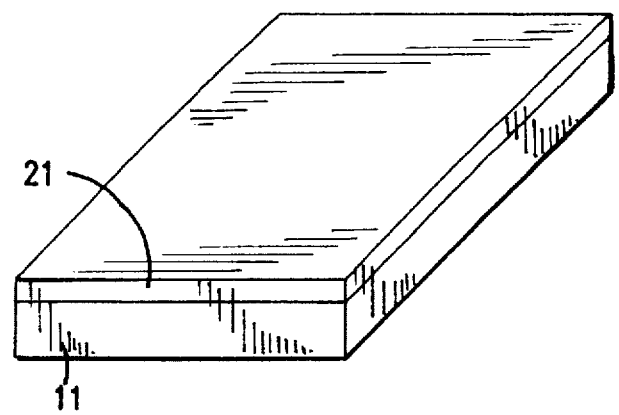

With reference to FIG. 21A, a grating 20 is selectively formed on a predetermined region within the active region of the n-InP substrate 11 by an interference exposure or an electron beam exposure. An SiO$_2$ film 21 as a dielectric film having a thickness of 1000 angstroms is deposited on an entire surface of the n-InP substrate 11 by a thermal chemical vapor deposition method.

Figure 21B:
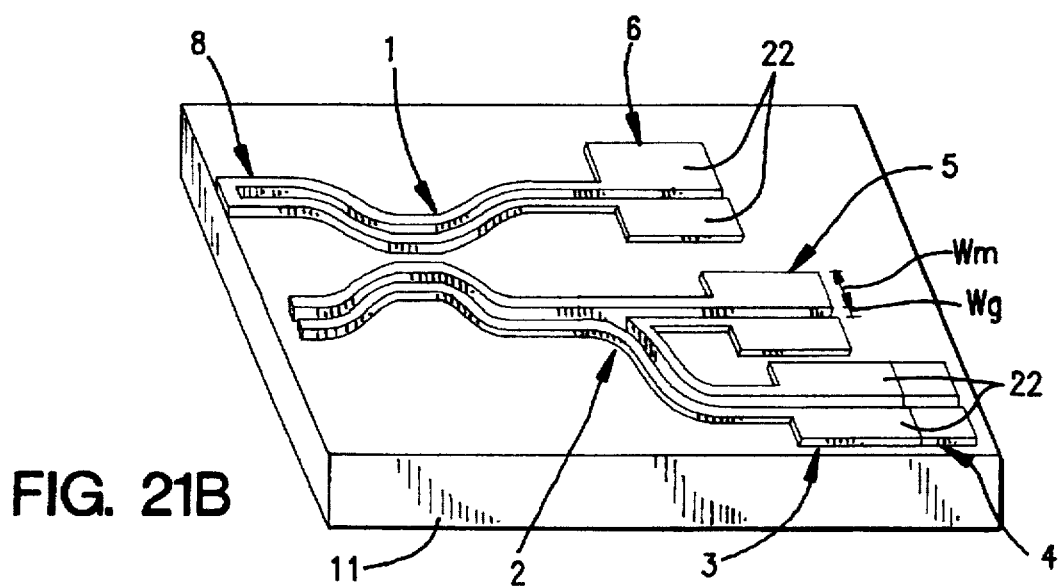

With reference to FIG. 21B, by use of the normal photolithography, the SiO$_2$ film 21 is selectively removed to form a pair of stripe SiO$_2$ masks 22 except for the window region 8. For the wavelength division multiplexing coupler 1 and the Y-branch 2 in the passive region 101, the width Wm of the mask is 6 μm. For the 1.30 μm transmitter laser diode 3, the 1.30 μm monitor photo-diode 4 and the 1.30 μm receiver photo-diode 5 in the active region 102, the width Wm of the mask is 12 μm. For the 1.55 μm receiver photo-diode 6 in the active region 102, the with Wm of the mask is 30 μm. The gap of the masks 22 remains constant at 1.5 μm over the passive and active regions 101 and 102. For the wavelength division multiplexing coupler diode 3, the length of the masks 11 is 1000 μm. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm. For the 1.55 μm receiver photo-diode 6, the length of the masks 22 is 50 μm.

With reference to FIG. 21C, the above masks 22 completely covers an entire part of the window region 8. For the window region 8, the length of the masks 22 is 20 μm.

With reference to FIG. 21D, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the wavelength division multiplexing coupler 1, the multiple quantum well waveguide layer 15 has a wavelength composition of 1.25 μm. Of the Y-branch 2, the multiple quantum well waveguide layer 15 has a wavelength composition of 1.25 μm. Of the 1.30 μm transmitter laser diode 3, the 1.30 μm monitor photo-diode 4, the 1.30 μm receiver photo-diode 5, the multiple quantum well waveguide layer 15 has a wavelength composition of 1.30 μm. Of the 1.55 μm receiver photo-diode 6, the multiple quantum well waveguide layer 15 has a wavelength composition of 1.60 μm.

With reference to FIG. 21E, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 and the 1.55 μm receiver photo-diode 6 for evaporation of contract metal and subsequent polishing of the reverse side to evaporate the contact metal whereby the device is completed.

The above optical integrated circuit device has been adopted for coupling to the optical fiber as well as for the multiple media communications and the bi-directional communications and further suitable for minimization of the scale thereof, the reasons of which are as follows.

As described above, the window 8 induces the reflectivity at the facet into almost zero. Further, the 1.30 μm receiver photo-diode 5, the 1.55 μm receiver photo-diode 6 and the wavelength division multiplexing coupler 1 are integrated. Even if character information of 1.30 μm wavelength band signals and image information of 1.55 μm wavelength band signals are transmitted on a single channel or the multiplexed 1.30 μm and 1.55 μm wavelength band signals are transmitted, the wavelength division multiplexing coupler 1 divides the multiplexed 1.30 μm and 1.55 μm wavelength band signals so that the 1.30 μm receiver photo-diode 5 and the 1.55 μm receiver photo-diode 6 receive the divided 1.30 μm and 1.55 μm wavelength band signals respectively without interference between them. Since the above wavelength division multiplexing coupler 1 is a directional coupler, the length thereof is about one third of the Mach-Zehnder type wavelength division multiplexing coupler. This allows a scaling down of the optical integrated circuit device.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent from the polarization. The optical confinement force is uniform between in the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors form that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

SIXTH EMBODIMENT

A sixth embodiment according to the present intention will be described, wherein an optical integrated circuit device with an improved waveguide layer is provided.

FIG. 22 is a perspective view illustrative of an optical integrated circuit device with an improved waveguide layer in the sixth embodiment according to the present invention. The optical integrated circuit device comprises a passive region 101 and an active region 102. In the passive region 101, a Y-branch 2 is provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 are integrated. The 1.30 μm transmitter laser diode 3 and the 1.30 μm receiver photo-diode 5 are coupled in parallel to the Y-branch 2. The 1.30 μm monitor photo-diode 4 is positioned adjacent to the rear side of the 1.30 μm transmitter laser diode 3 for monitoring the 1.30 μm transmitter laser diode 3. A spot size converter 7 is further provided at a facet coupled to an optical fiber not illustrated. The spot size converter 7 facilitates coupling between the Y-branch 2 and the optical fiber.

FIG. 23A is a fragmentary cross sectional elevation view illustrative of an internal layered structure of the Y-branch in the optical integrated circuit device with an improved waveguide layer, along an A—A' line in FIG. 22 in the sixth embodiment according to the present invention.

The Y-branch has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 23B is a fragmentary cross sectional elevation view illustrative of an internal layered structure of the 1.30 μm transmitter laser diode 3 in the optical integrated circuit device with an improved waveguide layer, along an B—B' line in FIG. 22 in the sixth embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 23C is a fragmentary cross sectional elevation view illustrative of an internal layered structure of the 1.30 μm receiver photo-diode 5 in the optical integrated circuit device with an improved waveguide layer, along an C—C' line in FIG. 22 in the sixth embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 23D is a fragmentary cross sectional elevation view illustrative of an internal layered structure of the 1.30 μm monitor photo-diode 4 in the optical integrated circuit device with an improved waveguide layer, along an D—D' line in FIG. 22 in the sixth embodiment according to the present invention.

The 1.30 μm monitor photo-diode 4 has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 23E is a fragmentary cross sectional elevation view illustrative of an internal layered structure of the spot size converter 7 in the optical integrated circuit device with an improved waveguide layer, along an E—E' line in FIG. 22 in the sixth embodiment according to the present invention.

The spot size converter 7 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 24A through 24E are perspective views illustrative of sequential fabrication processes of the optical integrated circuit device with the improved waveguide layer in the sixth embodiment according to the present invention.

With reference to FIG. 24A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

With reference to FIG. 24B, by use of the normal photo-lithography, the $SiO_2$ film 21 is selectively removed to form a pair of strip $SiO_2$ masks 22. For the Y-branch 2 in the passive region 101, the width Wm of the mask is 6 μm. For the 1.30 μm transmitter laser diode 3, the 1.30 μm monitor photo-diode 4 and the 1.30 μm receiver photo-diode 5 in the active region 102, the width Wm of the mask is 12 μm. The gap of the masks 22 remains constant at 1.5 μm over the passive and active regions 101 and 102. For the Y-branch 2, the length of the masks 22 is 1000 μm. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm.

With reference to FIG. 24C, the above masks 22 has a tapered structure in a spot size converter region 37. The width of the masks 22 is reduced from 6 μm to 2 μm toward the facet or the edge of the substrate and the gap between them is also reduced from 1.5 μm to 0.5 μm toward the facet or the edge of the substrate. For the spot size converter region 37, the length of the masks 22 is 500 μm.

Figure 24D:
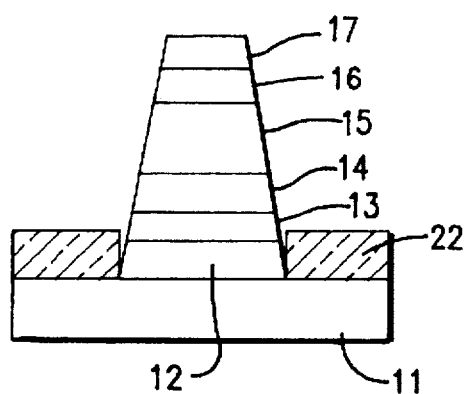

With reference to FIG. 24D, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the Y-ranch 2, the multiple quantum well waveguide layer 15 has a wavelength composition of 1.30 μm. Of the spot size converter 7, the well layers have thicknesses reduced toward the facet from 33 angstroms to 20 angstroms and also the barrier layers have thicknesses reduced toward the facet from 15 angstroms to 9 angstroms.

Figure 24E:
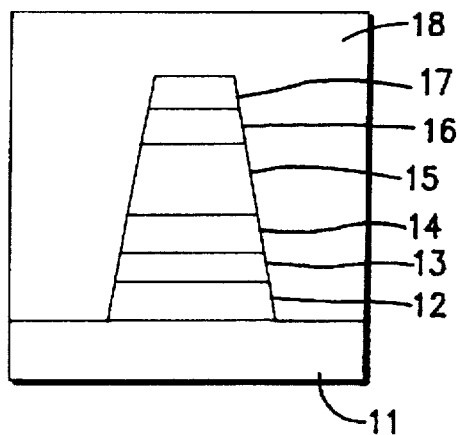

With reference to FIG. 24E, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4 and the 1.30 μm receiver photo-diode 5 for evaporation of contact metal and subsequent polishing of the reverse side to evaporate the contact metal whereby the device is completed.

As described above, the spot size converter 7 improves the coupling efficiency between the optical integrated circuit and the optical fiber.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent form the polarization. The optical confinement force is uniform between in the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

SEVENTH EMBODIMENT

A seventh embodiment according to the present invention will be described, wherein an optical integrated circuit device with an improved waveguide layer is provided.

FIG. 25 is a perspective view illustrative of an optical integrated circuit device with an improved waveguide layer in the seventh embodiment according to the present invention. The optical integrated circuit device comprises a passive region 101 and an active region 102. In the passive region 101, a Y-branch 2 is provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 are integrated. This 1.30 μm transmitter laser diode 3 and the 1.30 μm receiver photo-diode 5 are coupled in parallel to the Y-branch 2. The 1.30 μm monitor photo-diode 4 is positioned adjacent to a rear side of the 1.30 μm transmitter laser diode 3 for monitoring the 1.30 μm transmitter laser diode 3. A window 8 is further provided at a facet coupled to an optical fiber not illustrated. The window 8 reduces a reflectivity at the facet into almost zero.

FIG. 26A is a fragmentary cross sectional elevation view illustrative of an internal layered structure of the Y-branch in the optical integrated circuit device with an improved waveguide layer, along an A—A' line in FIG. 25 in the seventh embodiment according to the present invention.

The Y-branch has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 26B is a fragmentary cross sectional elevation view illustrative of an internal layered structure of the 1.30 μm transmitter laser diode 3 in the optical integrated circuit device with an improved waveguide layer, along an B—B' line in FIG. 25 in the seventh embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 26C is a fragmentary cross sectional elevation view illustrative of an internal layered structure of the 1.30 μm receiver photo-diode 5 in the optical integrated circuit device with an improved waveguide layer, along an C—C' line in FIG. 25 in the seventh embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 26D is a fragmentary cross sectional elevation view illustrative of an internal layered structure of the 1.30 μm monitor photo-diode 4 in the optical integrated circuit device with an improved waveguide layer, along an D—D' line in FIG. 25 in the seventh embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 20E is a fragmentary cross sectional elevation view illustrative of an internal layered structure of the window 8 in the optical integrated circuit device with an improved waveguide layer, along an E—E' line in FIG. 25 in the seventh embodiment according to the present invention.

The window 8 is formed on an n-InP substrate 11. Namely, the above ridged structure does not extend over this window region 8.

Fabrication processes of the above optical integrated circuit device will be described as follows.

FIGS. 27A through 27E are perspective views illustrative of sequential fabrication processes of the optical integrated circuit device with the improved waveguide layer in the seventh embodiment according to the present invention.

Figure 27A:
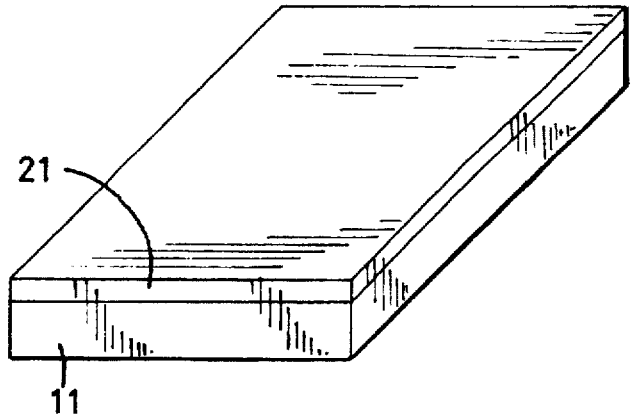

With reference to FIG. 27A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

Figure 27C:
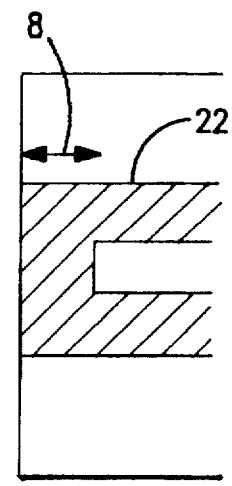
Figure 27B:
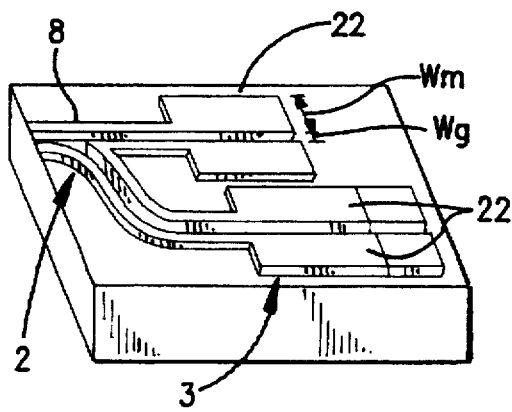

With reference to FIG. 27B, by use of the normal photo-lithography, the $SiO_2$ film 21 is selectively removed to form a pair of stripe $SiO_2$ masks 22 except for the window region 8. For the Y-branch 2 in the passive region 101, the width Wm of the mask is 6 μm. For the 1.30 μm transmitter laser diode 3, the 1.30 μm monitor photo-diode 4 and the 1.30 μm receiver photo-diode 5 in the active region 102, the width Wm of the mask is 12 μm. The gap of the masks 22 remains constant at 1.5 μm over the passive and active regions 101 and 102. For the Y-branch 2, the length of the masks 22 is 1000 μm. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm.

With reference to FIG. 27C, the above masks 22 completely covers an entire part of the window region 8. For the window region 8, the length of the masks 22 is 20 μm.

Figure 27D:
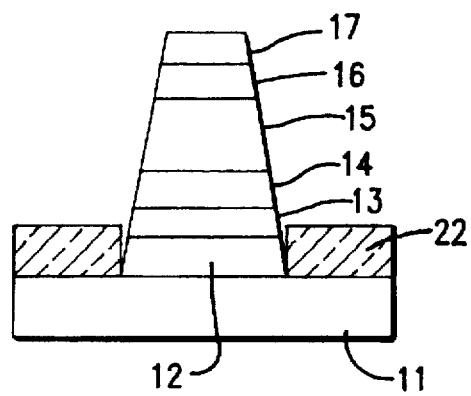

With reference to FIG. 27D, by use of the masks 22, a metal organic chemical vapor deposition is carried out to form, except for the window region 8, the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 is transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.40 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the Y-branch 2, the multiple quantum well waveguide layer 15 has a wavelength composition of 1.25 μm. Of the 1.30 μm transmitter laser diode 3, the 1.30 μm monitor photo-diode 4, the 1.30 μm receiver photo-diode 5, the multiple quantum well waveguide layer 15 has a wavelength composition of 1.30 μm.

Figure 27E:
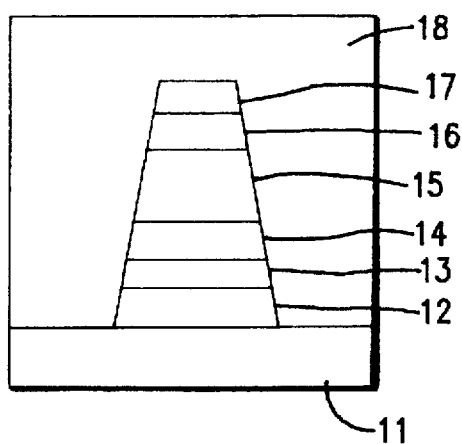

With reference to FIG. 27E, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 and the 1.55 μm receiver photo-diode 6 for evaporation of contact metal and subsequent polishing of the reverse side to evaporate the contact metal whereby the device is completed.

The above optical integrated circuit device has been adopted for coupling to the optical fiber as well as for the multiple media communications and the bi-directional communications and further suitable for minimization of the scale thereof, the reasons of which are as follows.

As described above, the window 8 reduces the reflectivity at the facet into almost zero.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent form the polarization. The optical confinement force is uniform between n the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

EIGHTH EMBODIMENT

An eighth embodiment according to the present invention will be described, wherein an optical integrated circuit device with an improved waveguide layer is provided.

FIG. 28 is a perspective view illustrative of an optical integrated circuit device with an improved waveguide layer in the eight embodiment according to the present invention. The optical integrated circuit device comprises a passive region 101 and an active region 102. In the passive region 101, a wavelength division multiplexing directional coupler 1 is provided for guiding optical signals. In the active region 102, a 1.55 μm transmitter laser diode 3, a 1.55 μm monitor photo-diode 4 for monitoring the 1.55 μtransmitter laser diode 3 and a 1.30 μm receiver photo-diode 5 are integrated. The 1.55 μm transmitter laser diode 3 and the 1.30 μm receiver photo-diode 5 are coupled in parallel to the wavelength division multiplexing directional coupler 1. The 1.55 μm monitor photo-diode 4 is positioned adjacent to a rear side of the 1.55 μm transmitter laser diode 3 for monitoring the 1.55 μm transmitter laser diode 3. This optical integrated circuit device is adopted for transmitting 1.55 μm wavelength band signals and receiving 1.30 μm wavelength band signals.

FIG. 29A is a fragmentary cross sectional elevation view illustrative of an internal layered structure of the wavelength division multiplexing directional coupler in the optical integrated circuit device with an improved waveguide layer, along an A—A' line in FIG. 28 in the eighth embodiment according to the present invention.

The wavelength division multiplexing directional coupler has separate two ridged structures of laminations of semiconductor layers. The ridged structures are formed on an n-InP substrate 11. The ridged structures are buried in an InP burying layer 18 formed over the n-InP substrate 11. Each of the ridged structures comprises the following compound semiconductor layers. An n-InGaAsP layer 12 is provided on the n-InP substrate 1. An n-InP spacer layer 13 is provided on the n-InGaAsP layer 12. A bottom separate confinement hetero-structure layer 14 is provided on the n-InP spacer layer 13. A multiple quantum well layer 15 is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 29B is a fragmentary cross sectional elevation view illustrative of an internal layered structure of the 1.55 μm transmitter laser diode 3 in the optical integrated circuit device with an improved waveguide layer, along an B—B' line in FIG. 28 in the eighth embodiment according to the present invention.

The 1.55 μm transmitted laser diode 3 has the ridged structure of lamination of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 29C is a fragmentary cross sectional elevation view illustrative of an internal layered structure of the 1.30 μm receiver photo-diode 5 in the optical integrated circuit device with an improved waveguide layer, along an C—C' line in FIG. 28 in the eight embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 29D is a fragmentary cross sectional elevation view illustrative of an internal layered structure of the 1.55 μm monitor photo-diode 4 in the optical integrated circuit device with an improved waveguide layer, along an D—D' line in FIG. 28 in the eighth embodiment according to the present invention.

The 1.55 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 30A through 30D are perspective views illustrative of sequential fabrication processes of the optical integrated circuit device with the improved waveguide layer in the eighth embodiment according to the present invention.

With reference to FIG. 30A, a grating 20 is selectively formed on a predetermined region within the active region of the n-InP substrate 11 by an interference exposure or an electron beam exposure. An SiO₂ film 21 as a dielectric film having a thickness of 1000 angstrom sis deposited on an entire surface of the n-InP substrate 11 by a thermal chemical vapor deposition method.

With reference to FIG. 30B, by use of the normal photo-lithography, with SiO₂ film 21 is electively removed to form a pair of stripe SiO₂ masks 22. For the wavelength division multiplexing coupler 1 in the passive region 101, the width Wm of the mask is 6 μm. For the 1.55 μm transmitter laser diode 3, the 1.55 μm monitor photo-diode 4 and the 1.30 μm receiver photo-diode 5 in the active region 102, the width Wm of the mask is 12 μm. The gap of the masks 22 remains constant at 1.5 μm over the passive and active regions 101 and 102. For the wavelength division multiplexing coupler 1, the length of the masks 22 is 1000 μm. For the 1.55 μm transmitter laser diode 3, the length of the masks 22 is 300 μm. For the 1.55 μm monitor photo-diode 4, the length of the masks 22 is 50 μm. For the 1.30 μm receiver photo-diode 5, the length of the masks 22 is 50 μm.

With reference to FIG. 30C, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength and light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm as illustrated in FIG. 9. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the wavelength division multiplexing coupler 1, the multiple quantum well waveguide layer 15 has a wavelength composition of 1.25 μm. Of the 1.55 μm transmitter laser diode 3, the 1.55 μm monitor photo-diode 4, the 1.30 μm receiver photo-diode 5, the multiple quantum well waveguide layer 15 has a wavelength composition of 1.30 μm.

Figure 30D:
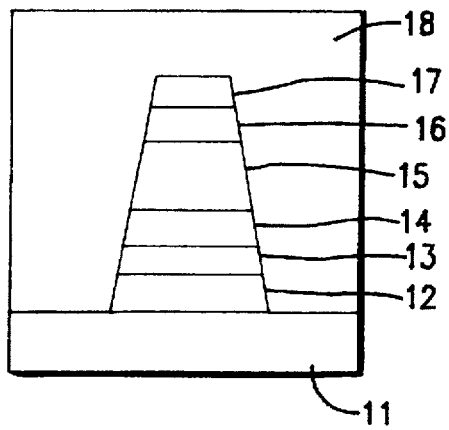

With reference to FIG. 30D, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.55 μm transmitter laser diode 3, the 1.55 μm monitor photo-diode 4 and the 1.30 μm receiver photo-diode 5 for evaporation of contact metal and subsequent polishing of the reverse side to evaporate the contact metal whereby the device is completed.

The above optical integrated circuit device has been adopted for the multiple media communications and the bi-directional communications and further suitable for minimization of the scale thereof, the reasons of which are as follows.

As described above, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

The above wavelength division multiplexing coupler waveguide layer has a ridged structure buried in the burying layer 18. This allows to set the same optical confinement forces between in the TM mode and in the TE mode, for which reason the wavelength division multiplexing coupler is likely to be independent from the polarization. The optical confinement force is uniform between in the vertical and lateral directions, for which reason the spot size shape in the passive waveguide is relatively isotropic. This makes it hard to cause the coupling loss.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

NINTH EMBODIMENT

A ninth embodiment according to the present invention will be described, wherein an optical integrated circuit device with an improved waveguide layer is provided.

FIG. 31 is a perspective view illustrative of an optical integrated circuit device with an improved waveguide layer in the ninth embodiment according to the present invention. The optical integrated circuit device comprises a passive region 101 and an active region 102. In the passive region 101, a Y-branch is provided for guiding optical signals. In the active region 102, a 1.30 µm transmitter laser diode 3, a 1.30 µm monitor photo-diode 4 for monitoring the 1.30 µm transmitter laser diode 3 and a 1.30 µm receiver photo-diode 5 are integrated. The 1.30 µm transmitter laser diode 3 and the 1.30 µm receiver photo-diode 5 are coupled in parallel to the Y-branch 2. The 1.30 µm monitor photo-diode 4 is positioned adjacent to a rear side of the 1.30 µm transmitter laser diode 3 for monitoring the 1.30 µm transmitter laser diode 3. A connection waveguide 9 is provided, which is coupled to a rear side of the 1.30 µm receiver photo-diode 5 so as to allow that an external photo-diode adjusted for receiving 1.55 µm wavelength band optical signals is coupled in series to the 1.30 µm receiver photo-diode 5. The 1.30 µm wavelength composition of the waveguide layer is transparent to the 1.55 µm wavelength band optical signals, for which reason the 1.55 µm wavelength band optical signals passes through the 1.30 µm receiver photo-diode 5 and the connection waveguide 9 and then transmits to the external photo-diode adjusted for receiving 1.55 µm wavelength band optical signals. This optical integrated circuit device is adopted for transmitting 1.30 µm wavelength band signals and receiving 1.30 µm and 1.55 µm multiplexing signals for bi-directional communications of the 1.30 µm and 1.55 µm wavelength band multiplexing signals.

FIG. 32A is a fragmentary cross sectional elevation view illustrative of an internal layered structure of the Y-branch in the optical integrated circuit device with an improved waveguide layer, along an A—A' line in FIG. 31 in the in the embodiment according to the present invention.

The Y-branch has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 transparent and propagation 1.30 µm wavelength band light is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 32B is a fragmentary cross sectional view illustrative of an internal layered structure of the 1.30 µm transmitter laser diode 3 in the optical integrated circuit device with an improved waveguide layer along an B—B' line in FIG. 31 in the ninth embodiment according to the present invention.

The 1.30 µm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 µm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 32C is a fragmentary cross sectional elevation view illustrative of an internal layered structure of the 1.30 µm receiver photo-diode 5 in the optical integrated circuit device with an improved waveguide layer, along an C—C' line in FIG. 31 in the ninth embodiment according to the present invention.

The 1.30 µm receiver photo-diode 5 has the ridged structure of laminations of semiconductor layers. The ridged structure is formed of an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 µm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 32D is a fragmentary cross sectional elevation view illustrative of an internal layered structure of the 1.30 μm monitor photo-diode 4 in the optical integrated circuit device with an improved waveguide layer, along an D—D' line in FIG. 31 in the ninth embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 33A through 33D are perspective views illustrative of sequential fabrication processes of the optical integrated circuit device with the improved waveguide layer in the ninth embodiment according to the present invention.

Figure 33A:
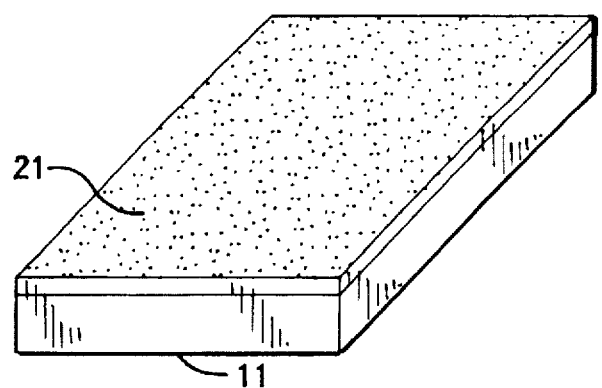

With reference to FIG. 33A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

Figure 33B:
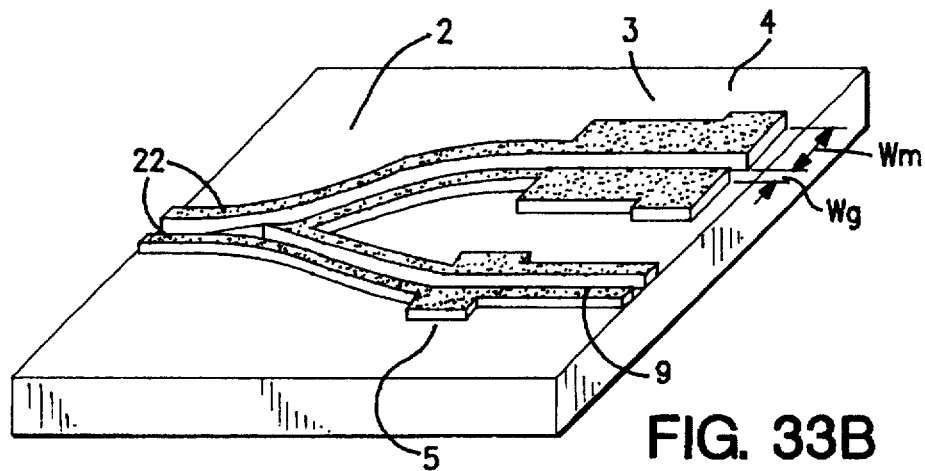

With reference to FIG. 33B, by use of the normal photo-lithography, the $SiO_2$ film 21 is selectively removed to form a pair of stripe $SiO_2$ masks 22. For the Y-branch 2 in the passive region 101, the width Wm of the mask is 6 μm. For the 1.30 μm transmitter laser diode 3, the width Wm of the mask is 13 μm. For the 1.30 μm monitor photo-diode 4 and the 1.30 μm receiver photo-diode 5 in the active region 102, the width Wm of the mask is 16 μm. For the connection waveguide 9, the width Wm of the mask is 6 μm. The gap of the masks 22 remains constant at 1.5 μm over the passive and active regions 101 and 102. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm.

Figure 33C:
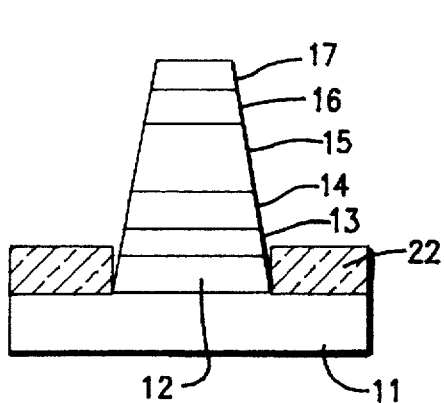

With reference to FIG. 33C, by use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm. In the regions of the wide mask width Wm of 13 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the Y-branch 2, the multiple quantum well waveguide layer 15 has a wavelength composition of 1.25 μm. Of the 1.30 μm transmitter laser diode 3, the 1.30 μm monitor photo-diode 3, the 1.30 μm receiver photo-diode 5, the multiple quantum well waveguide layer 15 has a wavelength composition of 1.35 μm. Of the connection waveguide 9, the multiple quantum well waveguide layer 15 has a wavelength composition of 1.15 μm.

Figure 33D:
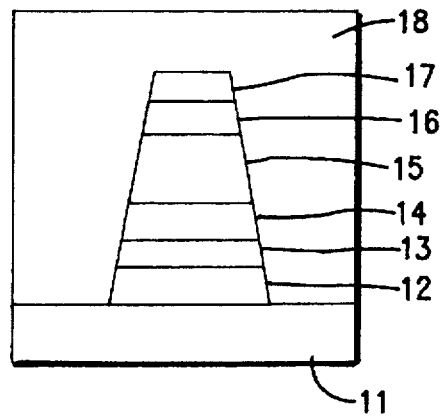

With reference to FIG. 33D, the masks 22 are removed by a buffered fluorine acid solution before the InP burying layer 18 is grown on the entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 for evaporation of contact metal and subsequent polishing of the reverse side to evaporate the contact metal whereby the device is completed.

The above optical integrated circuit device has been adopted for transmitting 1.30 μm wavelength band signals and receiving 1.30 μm and 1.55 μm multiplexing signals for multiple media communications of the 1.30 μm and 1.55 μm wavelength band multiplexing signals. The 1.30 μm wavelength composition of the waveguide layer is transparent to the 1.55 μm wavelength band optical signals, for which reason the 1.55 μm wavelength band optical signals passes through the 1.30 μm receiver photo-diode 5 and the connection waveguide 9 and then transmits to the external photo-diode adjusted for receiving 1.55 μm wavelength band optical signals.

As described above, the 1.30 μm transmitter laser diode 3 and the 1.30 μm receiver photo-diode 5 are coupled in parallel to the Y-branch 2 for half duplex bi-directional communications. Since no wavelength division multiplexing coupler is provided, the scaling down of the device is facilitated. This results in a considerable reduction in manufacturing cost of the device.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

As modifications of the active elements, it is possible to change the wavelength bands of the laser diode and the photo diodes. For example, a combination of the 1.55 μm transmitter laser diode and the 1.30 μm receiver photo-diode is available. Further, other combination of the 1.30 μm transmitter laser diode and the 1.55 μm receiver photo-diode is also available. Moreover, the other combination of the 1.55 μm transmitter laser diode and the 1.55 μm receiver photo-diode is also available.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

TENTH EMBODIMENT

A tenth embodiment according to the present invention will be described, wherein an optical integrated circuit device with an improved waveguide layer is provided.

FIG. 34 is a perspective view illustrative of an optical integrated circuit device with an improved waveguide layer in the tenth embodiment according to the present invention. The optical integrated circuit device comprises a passive region 101 and an active region 102. In the passive region 101, a Y-branch is provided for guiding optical signals. In the active region 102, a 1.30 μm transmitter laser diode 3, a 1.30 μm monitor photo-diode 4 for monitoring the 1.30 μm transmitter laser diode 3 and a 1.30 μm receiver photo-diode 5 are integrated. The 1.30 μm transmitter laser diode 3 and the 1.30 μm receiver photo-diode 5 are coupled in parallel to the Y-branch 2. The 1.30 μm monitor photo-diode 4 is positioned adjacent to a rear side of the 1.30 μm transmitter laser diode 3 for monitoring the 1.30 μm transmitter laser diode 3. A 1.55 μm receiver photo-diode 6 is provided adjacent to a rear side of the 1.30 μm receiver photo-diode 5 so as to allow that the 1.55 μm receiver photo-diode 6 is coupled in series to the 1.30 μm receiver photo-diode 5. The 1.30 μm wavelength composition of the waveguide layer is transparent to the 1.55 μm wavelength band optical signals, for which reason the 1.55 μm wavelength band optical signals pass through the 1.30 μm receiver photo-diode 5 and then transmits to the external photo-diode adjusted for receiving 1.55 μm wavelength band optical signals. Thus, the 1.30 μm wavelength band optical signals are received by the 1.30 μm receiver photo-diode 5. The 1.55 μm wavelength band optical signals passes through the 1.30 μm receiver photo-diode 5 and are received by the 1.55 μm receiver photo-diode 6. This optical integrated circuit device is adapted for transmitting 1.30 μm wavelength band signals and receiving 1.30 μm and 1.55 μm multiplexing signals for bi-directional communications of the 1.30 μm and 1.55 μm wavelength band multiplexing signals.

FIG. 35A is a fragmentary cross sectional elevation view illustrative of an internal layered structure of the Y-branch in the optical integrated circuit device with an improved waveguide layer, along an A—A' line in FIG. 34 in the tenth embodiment according to the present invention.

The Y-branch has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. An n-InGaAsP layer 12 is provided on the n-InP substrate 11. An n-InP spacer layer 13 is provide on the n-InGaAsP layer 12. A bottom separate confinement hetero-structure layer 14 is provided on the n-InP spacer layer 13. A multiple quantum well layer 15 transparent and propagation to 1.30 μm wavelength band light is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 35B is a fragmentary cross sectional elevation view illustrative of an internal layered structure of the 1.30 μm transmitter laser diode 3 in the optical integrated circuit device with an improved waveguide layer, along an B—B' line in FIG. 34 in the tenth embodiment according to the present invention.

The 1.30 μm transmitter laser diode 3 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 is transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 35C is a fragmentary cross sectional elevation view illustrative of an internal layered structure of the 1.30 μm monitor photo-diode 4 in the optical integrated circuit device with an improved waveguide layer, along an C—C' line in FIG. 34 in the tenth embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 35D is a fragmentary cross sectional elevation view illustrative of an internal layered structure of the 1.30 μm receiver photo-diode 5 in the optical integrated circuit device with an improved waveguide layer, along an D—D' line in FIG. 34 in the tenth embodiment according to the present invention.

The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 16 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 35E is a fragmentary cross sectional elevation view illustrative of an internal layered structure of the 1.55 μm receiver photo-diode 6 in the optical integrated circuit device with an improved waveguide layer, along an E—E' line in FIG. 34 in the tenth embodiment according to the present invention.

The 1.55 μm receiver photo-diode 6 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.55 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be described as follows.

FIGS. 36A and 36B are perspective views illustrative of sequential fabrication processes of the optical integrated circuit device with he improved waveguide layer in the tenth embodiment according to the present invention.

With reference to FIG. 36A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

With reference to FIG. 36B, by use of the normal photo-lithography, the $SiO_2$ film 21 is selectively removed to form a pair of stripe $SiO_2$ masks 22. For the Y-branch 2 in the passive region 101, the width Wm of the mask is 6 μm. For the 1.30 μm transmitter laser diode 3, the width Wm of the mask is 13 μm. For the 1.30 μm monitor photo-diode 4 and the 1.30 μm receiver photo-diode 5 in the active region 102, the width Wm of the mask is 16 μm. For the 1.55 μm receiver photo-diode 6, the width Wm of the mask is 30 μm. The gap of the masks 22 remains constant at 1.5 μm over the passive and active regions 101 and 102. For the 1.30 μm transmitter laser diode 3, the length of the masks 22 is 300 μm. For the 1.30 μm monitor photo-diode 4, the length of the masks 22 is 50 μm. For the 1.30 μm receiver photo-diode 5, the length of the masks 22 is 50 μm. For the 1.55 μm receiver photo-diode 6, the length of the masks 22 is 50 μm.

By use of the mask 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 μm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm. In the regions of the wide mask width Wm of 12 μm, the n-InGaAsP layer 12 has a wavelength composition of 1.15 μm and a thickness of 1000 angstroms. The n-InP spacer layer 13 has a thickness of 400 angstroms. The bottom separate confinement hetero-structure layer 14 has a wavelength composition of 1.15 μm and a thickness of 1000 angstroms. The multiple quantum well layer 15 comprises seven periods of InGaAsP well layers having a wavelength composition of 1.4 μm and a thickness of 45 angstroms and InGaAsP barrier layers having a wavelength composition of 1.15 μm and a thickness of 100 angstroms. The top separate confinement hetero-structure layer 16 has a wavelength composition of 1.15 μm and a thickness of 1000 angstroms. The InP cladding layer 17 has a thickness of 2000 angstroms. Of the Y-branch 2, the multiple quantum well waveguide layer 15 has a wavelength composition of 1.15 μm. Of the 1.30 μm transmitter laser diode 3, the multiple quantum well waveguide layer 15 has a wavelength composition of 1.30 μm. Of the 1.30 μm monitor photo-diode 4, the 1.30 μm receiver photo-diode 5, the multiple quantum well waveguide layer 15 has a wavelength composition of 1.35 μm. Of the 1.55 μm receiver photo-diode 6, the multiple quantum well waveguide layer 15 has a wavelength composition of 1.60 μm.

The masks 22 are removed by a buffered fluorine acid solution before the InP burying layer 18 is grown on eh entire surface of the substrate to bury the ridged structure. The InP burying layer 18 has a thickness of 2 μm. By use of the normal selective diffusion process, Zn is diffused over the 1.30 μm transmitter laser diode 3, the 1.30 μm monitor photo-diode 4, the 1.30 μm receiver photo-diode 5 and the 1.55 μm receiver photo-diode 6 for evaporation of contact metal and subsequent polishing of the reverse side to evaporate the contact metal whereby the device is completed.

The above optical integrated circuit device has been adopted for transmitting 1.30 μm wavelength band signals and receiving 1.30 μm and 1.55 μm multiplexing signals for multiple media communications of the 1.30 μm and 1.55 μm wavelength band multiplexing signals. The 1.30 μm wavelength composition of the waveguide layer is transparent to the 1.55 μm wavelength band optical signals, for which reason the 1.55 μm wavelength band optical signals pass through the 1.30 μm receiver photo-diode 5 and then transmits to the 1.55 μm photo-diode. Thus, the 1.30 μm wavelength band optical signals are received by the 1.30 μm receiver photo-diode 5. The 1.55 μm wavelength band optical signals passes through the 1.30 μm receiver photo-diode 5 and are received by the 1.55 μm receiver photo-diode 6. This optical integrated circuit device is adopted for transmitting 1.30 μm wavelength band signals and receiving 1.30 μm and 1.55 μm multiplexing signals for bi-directional communications of the 1.30 μm and 1.55 μm wavelength band multiplexing signals.

As described above, the 1.30 μm transmitter laser diode 3 and the 1.30 μm receiver photo-diode 5 are coupled in parallel to the Y-branch 2 for half duplex bi-directional communications, since no wavelength division multiplexing coupler is provided, the scaling down of the device is facilitated. This results in a considerable reduction in manufacturing cost of the device.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free form a substantive coupling loss. Moreover, single crystal growth makes the fabrication processes simple. This further reduces the manufacturing cost of the device and improves the yield thereof.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors from that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

ELEVENTH EMBODIMENT

An eleventh embodiment according to the present invention will be described, wherein an optical integrated circuit device with an improved waveguide layer is provided.

FIG. 37 is a perspective view illustrative of an optical integrated circuit device with an improved waveguide layer in the eleventh embodiment according to the present invention. The optical integrated circuit device comprises a passive region 101 and an active region 102. In the passive region 101, a Y-branch is provided for guiding optical signals. In the active region 102, a 1.30 μm transmitter laser diode 3, a 1.30 μm monitor photo-diode 4 for monitoring the 1.30 μm transmitter laser diode 3, a 1.30 μm receiver photo-diode 5, a 1.55 μm receiver photo-diode 5, a 1.55 μm transmitter laser diode 7, a 1.55 μm monitor photo-diode 8 for monitoring the 1.55 μm transmitter laser diode 7 are integrated. The 1.30 μm transmitter laser diode 3 and the 1.30 μm receiver photo-diode 5 are coupled in parallel to the Y-branch 2. The 1.30 μm monitor photo-diode 4 is positioned adjacent to a rear side of the 1.30 μm transmitter laser diode 3 for monitoring the 1.30 μm transmitter laser diode 3. The 1.55 μm receiver photo-diode 6 is provided adjacent to a rear side of the 1.30 μm receiver photo-diode 5 so as to allow that the 1.55 μm receiver photo-diode 6 is coupled in series to the 1.30 μm receiver photo-diode 5. The 1.30 μm wavelength composition of the waveguide layer is transparent to the 1.55 μm wavelength band optical signals, for which reason the 1.55 μm wavelength band optical signals passes through the 1.30 μm receiver photo-diode 5 and then transmits to the 1.55 μm photo-diode. Thus, the 1.30 μm wavelength band optical signals are received by the 1.30 μm receiver photo-diode 5. The 1.55 μm wavelength band optical signals passes through the 1.30 μm receiver photo-diode 5 and are received by the 1.55 μm receiver photo-diode 6. The 1.55 μm laser diode 7 is provided adjacent to a rear side of the 1.30 μm monitor photo-diode 4. Further, the 1.55 μm monitor photo-diode 8 for monitoring the 1.55 μm laser diode 7 is provided adjacent to a rear side of the 1.55 μm laser diode 7. The 1.30 μm laser diode 3, the 1.30 μm monitor photo-diode 4, the 1.55 μm laser diode 7 and the 1.55 μm monitor photo-diode 8 are coupled in series to the Y-branch 4 for transmitting 1.30 μm and 1.55 μm multiplex transmission signals. This optical integrated circuit device is adopted for transmitting 1.30 μm wavelength band signals and receiving 1.30 μm and 1.55 μm multiplexing signals for full bi-directional communications of the 1.30 μm and 1.55 μm wavelength band multiplexing signals.

FIG. 38A is a fragmentary cross sectional elevation view illustrative of an internal layered structure of the Y-branch in the optical integrated circuit device with an improved waveguide layer, along an A—A' line in FIG. 37 ion the eleventh embodiment according to the present invention.

The Y-branch has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. An n-InGaAsP layer 12 is provided on the n-InP substrate 11. An n-InP spacer layer 13 is provided on the n-InGaAsP layer 12. A bottom separate confinement hetero-structure layer 14 is provided on the n-InP spacer layer 13. A multiple quantum well layer 15 transparent and propagation to 1.30 μm wavelength band light is provided on the bottom separate confinement hetero-structure layer 14. A top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as a waveguide. An InP cladding layer 17 is provided on the top separate confinement hetero-structure layer 16.

FIG. 38B is a fragmentary cross sectional elevation view illustrative of an internal layered structure of the 1.30 μm transmitter laser diode 3 in the optical integrated circuit device with an improved waveguide layer, along an B—B' line in FIG. 37 in the eleventh embodiment according to the present invention.

The 1.30 μm transmitter laser diode 3 has a ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 38C is a fragmentary cross sectional elevation view illustrative of an internal layered structure of the 1.30 μm monitor photo-diode 4 in the optical integrated circuit device with an improved waveguide layer, along an C—C' line in FIG. 37 in the eleventh embodiment according to the present invention.

The 1.30 μm monitor photo-diode 4 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 38D is a fragmentary cross sectional elevation view illustrative of an internal layered structure of the 1.55 μm transmitter laser diode 7 in the optical integrated circuit device with an improved waveguide layer, along an D—D' line in FIG. 37 in the eleventh embodiment according to the present invention.

The 1.55 μm transmitter laser diode 7 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.55 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 38E is a fragmentary cross sectional elevation view illustrative of an internal layered structure of the 1.55 μm monitor photo-diode 8 in the optical integrated circuit device with an improved waveguide layer, along an E—E' line in FIG. 37 in the eleventh embodiment according to the present invention.

The 1.55 μm monitor photo-diode 8 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.55 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 38F is a fragmentary cross sectional elevation view illustrative of an internal layered structure of the 1.30 μm receiver photo-diode 5 in the optical integrated circuit device with an improved waveguide layer, along an F—F' line in FIG. 37 in the eleventh embodiment according to the present invention. 6p The 1.30 μm receiver photo-diode 5 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on the n-InGaAsP layer 12. The bottom separate confinement hetero-structure layer 14 is provided on the n-InP spacer layer 13. The multiple quantum well layer 15 transparent and propagation to 1.30 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

FIG. 38G is a fragmentary cross sectional elevation view illustrative of an internal layered structure of the 1.55 μm receiver photo-diode 6 in the optical integrated circuit device with an improved waveguide layer, along an G—G' line in FIG. 37 in the eleventh embodiment according to the present invention.

The 1.55 μm receiver photo-diode 6 has the ridged structure of laminations of semiconductor layers. The ridged structure is formed on an n-InP substrate 11. The ridged structure is buried in an InP burying layer 18 formed over the n-InP substrate 11. The ridged structure comprises the following compound semiconductor layers. The n-InGaAsP layer 12 is provided on the n-InP substrate 11. The n-InP spacer layer 13 is provided on on n-InGaAsP layer 12. The bottom separate confinement hetero-structure layer 14 is provided on the n-InP spacer layer 13. The multiple quantum well layer 15 transparent and propagation to 1.55 μm wavelength band light is provided on the bottom separate confinement hetero-structure layer 14. The top separate confinement hetero-structure layer 16 is provided on the multiple quantum well layer 15 so that the top and bottom separate confinement hetero-structure layers 14 and 16 sandwich the multiple quantum well layer 15 to confine the light in the multiple quantum well layer 15 acting as the waveguide. The InP cladding layer 17 is provided on the top separate confinement hetero-structure layer 16.

Fabrication processes of the above optical integrated circuit device will be descried as follows.

FIGS. 39A and 39B are perspective views illustrative of sequential fabrication processes of the optical integrated circuit device with the improved waveguide layer in the eleventh embodiment according to the present invention.

With reference to FIG. 39A, a grating 20 is selectively formed on a predetermined region within the active region of the n-InP substrate 11 by an interference exposure or an electron beam exposure. An $SiO_2$ film 21 as a dielectric film having a thickness of 1000 angstroms is deposited on an entire surface of the n-InP substrate 11 by a thermal chemical vapor deposition method.

With reference to FIG. 39B, by use of the normal photolithography, the $SiO_2$ film 21 is selectively removed to form a pair of strip $SiO_2$ masks 22. For the Y-branch 2 in the passive region 101, the width Wm of the mask is 6 µm. For the 1.30 µm transmitter laser diode 3, the width Wm of the mask is 13 µm. For the 1.30 µm monitor photo-diode 4 and the 1.30 µm receiver photo-diode 5 in the active region 102, the width Wm of the mask is 16 µm. For the 1.55 µm receiver photo-diode 6, the width Wm of the maks is 30 µm. For the 1.55 µm transmitter laser diode 7, the width Wm of the mask is 27 µm. For the 1.55 µm monitor photo-diode 8, the width Wm of the mask is 30 µm. The gap of the masks 22 remains constant at 1.5 µm over the passive and active regions 101 and 102. For the 1.30 µm transmitter laser diode 3, the length of the masks 22 is 300 µm. For the 1.30 µm monitor photo-diode 4, the length of the masks 22 is 50 µm. For the 1.30 µm receiver photo-diode 5, the length of the masks 22 is 50 µm. For the 1.55 µm receiver photo-diode 6, the length of the masks 22 is 50 µm. For the 1.55 µm transmitter laser diode 7, the length of the masks 22 is 300 µm. For the 1.55 µm monitor photo-diode 8, the length of the masks 22 is 50 µm.

By use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 µm wavelength and light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The wavelength compositions and the thicknesses of the above individual layers depend upon the mask width Wm. In the regions of the wide mask width Wm of 13 µm, the n-InGaAsP layer 12 has a wavelength composition of 1.15 µm and a thickness of 1000 angstroms. The n-InP spacer layer 13 has a thickness of 400 angstroms. The bottom separate confinement hetero-structure layer 14 has a wavelength composition of 1.15 µm and a thickness of 1000 angstroms. The multiple quantum well layer 15 comprises seven periods of InGaAsP well layers having a wavelength composition of 1.4 µm and a thickness of 45 angstroms and InGaAsP barrier layers having a wavelength composition of 1.15 µm and a thickness of 100 angstroms. The top separate confinement hetero-structure layer 16 has a wavelength composition of 1.15 µm and a thickness of 1000 angstroms. The InP cladding layer 17 has a thickness of 2000 angstroms. Of the Y-branch 2, the multiple quantum well waveguide layer 15 has a wavelength composition of 1.15 µm. Of the 1.30 µm transmitter laser diode 3, the multiple quantum well waveguide layer 15 has a wavelength composition of 1.30 µm. Of the 1.30 µm monitor photo-diode 4, the 1.30 µm receiver photo-diode 4, the multiple quantum well waveguide layer 15 has a wavelength composition of 1.35 µm. Of the 1.55 µm receiver photo-diode 6, the multiple quantum well waveguide layer 15 has a wavelength composition of 1.60 µm. Of the 1.55 µm laser photo-diode 7, the multiple quantum well waveguide layer 15 has a wavelength composition of 1.60 µm. Of the 1.55 µm monitor photo-diode 8, the multiple quantum well waveguide layer 15 has a wavelength composition of 1.60 µm.

The masks 22 are removed by a buffered fluorine acid solution before the InP burying layer 18 is grown on the entire surface of the substrate to bury the ridged structure. The InP burying layer 18 has a thickness of 2 µm. By use of the normal selective diffusion process, Zn is diffused over the 1.30 µm transmitter laser diode 3, the 1.30 µm monitor photo-diode 4, the 1.30 µm receiver photo-diode 4, the 1.55 µm receiver photo-diode 6, the 1.55 µm transmitter laser diode 7 and the 1.55 µm monitor photo-diode 8 for evaporation of contact metal and subsequent polishing of the reverse side to evaporate the contact metal whereby the device is completed.

The above optical integrated circuit device has been adopted for transmitting 1.30 µm and 1.55 µm multiplexing signals and receiving 1.30 µm and 1.55 µm multiplexing signals for multiple media communications of the 1.30 µm and 1.55 µm wavelength band multiplexing signals. The 1.30 µm wavelength composition of the waveguide layer is transparent to the 1.55 µm wavelength band optical signals, for which reason the 1.55 µm wavelength band optical signals passes through the 1.30 µm receiver photo-diode 5 and then transmits to the 1.55 µm photo-diode. Thus, the 1.30 µm wavelength band optical signal are received by the 1.30 µm receiver photo-diode 5. The 1.55 µm wavelength band optical signals passes through the 1.30 µm receiver photo-diode 5 and are received by the 1.55 µm receiver photo-diode 6. The 1.55 µm wavelength band optical signals are transmitted through the 1.30 µm laser diode 3. This optical integrated circuit device is adopted for transmitting 1.30 µm and 1.55 µm multiplexing signals and receiving 1.30 µm and 1.55 µm multiplexing signals for multiple media communications of the 1.30 µm and 1.55 µm wavelength band multiplexing signals.

As described above, the 1.30 µm transmitter laser diode 3 and the 1.30 µm receiver photo-diode 5 are coupled in parallel to the Y-branch 2 for full duplex bi-directional communications. Since no wavelength division multiplexing coupler is provided, the scaling down of the device is facilitated. This results in a considerable reduction in manufacturing cost of the device.

Further, the above ridged structure is grown by the single crystal growth using a single pair of the dielectric masks 22. This allows the individual semiconductor layers, particularly the multiple quantum well waveguide layer, are free of discontinuity in crystal structure and also free from any stepped discontinuity in definitions of the above layers. This allows the waveguide layer to be free from a substantive coupling loss. Moreover, single crystal growth makes the fabrication processes simple. This further reduces the manufacturing cost of the device and improves the yield thereof.

As modification of the dielectric masks, SiN masks are also available. The dielectric film may be formed by a plasma chemical vapor deposition method.

As modification of the multiple quantum well waveguide layer, InGaAs layers, InGaAlAs layers and InGaAlAsP layers are also available. It is also possible that the well layers are made of different compound semiconductors form that of the barrier layers.

In place of the selective diffusion processes, a doping process of DMZn (dimethyl zinc) is carried out during the selective growth processes.

In place of the non-selective deposition of the buried layer, a selective deposition thereof may also be carried out after broadening of the gap of the paired dielectric masks.

TWELFTH EMBODIMENT

A twelfth embodiment according to the present invention will be described, wherein an optical integrated circuit device with an improved waveguide layer is provided.

FIG. 40 is a perspective view illustrative of an optical integrated circuit device with an improved waveguide layer in the twelfth embodiment according to the present invention. The optical integrated circuit device comprises a passive region 101 and an active region 102. In the passive region 101, a Y-branch is provided for guiding optical signals. In the active region 102, a 1.55 µm transmitter laser diode 7, a 1.55 µm monitor photo-diode 8 for monitoring the 1.55 µm transmitter laser diode 7, a 1.30 µm receiver photo-diode 5 and a 1.55 µm receiver photo-diode 6 are integrated. The 1.55 µm transmitter laser diode 7 and the 1.55 µm receiver photo-diode 6 are coupled in parallel to the Y-branch 2. The 1.55 µm transmitter laser diode 7 is coupled in series via the Y-branch 2 to the 1.30 µm receiver photo-diode 5. The 1.55 µm receiver photo-diode 6 is also coupled in series via the Y-branch 2 to the 1.30 µm receiver photo-diode 5. The 1.55 µm monitor photo-diode 8 is positioned adjacent to a rear side of the 1.55 µm transmitter laser diode 7 for monitoring the 1.55 µm transmitter laser diode 7. The 1.30 µm wavelength composition of the waveguide layer is transparent to the 1.55 µm wavelength band optical signals, for which reason the 1.55 µm wavelength band optical signals passes through the 1.30 µm receiver photo-diode 5 and then transmits to the 1.55 µm receiver photo-diode 6. Thus, the 1.30 µm wavelength band optical signals are received by the 1.30 µm receiver photo-diode 5. The 1.55 µm wavelength band optical signals pass through the 1.30 µm receiver photo-diode 5 and are received by the 1.55 µm receiver photo-diode 6. This optical integrated circuit device is adopted for transmitting 1.30 µm wavelength band signals and receiving 1.30 µm and 1.55 µm multiplexing signals for bi-directional communications of the 1.30 µm and 1.55 µm wavelength band multiplexing signals.

Fabrication processes of the above optical integrated circuit device will be described as follows.

FIGS. 41A and 41B are perspective views illustrative of sequential fabrication processes of the optical integrated circuit device with the improved waveguide layer in the twelfth embodiment according to the present invention.

With reference to FIG. 41A, a grating 20 is selectively formed on a predetermined region within the active region of the n-InP substrate 11 by an interference exposure or an electron beam exposure. An SiO$_2$ film 21 as a dielectric film having a thickness of 1000 angstroms is deposited on an entire surface of the n-InP substrate 11 by a thermal chemical vapor deposition method.

With reference to FIG. 41B, by use of the normal photo-lithography, the SiO$_2$ film 21 is selectively removed to form a pair of stripe SiO$_2$ masks 22.

By use of the masks 22, a metal organic chemical vapor deposition is carried out to form the ridged structure comprising the following semiconductor layers. The n-InGaAsP layer 12 is grown on the n-InP substrate 11. The n-InP spacer layer 13 is grown on the n-InGaAsP layer 12. The bottom separate confinement hetero-structure layer 14 is grown on the n-InP spacer layer 13. The multiple quantum well layer 15 transparent and propagation to 1.30 µm wavelength band light is grown on the bottom separate confinement hetero-structure layer 14. The multiple quantum well layer comprises alternating laminations of InGaAsP well layers and InGaAsP barrier layers. The top separate confinement hetero-structure layer 16 is grown on the multiple quantum well layer 15.

The masks 22 are removed by a buffered fluorine acid solution before the InP burying layer 18 is grown on the entire surface of the substrate to bury the ridged structure. The InP burying layer 18 has a thickness of 2 µm. By use of the normal selective diffusion process, Zn is diffused over the 1.30 µm transmitter laser diode 3, the 1.30 µm monitor photo-diode 4, the 1.30 µm receiver photo-diode 5 and the 1.55 µm receiver photo-diode 6 for evaporation of contact metal and subsequent polishing of the reverse side to evaporate the contact metal whereby the device is completed.

The above optical integrated circuit device has been adopted for transmitting 1.55 µm wavelength band signals and receiving 1.30 µm and 1.55 µm multiplexing signals for multiple media communications of the 1.30 µm and 1.55 µm wavelength band multiplexing signals. The 1.30 µm wavelength composition of the waveguide layer is transparent to the 1.55 µm wavelength band optical signals, for which reason the 1.55 µm wavelength band optical signals pass through the 1.30 µm receiver photo-diode 5 and then transmits to the external photo-diode adjusted for receiving 1.55 µm wavelength band optical signals. Thus, the 1.30 µm wavelength band optical signals are received by the 1.30 µm receiver photo-diode 5. The 1.55 µm wavelength band optical signals passes through the 1.30 µm receiver photo-diode 5 and are received by the 1.55 µm receiver photo-diode 6. This optical integrated circuit device is adopted for transmitting 1.55 µm wavelength band signals and receiving 1.30 µm and 1.55 µm multiplexing signals for bi-directional communications of the 1.30 µm and 1.55 µm wavelength band multiplexing signals.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims any modifications of the present invention which fall within the spirit and scope of the present invention.

What is claimed is:

1. An optical semiconductor integrated circuit device comprising:

a semiconductor substrate having a passive region and an active region; and a ridged structure constituting at least a branch selectively extending over said passive region, at least a laser diode selectively extending over said active region and at least a photo diode selectively extending over said active region, said ridged structure including a semiconductor waveguide layer sandwiched between optical confinement layers, said semiconductor waveguide layer in said active region having a wavelength composition larger than that in said passive region, wherein said waveguide layer has a semiconductor crystal structure which is continuous not only over said active and passive regions but also at a boundary between said active and passive regions.

2. The optical semiconductor integrated circuit device as claimed in claim 1, wherein said ridged structure has been formed by a selective semiconductor crystal growth using a dielectric mask pattern being provided on said semiconductor substrate and extending over said active and passive regions, said dielectric mask pattern comprising at least a pair of stripe like dielectric films having a gap between them, each of said stripe like dielectric films having a larger width in said active region than that in said passive region.

3. The optical semiconductor integrated circuit device as claimed in claim 2, wherein said width of said stripe like dielectric films remains constant over said passive region.

4. The optical semiconductor integrated circuit device as claimed in claim 2, wherein said width of said stripe like dielectric films varies on at least a part of said passive region.

5. The optical semiconductor integrated circuit device as claimed in claim 2, wherein said width of said stripe like dielectric films remains constant over said active region.

6. The optical semiconductor integrated circuit device as claimed in claim 2, wherein said width of said stripe like dielectric films varies on at least a part of said active region to decrease toward said branch.

7. The optical semiconductor integrated circuit device as claimed in claim 6, wherein said decrease in said width of said stripe like dielectric films is a step like decrease toward said branch.

8. The optical semiconductor integrated circuit device as claimed in claim 2, wherein said gap of said stripe like dielectric films remain constant over said passive and active regions.

9. The optical semiconductor integrated circuit device as claimed in claim 2, wherein said gap of said stripe like dielectric films varies on at least a part of said passive and active regions.

10. The optical semiconductor integrated circuit device as claimed in claim 1, wherein said branch comprises a Y-branch.

11. The optical semiconductor integrated circuit device as claimed in claim 1, further comprising a wavelength division multiplexing coupler in said passive region and said wavelength division multiplexing coupler is connected through said branch to said laser diode and said photo diode.

12. The optical semiconductor integrated circuit device as claimed in claim 1, further comprising a monitor photo diode in said active region, said monitor photo diode is provided adjacent to a rear side of said laser diode having a front side connected to said branch.

13. The optical semiconductor integrated circuit device as claimed in claim 1, further comprising a spot size converter provided at an opposite end portion of said branch to a boundary between said active and passive regions.

14. The optical semiconductor integrated circuit device as claimed in claim 1, further comprising a window region provided at an opposite end portion of said branch to a boundary between said active and passive regions.

15. The optical semiconductor integrated circuit device as claimed in claim 1, wherein a plurality a photo-diodes for the same wavelength band are provided to be connected in parallel to said branch.

16. The optical semiconductor integrated circuit device as claimed in claim 1, wherein a plurality of photo-didoes for different wavelength bands are provided to be connected in parallel to said branch.

17. The optical semiconductor integrated circuit device as claimed in claim 1, wherein a plurality of photo-diodes adjusted for different wavelength bands are provided to be connected in series to said branch, provided said photo-diode positioned closer to said branch than others is adjusted for a larger wavelength band than those of said other photo-diodes.

18. The optical semiconductor integrated circuit device as claimed in claim 1, wherein a plurality of laser-diodes for the same wavelength band are provided to be connected in parallel to said branch.

19. The optical semiconductor integrated circuit device as claimed in claim 1, wherein a plurality of laser-diodes for different wavelength bands are provided to be connected in parallel to said branch.

20. The optical semiconductor integrated circuit device as claimed in claim 1, wherein a plurality of laser-diodes adjusted for different wavelength bands are provided to be connected in series to said branch, provided said laser-diode positioned closer to said branch than others is adjusted for a larger wavelength band than those of said other laser-diodes.

21. The optical semiconductor integrated circuit device as claimed in claim 1, further comprising a photo-diode provided at an opposite end portion of said branch to a boundary between said active and passive regions.

22. The optical semiconductor integrated circuit device as claimed in claim 1, wherein said ridged structure is a strip loaded structure.

23. The optical semiconductor integrated circuit device as claimed in claim 1, wherein said ridged structure is a buried structure buried with a burying semiconductor layer.

24. The optical semiconductor integrated circuit device as claimed in claim 1, wherein said ridged structure comprises:
   an n-doped InGaAsP layer;
   an n-doped InP spacer layer formed on said n-doped InGaAsP layer;
   a bottom separate confinement hetero-structure layer formed on said n-doped InP spacer layer;
   a multiple quantum well waveguide layer formed on said bottom separate confinement hetero-structure layer;
   a top separate confinement hetero-structure layer formed on said multiple quantum well waveguide layer; and
   an InP cladding layer formed on said top separate confinement hetero-structure layer.

25. An optical semiconductor integrated circuit device comprising:
   a semiconductor substrate having a passive region and an active region; and
   a ridged structure constituting at least a wavelength division multiplexing coupler selectively extending over said passive region, at least a laser diode selectively extending over said active region and at least a photo diode selectively extending over said active region, said ridged structure including a semiconductor waveguide layer sandwiched between optical confinement layers, said semiconductor waveguide layer in said active region having a wavelength composition larger than that in said passive region, wherein said waveguide layer has a semiconductor crystal structure which is continuous not only over said active and passive regions but also at a boundary between said active and passive regions.

26. The optical semiconductor integrated circuit device as claimed in claim 25, wherein said ridged structure has been formed by a selective semiconductor crystal growth using a dielectric mask pattern being provided on said semiconductor substrate and extending over said active and passive regions, said dielectric mask pattern comprising at least a pair of stripe like dielectric films having a gap between them, each of said stripe like dielectric films having a larger width in said active region than that in said passive region.

27. The optical semiconductor integrated circuit device as claimed in claim 26, wherein said width of said stripe like dielectric films remains constant over said passive region.

28. The optical semiconductor integrated circuit device as claimed in claim 26, wherein said width of said stripe like dielectric films varies on at least a part of said passive region.

29. The optical semiconductor integrated circuit device as claimed in claim 26, wherein said width of said stripe like dielectric films remains constant over said active region.

30. The optical semiconductor integrated circuit device as claimed in claim 26, wherein said width of said stripe like dielectric films varies on at least a part of said active region to decrease toward said wavelength division multiplexing coupler.

31. The optical semiconductor integrated circuit device as claimed in claim 30, wherein said decrease in said width of said stripe like dielectric films is a step like decrease toward said wavelength division multiplexing coupler.

32. The optical semiconductor integrated circuit device as claimed in claim 26, wherein said gap of said stripe like dielectric films remain constant over said passive and active regions.

33. The optical semiconductor integrated circuit device as claimed in claim 26, wherein said gap of said stripe like dielectric films varies on at least a part of said passive and active regions.

34. The optical semiconductor integrated circuit device as claimed in claim 25, further comprising a branch in said passive region and said wavelength division multiplexing coupler is connected through said branch to said laser diode and said photo diode.

35. The optical semiconductor integrated circuit device as claimed in claim 34, wherein said branch comprises a Y-branch.

36. The optical semiconductor integrated circuit device as claimed in claim 25, further comprising a monitor photo diode in said active region, said monitor photo diode is provided adjacent to a rear side of said laser diode having a front side connected to said wavelength division multiplexing coupler.

37. The optical semiconductor integrated circuit device as claimed in claim 25, wherein a plurality of photo-diodes for the same wavelength band are provided to be connected in parallel to said branch.

38. The optical semiconductor integrated circuit device as claimed in claim 25, wherein a plurality of photo-diodes for different wavelength bands are provided to be connected in parallel to said branch.

* * * * *